United States Patent
Lim

(10) Patent No.: US 11,650,695 B2
(45) Date of Patent: May 16, 2023

(54) DISPLAY DEVICE AND A SENSING SYSTEM INCLUDING THE SAME

(71) Applicant: SAMSUNG DISPLAY CO., LTD., Yongin-si (KR)

(72) Inventor: Sang Hyun Lim, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/682,350

(22) Filed: Feb. 28, 2022

(65) Prior Publication Data

US 2023/0049665 A1 Feb. 16, 2023

(30) Foreign Application Priority Data

Aug. 10, 2021 (KR) .................. 10-2021-0105323

(51) Int. Cl.
| | |
|---|---|
| *G06F 3/041* | (2006.01) |
| *G06F 3/044* | (2006.01) |
| *G06F 3/046* | (2006.01) |
| *H01L 27/32* | (2006.01) |
| *G06F 3/0354* | (2013.01) |

(52) U.S. Cl.
CPC .......... *G06F 3/04166* (2019.05); *G06F 3/046* (2013.01); *G06F 3/0412* (2013.01); *G06F 3/0446* (2019.05); *H01L 27/323* (2013.01); *G06F 3/03545* (2013.01); *G06F 2203/04106* (2013.01); *G06F 2203/04111* (2013.01)

(58) Field of Classification Search
CPC .. G06F 3/04166; G06F 3/0446; G06F 3/0412; G06F 3/046; G06F 3/03545; G06F 2203/04106; G06F 2203/04111
See application file for complete search history.

(56) References Cited

U.S. PATENT DOCUMENTS

| | | | |
|---|---|---|---|
| 9,600,093 B2 | 3/2017 | Park et al. | |
| 10,782,806 B2 | 9/2020 | Kim et al. | |
| 11,194,436 B2 | 12/2021 | Do et al. | |
| 2014/0306925 A1* | 10/2014 | Yeh ...................... | G06F 3/0446 345/174 |
| 2015/0049052 A1 | 2/2015 | Atkinson et al. | |
| 2015/0062062 A1* | 3/2015 | Han ...................... | G06F 3/0446 345/174 |

(Continued)

FOREIGN PATENT DOCUMENTS

| | | |
|---|---|---|
| CN | 106652870 | 5/2017 |
| CN | 107123387 | 9/2017 |

(Continued)

OTHER PUBLICATIONS

Extended European Search Report issued in corresponding European Patent Application No. EP 22183565.5 dated Dec. 23, 2022.

*Primary Examiner* — Robin J Mishler
(74) *Attorney, Agent, or Firm* — F. Chau & Associates, LLC

(57) ABSTRACT

A display device including: a display unit having a plurality of pixels; a plurality of touch electrodes disposed on the display unit; a touch line connected to a first end of each of the plurality of touch electrodes; a common voltage line spaced apart from the plurality of touch electrodes; and a plurality of switching elements connected between the common voltage line and a second end of each of the plurality of touch electrodes.

13 Claims, 36 Drawing Sheets

(56) References Cited

U.S. PATENT DOCUMENTS

| | | | | |
|---|---|---|---|---|
| 2015/0123940 A1* | 5/2015 | Park | ................ | G06F 3/0441 |
| | | | | 345/174 |
| 2017/0017320 A1* | 1/2017 | Tsai | ................ | G06F 3/04166 |
| 2022/0326810 A1 | 10/2022 | Zhao et al. | | |

FOREIGN PATENT DOCUMENTS

| | | |
|---|---|---|
| CN | 106981252 | 4/2019 |
| CN | 109857279 | 6/2019 |
| EP | 2854001 | 4/2015 |
| EP | 3410273 | 12/2018 |
| EP | 3798810 | 3/2021 |
| JP | 5819565 | 10/2015 |
| KR | 10-2016-0044070 | 4/2016 |
| KR | 10-2081606 | 2/2020 |
| KR | 10-2146678 | 8/2020 |
| WO | 2013-125848 | 8/2013 |
| WO | 2021-185052 | 9/2021 |

\* cited by examiner

DISPLAY DEVICE AND A SENSING SYSTEM INCLUDING THE SAME

CROSS-REFERENCE TO RELATED APPLICATION

This application claims priority under 35 U.S.C. § 119 to Korean Patent Application No. 10-2021-0105323 filed on Aug. 10, 2021, in the Korean Intellectual Property Office, the disclosure of which is incorporated by reference herein in its entirety.

1. Technical Field

The present disclosure relates to a display device and a sensing system including the same.

2. Description of the Related Art

A display device is an output device for presentation of information in visual form. Display devices are being increasingly used as the information-oriented society evolves. For example, display devices are employed in various electronic devices such as smartphones, digital cameras, laptop computers, navigation devices, and smart televisions. In addition, a variety of different types of display devices may be implemented. For example, the display device may be a flat panel display device such as a liquid crystal display device, a field emission display device or an organic light emitting display device. Among the flat panel display devices, in the light emitting display device, since tach pixel of a display panel can emit light by itself, an image can be displayed without a backlight.

A display device may include a touch sensing unit which recognizes that an input has made from a user. The touch input may be from a pan of a user's body (e.g., finger) or an electronic pen. The touch sensing unit determines whether a user's input has been made, and calculates a corresponding position as touch input coordinates.

SUMMARY

Embodiments of the present disclosure provide a display device capable of securing reliability of a sensor over the entire area of a touch sensor area.

Embodiments of the present disclosure provide a display device capable of sensing a touch of an input member by using a touch sensing unit that senses a touch of a user's body, without including a separate sensor layer or digitizer layer.

According to an embodiment of the present disclosure, a display device may include: a display unit having a plurality of pixels; a plurality of touch electrodes disposed on the display unit; a touch line connected to a first end of each of the plurality of touch electrodes; a common voltage line spaced apart from the plurality of touch electrodes; and a plurality of switching elements connected between the common voltage line and a second end of each of the plurality of touch electrodes.

The display device may further include a touch driver configured to sense an input of a user's body by driving the plurality of touch electrodes during a first period, and to sense an input of an input device by driving the plurality of touch electrodes during a second period different from the first period.

The display device may further include a display driver configured to display an image by driving the plurality of pixels during a display period, wherein the display period overlaps the first and second periods.

The display device may further include an electromagnetic control late connected to a gate electrode of each of the plurality of switching elements.

The electromagnetic control line may supply a control signal of a gate-off level to the plurality of switching elements during the first period, and supply a control signal of a gate-on level to the plurality of switching elements during the second period.

The display unit may include: a substrate; a thin film transistor layer disposed on the substrate and including a plurality of thin film transistors and the plurality of switching elements; and a light emitting element layer disposed on the thin film transistor layer and including a plurality of light emitting elements, wherein the plurality of switching elements are connected to the second end of each of the plurality of touch electrodes through at least one connection electrode.

The plurality of touch electrodes may include: a driving electrode extending in a first direction in a first metal layer; a sensing electrode extending in a second direction crossing the first direction in the first metal layer; and a bridge electrode connecting the driving electrode in a second metal layer different from the first metal layer, wherein the common voltage line is disposed in the thin film transistor layer, the first metal layer, or the second metal layer.

The plurality of touch electrodes may include a driving electrode extending in a first direction, and a sensing electrode extending in a second direction crossing the first direction, wherein the touch line includes a driving line connected to a first end of the driving electrode, and a sensing line connected to a first end of the sensing electrode.

The plurality of switching; elements may include: a first switching transistor connected to a second end of the driving electrode; and a second switching transistor connected to a second end of the sensing electrode.

The common voltage line may include a first common voltage line and a second common voltage line, wherein the plurality of switching elements include: a first switching transistor connected between the first common voltage line and the second end of the driving electrode; and a second switching transistor connected between the second common voltage line and the second end of the sensing electrode.

The display device may further include: a first electromagnetic control line connected to a gate electrode of each of the plurality of first switching transistors; and a second electromagnetic control line connected to a gate electrode of each of the plurality of second switching transistors, wherein the first electromagnetic control line supplies a first control signal of a gate-on level to the plurality of first switching transistors during a first period, and the second electromagnetic control line supplies a second control signal of a gate-on level to the plurality of second switching transistors during, a second period, after the first period.

The display device may further include: a first extension line connected to the second end of the driving electrode; and a second extension line connected to the second end of the sensing electrode, wherein the plurality of switching elements include: a first switching transistor connected between the first extension line and the common voltage line; and a second switching transistor connected between the second extension line and the common voltage line.

The display device may further include: a first extension line connected to the second end of the driving electrode; and a second extension line connected to the second end of the sensing electrode, wherein the plurality of switching elements include: a first demultiplexer for connecting the first extension line to the common voltage line or the driving line; and a second demultiplexer for connecting the second extension line to the common voltage line or the sensing line.

According to an embodiment of the present disclosure, a display device includes: a display unit having a plurality of pixels; a plurality of touch electrodes disposed on the display unit; a touch line connected to a first end of each of the plurality of touch electrodes; a common voltage line spaced apart from the plurality of touch electrodes; and a plurality of coupling capacitors connected between the common voltage line and a second end of each of the plurality of touch electrodes.

The display device may further include a touch driver configured to sense an input of a user's body by driving the plurality of touch electrodes during a first period, and to sense an input of an input member by driving the plurality of touch electrodes during a second period different from the first period.

The display unit may include: a substrate; a thin film transistor layer disposed on the substrate and comprising a plurality of thin film transistors; and a light emitting element layer disposed on the thin film transistor layer and including a plurality of light emitting elements, wherein the plurality of light emitting elements include: a plurality of pixel electrodes respectively corresponding to a plurality of emission areas; a light emitting layer disposed on the plurality of pixel electrodes; and a common electrode disposed on the light emitting layer and common to the plurality of emission areas.

Each of the plurality of coupling capacitors may include: a first capacitor electrode connected to the second end of each of the plurality of touch electrodes; and a second capacitor electrode, wherein the second capacitor electrode is a pan of the common voltage line integrally formed with the common electrode.

The plurality of touch electrodes may include: a driving electrode extending in a first direction in a first metal layer; a sensing electrode extending in a second direction crossing the first direction in the first metal layer; and a bridge electrode connecting the driving electrode in a second metal layer different from the first metal layer, wherein each of the plurality of coupling capacitors includes: a first capacitor electrode disposed on the second metal layer and connected to the second end of each of the plurality of touch electrodes; and a second capacitor electrode disposed on the first metal layer and connected to the common voltage line.

The plurality of touch electrodes may include: a driving electrode extending in a first direction in a first metal layer; a sensing electrode extending in a second direction crossing the first direction in the first metal layer; and a bridge electrode connecting the driving electrode in a second metal layer different from the first metal layer, wherein each of the plurality of coupling capacitors includes: a first capacitor electrode disposed on the second metal layer and connected to the second end of each of the plurality of touch electrodes; and a second capacitor electrode disposed on the first metal layer, wherein the second capacitor electrode is a part of the common voltage line.

The plurality of touch electrodes may include a driving electrode extending in a first direction, and a sensing electrode extending in a second direction crossing the first direction, wherein the touch line includes a driving line connected to a first end of the driving electrode, and a sensing line connected to a first end of the sensing electrode.

The plurality of coupling capacitors may include: a first coupling capacitor connected between the common voltage line and a second end of the driving electrode; and a second coupling capacitor connected between the common voltage line and a second end of the sensing electrode.

The common voltage line may include a first common voltage line, a second common voltage line, a third common voltage line, and a fourth common voltage line, wherein the plurality of coupling capacitors include: a first coupling capacitor connected between a second end of the driving electrode and the first or second common voltage line; and a second coupling capacitor connected between a second end of the sensing electrode and the third or fourth common voltage line.

The common voltage line may include a first common voltage line, a second common voltage line, a third common voltage line, and a fourth common voltage line, wherein the plurality of coupling capacitors include: a first-first coupling capacitor connected between the first common voltage line and a second end of the driving electrode; a first-second coupling capacitor connected between the second common voltage line and an end of the first-first coupling capacitor: a second-first coupling capacitor connected between the third common voltage line and a second end of the sensing electrode; and a second-second coupling capacitor connected between an end of the second-first coupling capacitor and the fourth common voltage line.

The common voltage line may include a first common voltage line and a second common voltage line, wherein the plurality of coupling capacitors include: a first coupling. capacitor connected between the first common voltage line and a second end of the driving electrode; and a second coupling capacitor connected between the second common voltage line and a second end of the sensing electrode.

The display device may further include a touch driver configured to supply a first driving signal having a first phase to the plurality of driving electrodes during a first period, and supply a first common voltage having the first phase to the first common voltage line during the first period, the touch driver is configured to supply a second driving signal having the first phase to the plurality of sensing electrodes during a second period after the first period, and supply a second common voltage having a second phase opposite to the first phase to the second common voltage line during the second period.

The common voltage line may include a first common voltage line, a second common voltage line, a third common voltage line, and a fourth common voltage line, wherein the plurality of coupling capacitors may include: a plurality of first coupling capacitors alternately connected to the first or second common voltage line; and a plurality of second coupling capacitors alternately connected to the third or fourth common voltage line.

The display device may further include a touch driver configured to supply a first driving signal having a first phase to the plurality of driving electrodes during a first period, and to supply first and second common voltages having the first phase to the first and second common voltage lines during the first period, wherein the touch driver is configured to supply a second-first driving signal having the first phase to a first portion of the plurality of sensing electrodes during a second period after the first period, and supply a third common voltage having a second phase opposite to the first phase to the third common voltage line during the second period, and the touch driver is configured to supply a second-second driving signal having the second phase to a second portion of the plurality of sensing electrodes during the second period, and to supply a fourth common voltage having the first phase to the fourth common voltage line during the second period.

According to an embodiment of the present disclosure, a sensing system includes: a display device for displaying an image; and wherein the display device includes: a display unit having a plurality of pixels; a plurality of touch electrodes disposed on the display unit; a touch line connected to a first end of each of the plurality of touch electrodes; a common voltage line disposed away from the plurality of touch electrodes; a plurality of switching elements connected between the common voltage line and a second end of each of the plurality of touch electrodes; and a touch driver configured to sense an input of a user's body by driving the plurality of touch electrodes during a first period, and to sense an input of an input member by driving the plurality of touch electrodes during a second period different from the first period.

The touch driver may supply a first driving signal having a first phase to at least one touch electrode disposed on a first side of a point among the plurality of touch electrodes, and may supply a second driving signal having a second phase opposite to the first phase to at least one touch electrode disposed on a second side of the point among the plurality of touch electrodes, and the touch driver may receive a first sensing signal having the first phase from at least one touch electrode disposed on the first side of the point, and may receive a second sensing signal having the second phase from at least one touch electrode disposed on the second side of the point.

The input member may be charged by an electromagnetic resonance method when the first and second driving signals are disposed on the point during a second-first period in which the first and second driving signals are supplied to the plurality of touch electrodes, the input member may be discharged when a supply of the first and second driving signals is stopped during a second-second period immediately after the second-first period, and the touch driver may receive a first sensing signal having the first phase from at least one touch electrode disposed on the first side of the point during the second-second period, and may receive a second sensing signal having the second phase from at least one touch electrode disposed on the second side of the point.

According to embodiments of the present disclosure, in the display device and a sensing system including the same, a touch line may supply a driving signal to a first end of touch electrodes, and a common voltage line may supply a common voltage to a second end of the touch electrodes, which is farthest from the touch line, so that the potential of the second end of the touch electrodes may be stably maintained. The common voltage line may supply a common voltage to the second end of the touch electrodes, so that sensing sensitivity at the second end of the touch electrodes may be improved. Accordingly, the display device and the sensing system including the same may include a switching element and the common voltage line disposed in a touch peripheral area, so that the reliability of the sensor may be secured over the entire area of the touch sensor area.

According to embodiments of the present disclosure, in the display device and, the sensing system including the same, the touch line may supply a driving signal to a first end of the touch electrodes, and the coupling capacitor may be connected between a second end of the touch electrodes, which is farthest from the touch line and the common voltage line, so that the potential of the second end of the touch electrodes may be stably maintained. The coupling, capacitor may improve sensing sensitivity at the second end of the touch electrodes. Accordingly, the display device and the sensing system including the same may include the coupling capacitor and the common voltage line disposed in the touch peripheral area, so that the reliability of the sensor may be secured over the entire area of the touch sensor area.

According to embodiments of the present disclosure, in the display device and the sensing system including the same, the touch of the input member may be sensed using the touch sensing unit that senses the touch of the user's body. Accordingly, the display device and the sensing system including the same do not include a separate sensor layer or a digitizer layer for the electromagnetic resonance of the touch input member, thereby reducing the thickness of the display device and reducing cost.

BRIEF DESCRIPTION OF THE DRAWINGS

The above and other features of the present disclosure will become more apparent by describing in detail embodiments thereof with reference to the attached drawings, in which.

DETAILED DESCRIPTION OF THE EMBODIMENTS

Figure 1:
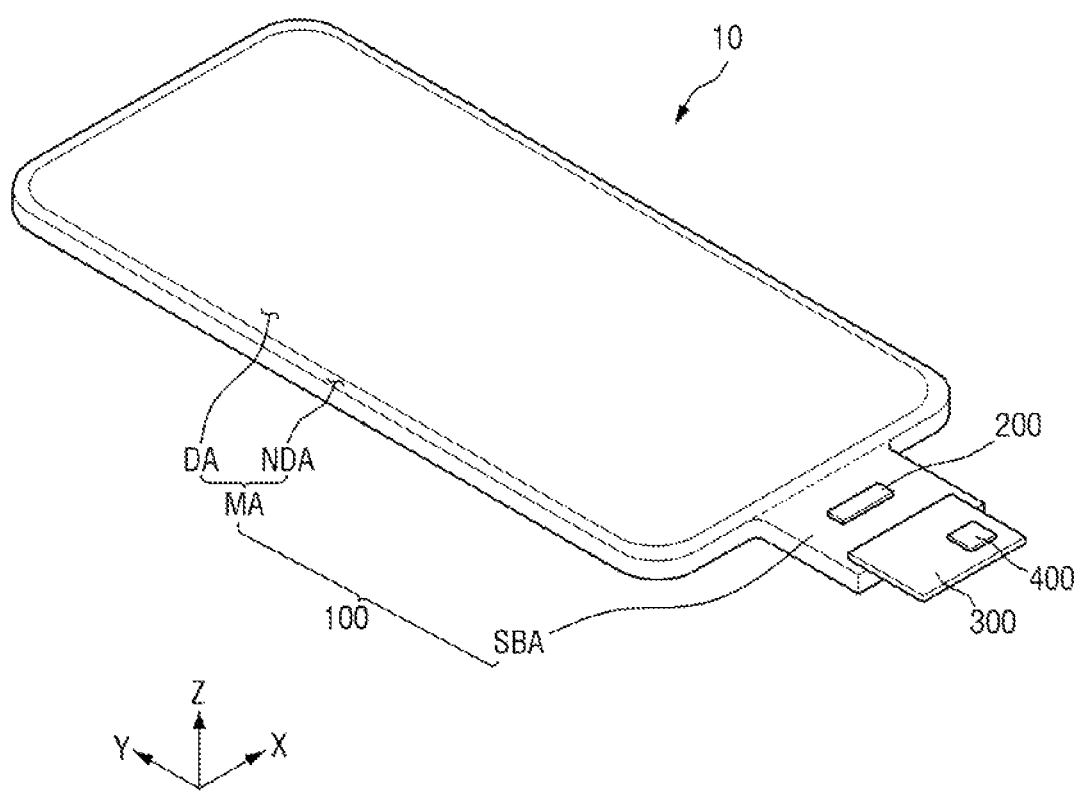
FIG. 1 is a perspective view showing a display device according to an embodiment of the present disclosure.

In the following description, for the purposes of explanation, numerous specific details are set forth to provide a thorough understanding of various embodiments or implementations of the disclosure. As used herein "embodiments" and "implementations" are interchangeable words that are non-limiting examples of devices or methods employing one or more of the inventions of disclosures set forth herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in other embodiments.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged, The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. In addition, like reference numerals may denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. The term "connected" may refer to physical, electrical, and/or fluid connection, with or without intervening elements.

Further, the X-axis, the Y-axis, and the Z-axis are not limited to three axes of a rectangular coordinate system, and thus the. X-, Y-, and Z-axes, and may be interpreted, in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element.

Spatially relative terms, such as "beneath," "below," "under," "lower," "above," "'upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise, Moreover, the terms "comprises," "comprising," "includes," and/or "including," when used in this specification, specify the presence of stated features, integers, steps, operations, elements, components, and/or groups thereof but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. In addition, each block, unit, part, and/or-module of some embodiments may be physically separated into two or more interacting and discrete blocks, units, parts, and/or modules. Further, the blocks, units, parts, and/or modules of some embodiments may be physically combined into more complex blocks, units, parts, and/or modules.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

FIG. 1 is a perspective view showing a display device according to an embodiment of the present disclosure.

Referring to FIG. 1, a display device 10 may be applied to portable electronic devices such as a mobile phone, a smartphone, a tablet personal computer (PC'), a mobile communication terminal, an electronic organizer, an electronic book, a portable multimedia player (PMP), a navigation system, an ultra mobile PC (UMPC) or the like. For example, the display device 10 may be applied as a display unit of a television, a laptop, a monitor, a billboard, or an Internet-of-Things (IoT) device, As another example, the display device 10 may be applied to wearable devices such as a smart watch, a watch phone, a glasses type display, or a head mounted display (HMD). As yet another example, the display device 10 may be applied to a dashboard of a vehicle, a center fascia of a vehicle, a center information display (CID) disposed on a dashboard of a vehicle, a room mirror display in place of side mirrors of a vehicle, or a display disposed on a rear surface of a front seat for rear seat entertainment of a vehicle.

The display device 10 may have a planar shape similar to a quadrilateral shape. For example, the display device 10 may have a shape similar to a quadrilateral shape, in a plan view, having short sides in an X-axis direction and long sides in a Y-axis direction. The corner where the short side in the X-axis direction and the long side in the Y-axis direction meet may be rounded to have a predetermined curvature or may be right-angled. The planar shape of the display device 10 is not limited to a quadrilateral shape, and may be in a shape similar to another polygonal shape, a circular shape, or elliptical shape.

The display device 10 may include the display panel 100, the display driver 200, the circuit board 300, and the touch driver 400.

The display panel 100 may include a main region MA and a sub-region SBA.

The main region MA may include the display area DA including pixels for displaying an image and the non-display area NDA disposed around the display area DA. The display area DA may emit light from a plurality of emission areas or a plurality of opening areas. For example, the display panel 100 may include a pixel circuit including switching elements, a pixel defining layer for defining an emission area or an opening area, and a self-light emitting element.

For example, the self-light emitting element may include at least one of an organic light emitting diode including an organic light emitting layer, a quantum dot light emitting diode including a quantum dot light emitting layer, an inorganic light emitting diode including an inorganic semiconductor, or a micro light emitting diode (micro LED), but is not limited thereto.

The non-display area NDA may be an area outside the display area DA. The non-display area NDA may be an edge area of the main region MA of the display panel 100. The non-display area NDA may include a gate driver that supplies gate signals to gate lines, and fan-out lines that connect the display driver 200 to the display area DA.

The sub-region SBA may extend from one side of the main region MA. The sub-region SBA may include a flexible material which can be bent, folded or rolled, For example, when the sub region SBA is bent, the sub-region SBA may overlap the main region MA in a thickness direction (Z-axis direction). The sub-region SBA may include a display driver 200 and a pad unit connected to the circuit board 300. Optionally, the sub-region SBA may be omitted, and the display driver 200 and the pad unit may be arranged in the non-display area NDA.

The display driver 200 may output signals and voltages for driving the display panel 100. The display driver 200 may supply a data voltage to a data line. The display driver 200 may supply a power voltage to the power line and may supply a gate control signal to the gate driver. The display driver 200 may be an integrated circuit (IC) and mounted on the display panel 100 by a chip on glass (COG) method, a chip on plastic (COP) method, or an ultrasonic bonding, method. For example, the display driver 200 may be disposed in the sub-region SBA, and may overlap the main region MA in the thickness direction (Z-axis direction) by bending of the sub-region SBA. For another example, the display driver 200 may be mounted on the circuit board 300.

The circuit board 300 may be attached to the pad unit of the display panel 100 by using an anisotropic conductive film (ACF). Lead lines of the circuit board 300 may be electrically connected to the pad unit of the display panel 100. The circuit board 300 may be a flexible printed circuit board, a printed circuit board, or a flexible film such as a chip on film.

The touch driver 400 may be mounted on the circuit board 300. The touch driver 400 may be connected to a touch sensing unit of the display panel 100. The touch driver 400 may supply a driving signal to a plurality of touch electrodes of the touch sensing unit and may sense an amount of change in capacitance between the plurality of touch electrodes. For example, the driving signal may be a pulse signal having a predetermined frequency. The touch driver 400 may calculate whether an input is made and input coordinates corresponding to where the input is made based on an amount of change in capacitance between the plurality of touch electrodes. The touch driver 400 may be an integrated circuit (IC).

Figure 2:
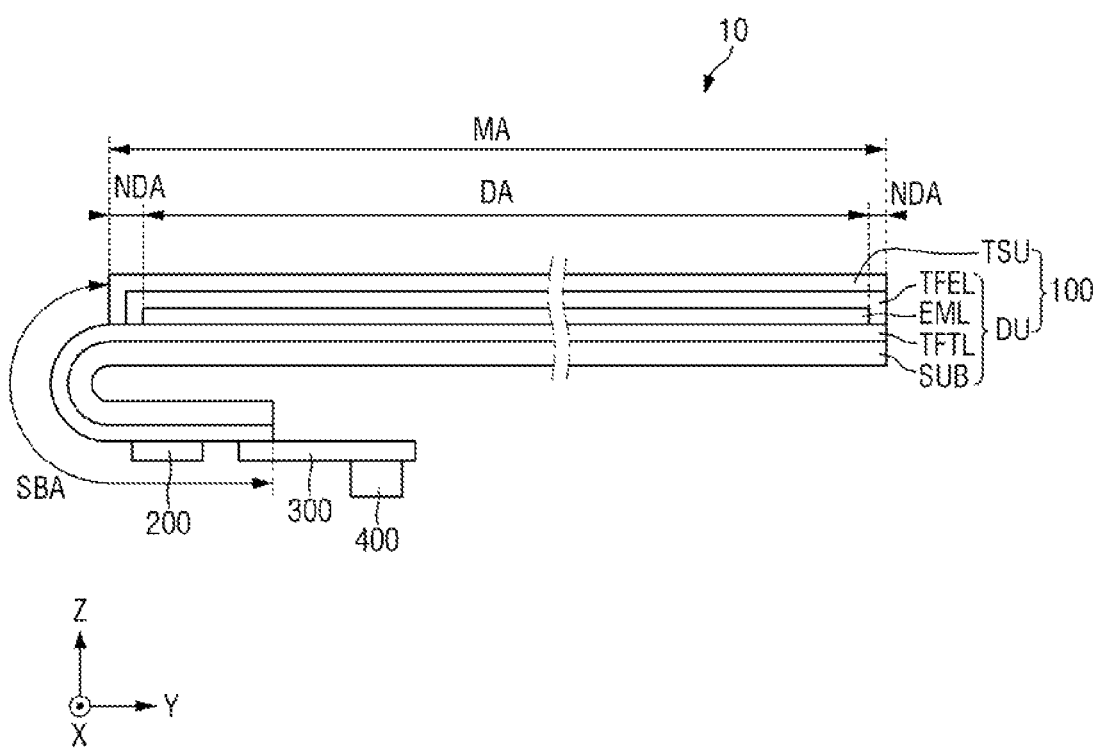
FIG. 2 is a cross-sectional view illustrating a display device according an one embodiment of the present disclosure.

FIG. 2 is a cross-sectional view illustrating a display device according to an embodiment of the present disclosure.

Referring to FIG. 2, the display panel 100 may include a display unit DU and a touch sensing unit TSU. The display unit DU may include a substrate SUB, a thin film transistor layer TFTL, a light emitting element layer EML, and an encapsulation layer TFEL.

The substrate SUB may be a base substrate or a base member. The substrate SUB may be a flexible substrate which can be bent, folded or rolled. For example, the substrate SUB may include an insulating material such as a polymer resin such as polyimide (PI), but the present disclosure is not limited thereto. As another example, the SUB may include a glass material or a metal material.

The thin film transistor layer TFTL may be disposed on the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines that connect the display driver 200 to the data lines, lead lines that connect the display driver 200 to the pad unit, and the like. Each of the thin film transistors may include a semiconductor region, a drain electrode, a source electrode, and a gate electrode. For example, when the gate driver is formed on one side of the non-display area NDA of the display panel 100, the gate driver ma include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include a plurality of light emitting elements in which a first electrode, a light emitting layer, and a second electrode are sequentially stacked to emit light, and a pixel defining layer for defining pixels. A plurality of light emitting elements of the light emitting element layer EML may be disposed in the display area DA. The light emitting element layer EML may not be disposed in the non-display area NDA.

For example, the light emitting element layer EML may be an organic light emitting layer including an organic material. The light emitting element layer EML may include a hole transporting layer, an organic light emitting layer, and an electron transporting layer. When the first electrode receives a predetermined voltage through the thin film transistor of the thin film transistor layer TFTL and the second electrode receives the common voltage, holes and electrons may be transferred to the organic light emitting layer through the hole transporting layer and the electron transporting layer, respectively and may be combined with each other to emit light in the organic light emitting layer. For example, the first electrode may be an anode electrode, and the second electrode may be a cathode electrode, but the present disclosure is not limited thereto.

As another example, the plurality of light emitting elements may include a quantum dot light emitting diode including a quantum dot light emitting layer, an inorganic light emitting diode including an inorganic semiconductor, or an ultra-small light emitting diode.

The encapsulation layer TFEL may cover the top surface and the side surface of the light emitting element layer EML, and may protect the light emitting element layer EML. The encapsulation layer TFEL may include at least one inorganic layer and at least one organic layer for encapsulating the light emitting element layer EML.

The touch sensing unit TSU may be disposed on the encapsulation layer TFEL. The touch sensing unit TSU may include a plurality of touch electrodes for sensing a user's touch in a capacitive manner, and touch lines for connecting the plurality of touch electrodes to the touch driver 400. The touch electrode may include a driving electrode and a sensing electrode, and the touch line may include a driving line connected to the driving electrode and a sensing line connected to the sensing electrode. The touch sensing unit TSU may sense a touch of a user's body by using a mutual capacitance or self-capacitance method. For example, the touch driver 400 may supply a driving signal to a plurality of driving electrodes and receive a sensing signal from a plurality of sensing electrodes to sense an amount of change in mutual capacitance between the driving electrode and the sensing electrode. As another example, the touch driver 400 may supply a driving signal to each of the plurality of driving electrodes and the plurality of sensing electrodes, and receive a sensing signal from each of the plurality of driving electrodes and the plurality of sensing electrodes, thereby sensing an amount of change in self-capacitance of each of the plurality of driving electrodes and the plurality of sensing electrodes.

As another example, the touch sensing unit TSU may sense the approach or contact of an input member such as an input pen. Here, the input pen may be a stylus pen, an electromagnetic pen, a smart pen, or an active pen, but the present disclosure is not limited thereto. For example, the stylus pen may include a coil, and may output a radio frequency signal in response to a magnetic field or electromagnetic signal.

The plurality of touch electrodes of the touch sensing unit TSU may be disposed in a touch sensor area overlapping the display area DA. The touch lines of the touch sensing unit TSU may be disposed in a touch peripheral area that overlaps the non-display area NDA.

For example, a polarizing film and a cover window may be additionally disposed on the touch sensing unit TSU. The polarizing film may be disposed on the touch sensing unit TSU, and the cover window may be disposed on the polarizing film by an adhesive member.

The sub-region SBA of the display panel 100 may extend from one side of the main region MA. The sub-region SBA may include a flexible material which can be bent, folded or rolled. For example, when the sub-region SBA is bent, the sub-region SBA may overlap the main region MA in a thickness direction (Z-axis direction). In other words, the sub-region SBA may be disposed below the display area DA. The sub-region SBA may include the display driver 200 and the pad unit connected to the circuit board 300.

Figure 3:
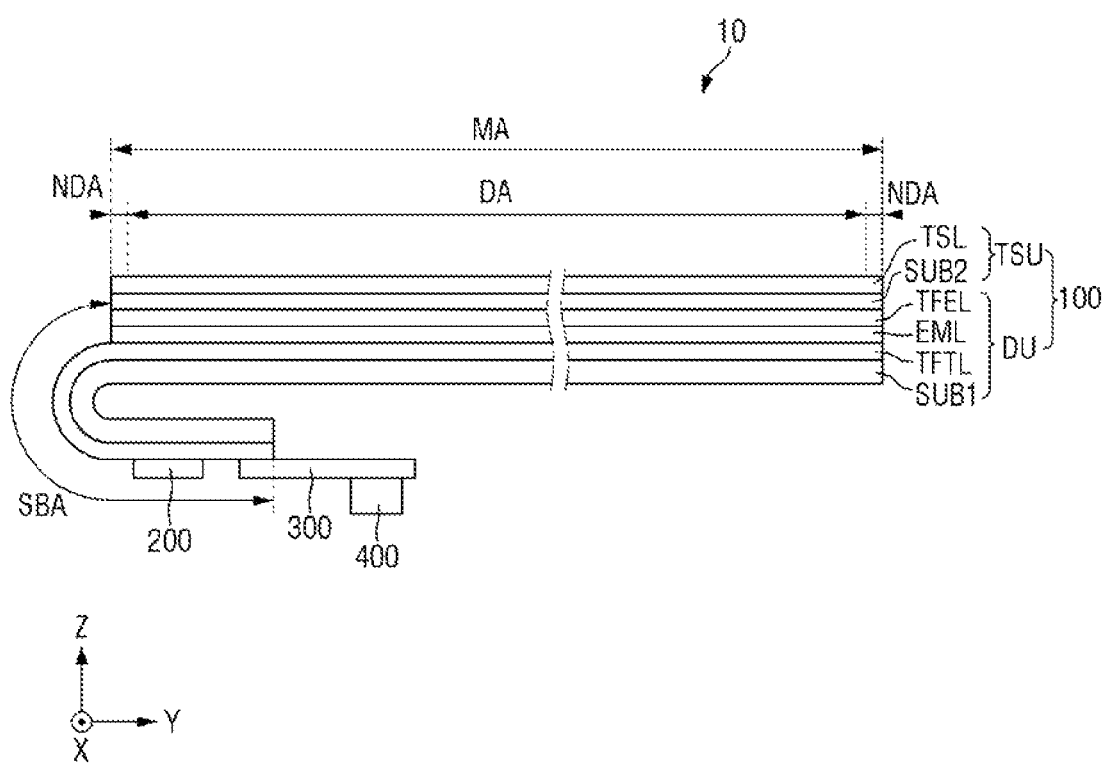
FIG. 3 is a cross-sectional view showing a display device according an another embodiment of the present disclosure.

FIG. 3 is a cross-sectional view showing a display device according to an embodiment of the present disclosure. The display device illustrated in FIG. 3 is different from the display device illustrated in FIG. 2 in the configuration of the touch sensing unit. A description of the same configuration as the above-described configuration will be briefly given or omitted.

Referring to FIG. 3, the display panel 100 may include the display unit DU and the touch sensing unit TSU. The display unit DU may include a first substrate SUB1, the thin film transistor layer TFTL, the light emitting element layer EML, and the encapsulation layer TFEL.

The first substrate SUB1 may be a base substrate or a base member. For example, the first substrate SUB1 may include an insulating material such as a polymer resin such as polyimide (PI), but the present disclosure is not limited thereto.

The thin film transistor layer TFTL, the light emitting element layer EML, and the encapsulation layer TFEL may be sequentially stacked on the first substrate SUB1.

The touch sensing unit TSU may include a second substrate SUB2 and a touch sensor layer TSL. For example, the touch sensing unit TSU may be separately fabricated and attached to the display unit DU, but is not limited thereto.

The second substrate SUB2 may be disposed on the encapsulation layer TFEL. The second substrate SUB2 may be a base substrate or a base member, and may support the touch sensing unit TSU. The second substrate SUB2 may be disposed between the touch sensing layer TSL and the encapsulation layer TFEL. For example, the second substrate SUB2 may include a glass material or a metal material, but is not limited thereto. As another example, the second substrate SUB2 may include an insulating material such as a polymer resin such as polyimide (PI).

The touch sensor layer TSL may be disposed on the second substrate SUB2. The touch sensor layer TSL may include a plurality of touch electrodes for sensing a user's touch in a capacitive manner, and touch lines for connecting the plurality of touch electrodes to the touch driver 400. For example, the touch sensor layer TSL may sense the user's touch by using a mutual capacitance method or a self-capacitance method. As another example, the touch sensing unit TSU may detect an approach or contact of an input member such as an input pen. Here, the input pen may be a stylus pen, an electromagnetic pen, a smart pen, or an active pen, but is not limited thereto.

Figure 4:
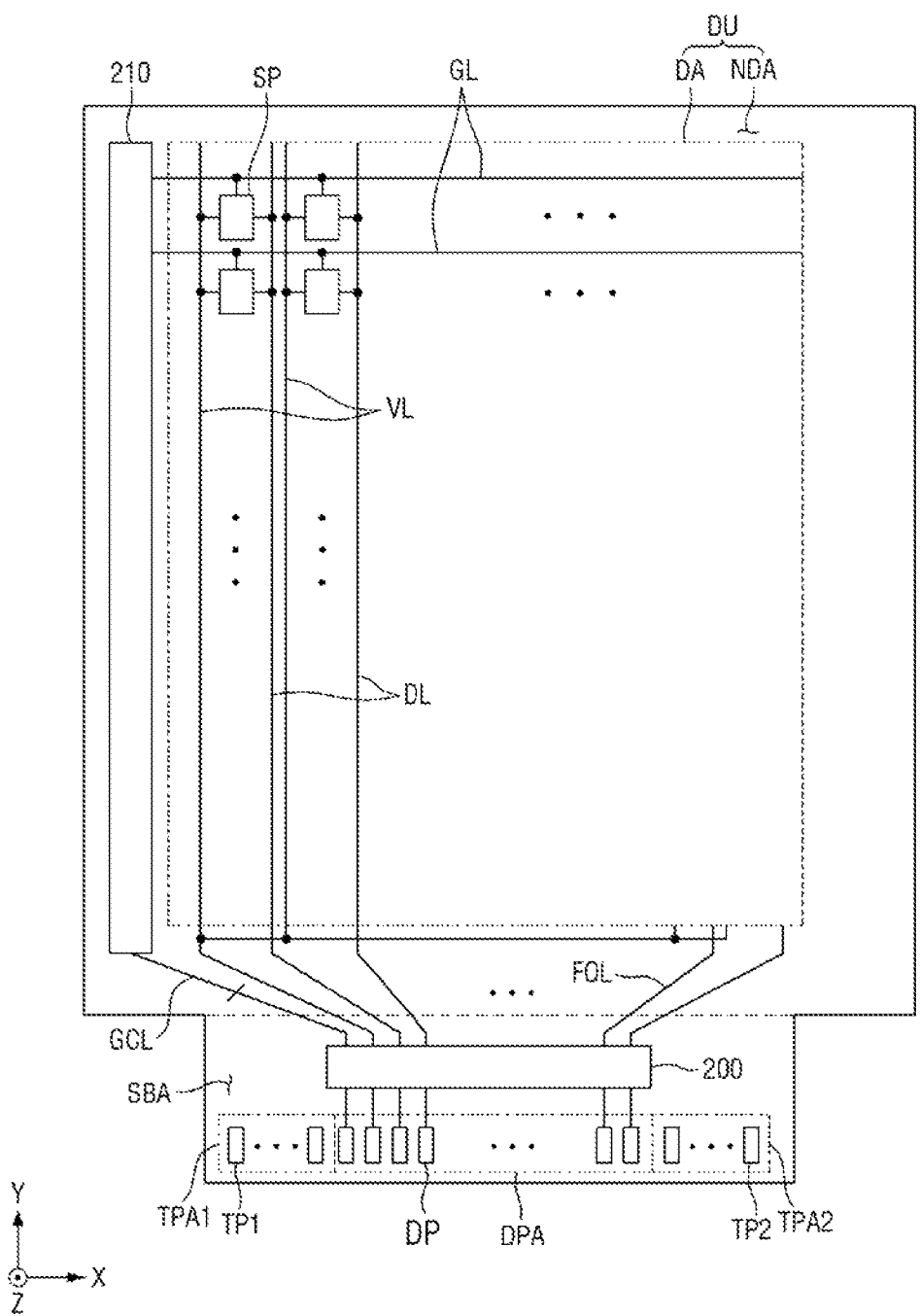
FIG. 4 is a plan view illustrating a display unit of a display device according to an embodiment of the present disclosure.

FIG. 4 is a plan view illustrating a display unit of a display device according to an embodiment of the present disclosure.

Referring to FIG. 4, the display unit DU may include the display area DA and the non-display area NDA.

The display area DA, which is an area for displaying an image, may be the central area of the display panel 100. The display area DA may include a plurality of pixels SP, a plurality of gate lines GL, a plurality of data lines DL, and a plurality of power lines VL. Each of the plurality of pixels SP may be an area of the smallest unit that outputs light.

The plurality of gate lines GL may supply gate signals received from a gate driver 210 to the plurality of pixels SP. The plurality of gate lines GL may extend in the X-axis direction and may be spaced apart from each other in the Y-axis direction that crosses the X-axis direction.

The plurality of data lines DL may supply a data, voltages received from the display driver 200 to the plurality of pixels SP. The plurality of data lines DL may extend in the Y-axis direction and may be spaced apart from each other in the X-axis direction.

The plurality of power lines VL may supply a power voltage received from the display driver 200 to the plurality of pixels SP. Here, the power voltage may be at least one of a driving voltage, an initialization voltage, a reference voltage, or a low potential voltage. The plurality of power lines VL may extend in the Y-axis direction and may be spaced apart from each other in the X-axis direction.

The non-display area NDA may surround the display area DA. The non-display area NDA may include the gate driver 210, fan-out lines FOL, and a gate control line GCL. The gate driver 210 may generate a plurality of gate signals based on the gate control signal, and may sequentially supply the plurality of gate signals to the plurality of gate lines GL according to a set order.

The fan-out lines FOL, may extend from the display driver 200 to the display area DA. The fan-out lines FOL may supply the data voltage received from the display driver 200 to the plurality of data lines DL.

The gate control line GCL may extend from the display driver 200 to the gate driver 210. The gate control line GCL may supply the gate control signal received from the display driver 200 to the gate driver 210.

The sub-region SBA may include the display driver 200, a display pad area DPA, and first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to the plurality of pixels SP to determine the luminance of the plurality of pixels SP. The display driver 200 may supply the gate control signal to the gate driver 210 through the gate control line GCL.

The display pad area DPA, the first touch pad area TPA1, and the second touch pad area TPA2 may be disposed at the edge of the sub-region SBA. The display pad area DPA, the first touch pad area TPA1, and the second touch pad area TPA2 may be electrically connected to the circuit board 300 by using a low-resistance high-reliability material such as an anisotropic conductive film, or self assembly anisotropic conductive paste (SAP).

The display pad area DPA may include a plurality of display pad units DP. The plurality of display pad units DP may be connected to a main processor through the circuit board 300. The plurality of display pad units DP may be connected to the circuit board 300 to receive digital video data, and may supply the digital video data to the display driver 200.

Figure 5:
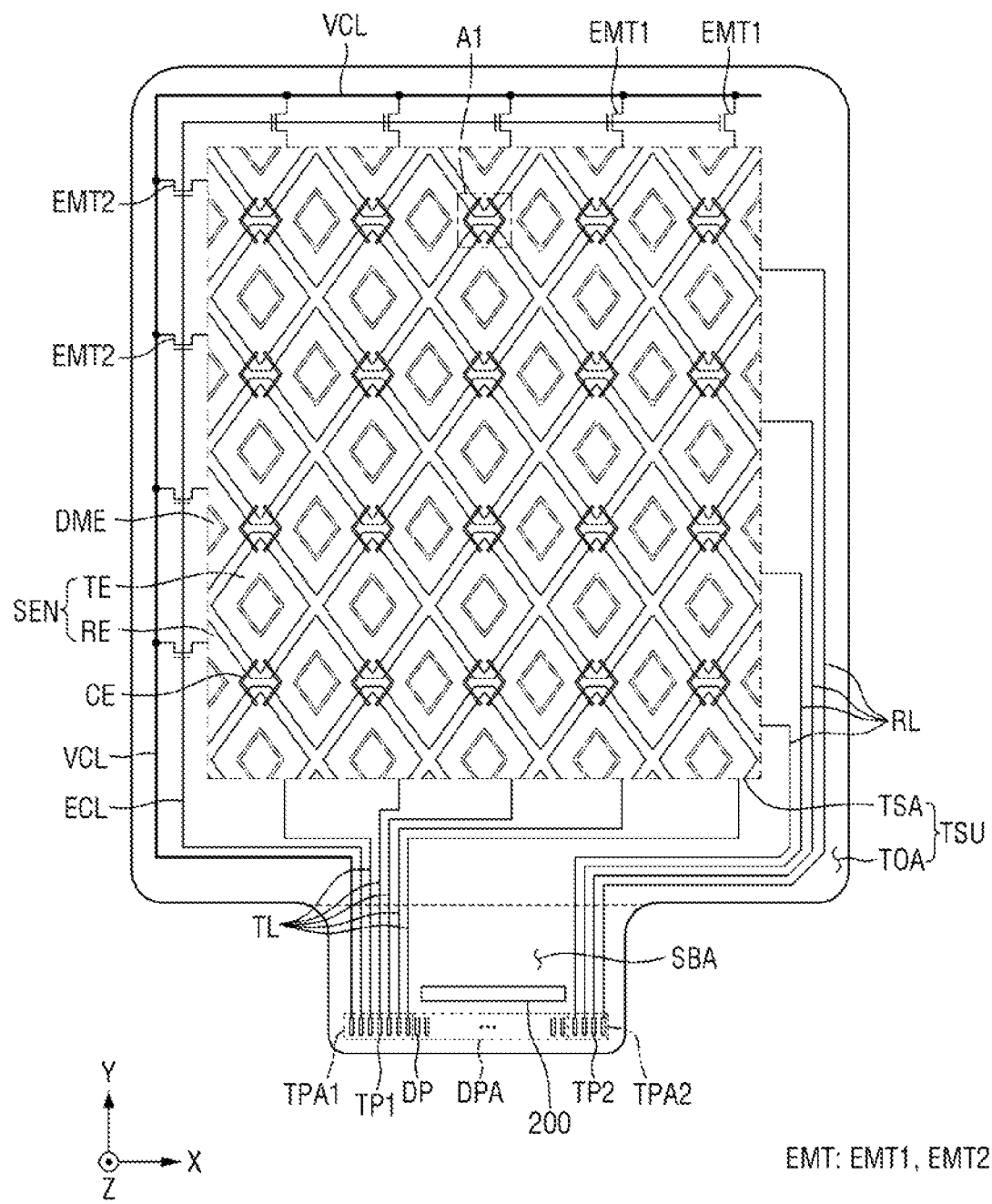
FIG. 5 is a plan view illustrating a touch sensing unit of a display device according to an embodiment of the present disclosure.

FIG. 5 is a plan view illustrating a touch sensing unit of a display device according to an embodiment of the present disclosure.

Referring to FIG. 5, the touch sensing unit TSU may include a touch sensor area TSA for sensing a user's touch, and a touch peripheral area TOA disposed around the touch sensor area TSA. The touch sensor area TSA may overlap the display area DA of the display unit DU, and the touch peripheral area TOA may overlap the non-display area NDA of the display unit DU.

The touch sensor area TSA may include a plurality of touch electrodes SEN and a plurality of dummy electrodes DME. The plurality of touch electrodes SEN may form mutual capacitance or self-capacitance to sense a touch of an object or a person. The plurality of touch electrodes SEN may include a plurality of driving electrodes TE and a plurality of sensing electrodes RE.

The plurality of driving electrodes TE may be spaced apart from each other in the X-axis direction and the Y-axis direction. The driving electrodes TE adjacent in the Y-axis direction may be electrically connected through a bridge electrode CE. The plurality of driving electrodes TE may be connected to a first touch pad unit TP1 through a driving line TL. The plurality of driving electrodes TE and the plurality of bridge electrodes CE connected to one driving line TL may extend in the Y-axis direction. For example, the driving, electrodes TE disposed below the touch sensor area TSA may be connected to the first touch pad unit TP1 through the driving line TL. The driving line TL may extend to the first touch pad unit. TP1 through the lower side of the touch peripheral area TOA. The first touch pad unit TP1 may be connected to the touch driver 400 through the circuit board 300.

The touch sensor area TSA may further include the bridge electrode CE connecting the driving electrodes TE. The bridge electrode CE may be bent at least once. For example, the bridge electrode CE may have an angle bracket shape ("<" or ">"), but the planar shape of the bridge electrode CE is not limited thereto. The driving electrodes TE adjacent to each other in the Y-axis direction may be connected by a plurality of bridge electrodes CE, and in the case one of the bridge electrodes CE is disconnected, the driving electrodes TE may be stably connected through the remaining bridge electrode CE. The driving electrodes TE adjacent to each other may be connected by two bridge electrodes CE, but the number of bridge electrodes CE is not limited thereto.

The bridge electrode CE may be disposed on a different layer from the plurality of driving electrodes TE and the plurality of sensing electrodes RE. The sensing electrodes RE adjacent to each other in the X-axis direction may be electrically connected through a connection portion disposed on the same layer as the plurality of driving electrodes TE or the plurality of sensing electrodes RE, and the driving electrodes TE adjacent in the Y-axis direction may be electrically connected through the bridge electrode CE disposed on a different layer from the plurality of driving electrodes TE or the plurality of sensing electrodes RE. Accordingly, although the bridge electrode CE overlaps the plurality of sensing electrodes RE in the Z-axis direction, the plurality of driving electrodes TE and the plurality of sensing electrodes RE may be insulated from each other. Mutual capacitance may be formed between the driving electrode TE and the sensing electrode RE.

The plurality of sensing electrodes RE may extend in the X-axis direction and may be spaced apart from each other in the Y-axis direction. The sensing electrodes RE adjacent in the X-axis direction may be electrically connected through a connection portion. The connection portion may be integrally formed between two adjacent sensing electrodes RE.

The plurality of sensing electrodes RE may be connected to the second touch pad unit TP2 through a sensing line RL. For example, the sensing electrodes RE disposed on the right side of the touch sensor area TSA may be connected to a second touch pad unit TP2 through the sensing line RL. The sensing line RL may extend to the second touch pad unit TP2 through the right side and the lower side of the touch peripheral area TOA. The second touch pad unit TP2 may be connected to the touch driver 400 through the circuit board 300.

Each of the plurality of dummy electrodes DME may be surrounded by the driving electrode TE or the sensing electrode RE. Each of the dummy electrodes DME may be insulated by being spaced apart from the driving electrode TE or the sensing electrode RE. Accordingly, the dummy electrode DME may be electrically floating. Optionally, the plurality of dummy electrodes DME may be omitted.

The touch peripheral area TOA may, include the driving line TL, the sensing line RL, a plurality of switching transistors EMT, an electromagnetic control line ECL, and a common voltage line VCL.

The switching transistor EMT may be a switching element connected between the plurality of touch electrodes SEN and the common voltage line VCL. The plurality of switching transistors EMT may include a first switching transistor EMT1 and a second switching transistor EMT2. The first switching transistor EMT1 may be disposed on the upper side of the touch peripheral area TOA. The first switching transistor EMT1 may be disposed on the opposite side of the driving line TL. The first switching transistor EMT1 may be connected to the driving electrodes TE disposed farthest from the driving line TL. For example, the first switching transistor EMT1 may be disposed between the driving electrode TE disposed farthest from the driving line TL and a side of the touch sensing unit TSU disposed farthest from the sub-region SBA. The first switching transistor EMT1 may be disposed between the driving electrodes TE and the common voltage line VCL disposed on the upper side of the touch sensor area TSA. The first switching transistor EMT1 may be turned on based on a control signal of the electromagnetic control line ECL. For example, the control signal of the electromagnetic control line ECL may be provided to a gate electrode of the first switching transistor EMT1. The first switching transistor EMT1 may be turned off during the touch sensing period, and the driving electrodes TE may not receive a common voltage. The first switching transistor EMT1 may be turned on during the electromagnetic sensing period to supply a common voltage to the driving electrodes TE. Here, the touch driver 400 may sense a touch of the user's body during the touch sensing period, and sense the approach or contact of an input member such as an input pen during the electromagnetic sensing period.

The second switching transistor EMT2 may be disposed on the left side of the touch peripheral area TOA. The second switching transistor EMT2 may be disposed on the opposite side of the sensing line RL. The second switching transistor EMT2 may be connected to the sensing electrodes RE disposed farthest from the sensing line RL. The second switching transistor EMT2 may be disposed between the sensing electrodes RE and the common voltage line VCL disposed on the left side of the touch sensor area ISA. The second switching transistor EMT2 may be turned on based on a control signal of the electromagnetic control line ECL. For example, the control signal of the electromagnetic control line ECL may be provided to a gate electrode of the second switching transistor EMT2. The second switching transistor EMT2 may be turned off during the touch sensing period, and the sensing electrodes RE may not receive the common voltage. The second switching transistor EMT2 may be turned on during the electromagnetic sensing period to supply a common voltage to the sensing electrodes RE. In other words, the first and second switching transistors EMT1 and EMT2 may be on and off at the same time.

The electromagnetic control line ECL, may supply a control signal to the gate electrode of the plurality of switching transistors EMT. The electromagnetic control line ECL may extend to the first touch pad unit TP1 via the upper side, the left side, and the lower side of the touch peripheral area TOA. The electromagnetic control line ECL may supply a gate-off level control signal to the plurality of switching transistors EMT during the touch sensing period. The electromagnetic control line ECL may supply a control signal of a gate-on level to the plurality of switching transistors EMT during the electromagnetic sensing period.

The common voltage line VCL may be disposed along the periphery of the touch peripheral area TOA. The common voltage line VCL may extend to the first touch pad unit TP1 via the upper side, the left side, and the lower side of the touch peripheral area TOA. The number of common voltage lines VCL is not limited to that illustrated in FIG. 5. The common voltage line VCL may supply a common voltage to the driving electrodes TE and the sensing electrodes RE during the electromagnetic sensing period. For example, the common voltage of the common voltage line VCL may be the same as the common voltage supplied to the display unit DU, but is not limited thereto. As another example, the common voltage of the common voltage line VCL may have a constant potential. As another example, the common voltage of the common voltage line VCL may be a sine wave, a pulse wave, or a ramp wave having a predetermined frequency.

In the case that the sensing lines RL are disposed on the left side of the touch peripheral area TOA and the driving lines TL are disposed on the right side of the touch peripheral area TOA, a portion of the common voltage line VCL and the second switching transistors EMT2 may be disposed on the right side of the touch peripheral area TOA.

The display pad area DPA the first touch pad area TPA1, and the second touch pad area TPA2 may be disposed at the edge of the sub-region SBA. The display pad area DPA, the first touch pad area TPA1, and the second touch pad area TPA2 may be electrically connected to the circuit board 300 by using a low-resistance high-reliability material such as an anisotropic conductive film or self assembly anisotropic conductive paste (SAP).

The first touch pad area TPA1 may be disposed on one side of the display pad area DPA, and may include a plurality of first touch pad units TP1. The plurality of first touch pad units TP1 may be electrically connected to the touch driver 400 disposed on the circuit board 300. The plurality of first touch pad units TP1 may supply a driving signal to the plurality of driving electrodes TE through a plurality of driving lines TL. The plurality of first touch pad units TP1 may supply a common voltage to the driving electrodes TE and the sensing electrodes RE through the common voltage line VCL during the electromagnetic sensing period.

The second touch pad area TPA2 may be disposed on the other side of the display pad area DPA, and may include a plurality of second touch pad units TP2. The plurality of second touch pad units TP2 may be electrically connected to the touch driver 400 disposed on the circuit board 300. The touch driver 400 may receive a sensing signal through a plurality of sensing lines RL connected to the plurality of second touch pad units TP2, and may sense a change in mutual capacitance between the driving, electrode TE and the sensing electrode RE.

As another example, the touch driver 400 may supply a driving signal to each of the plurality of driving electrodes TE and the plurality of sensing electrodes RE, and may receive a sensing signal from each of the plurality of driving electrodes TE and the plurality of sensing electrodes RE. The touch driver 400 may sense an amount of change in electric charge of each of the plurality of driving electrodes TE and the plurality of sensing electrodes RE based on the sensing signal.

Figure 6:
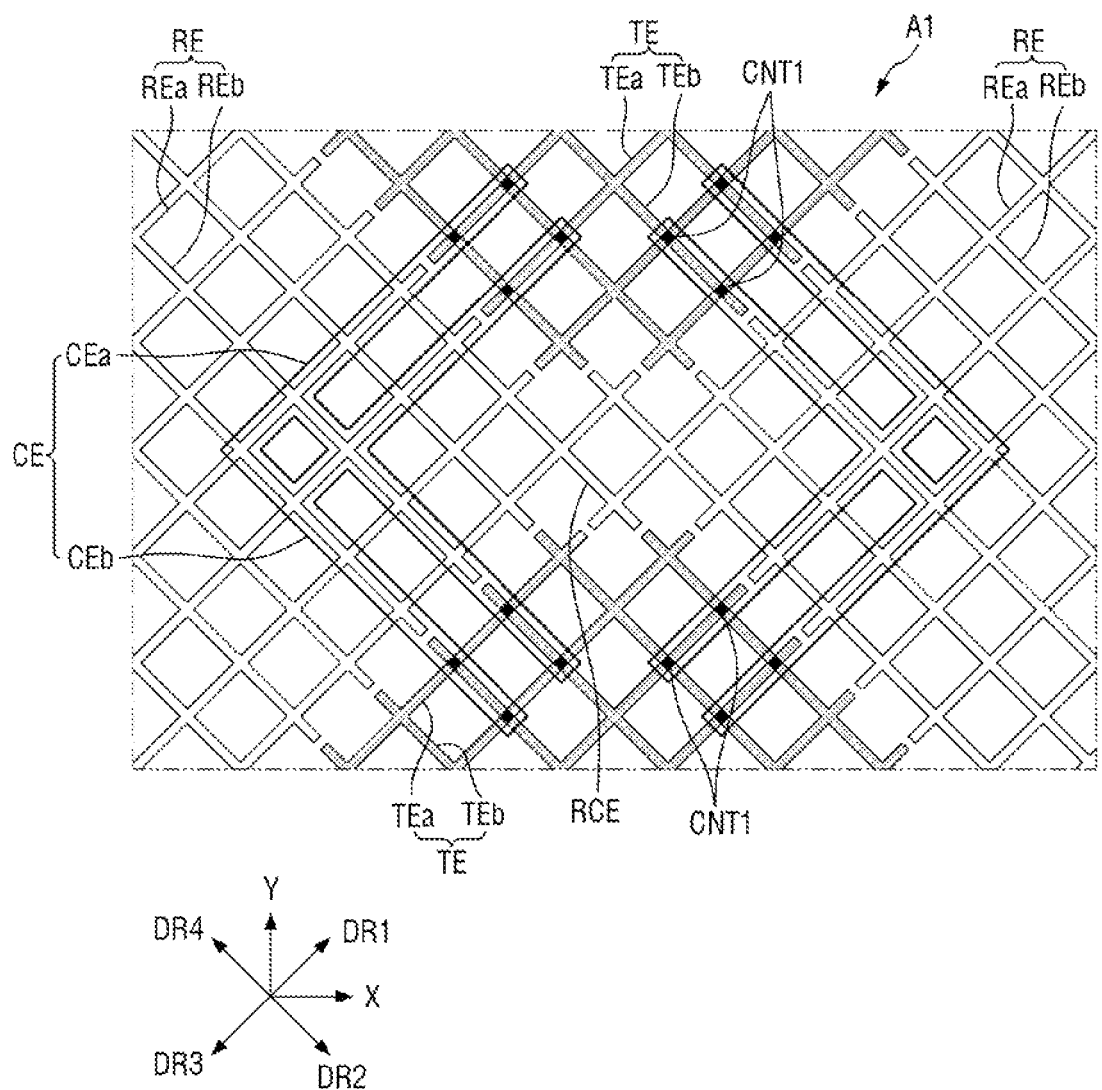
FIG. 6 is an enlarged view of area A1 of FIG. 5.
Figure 7:
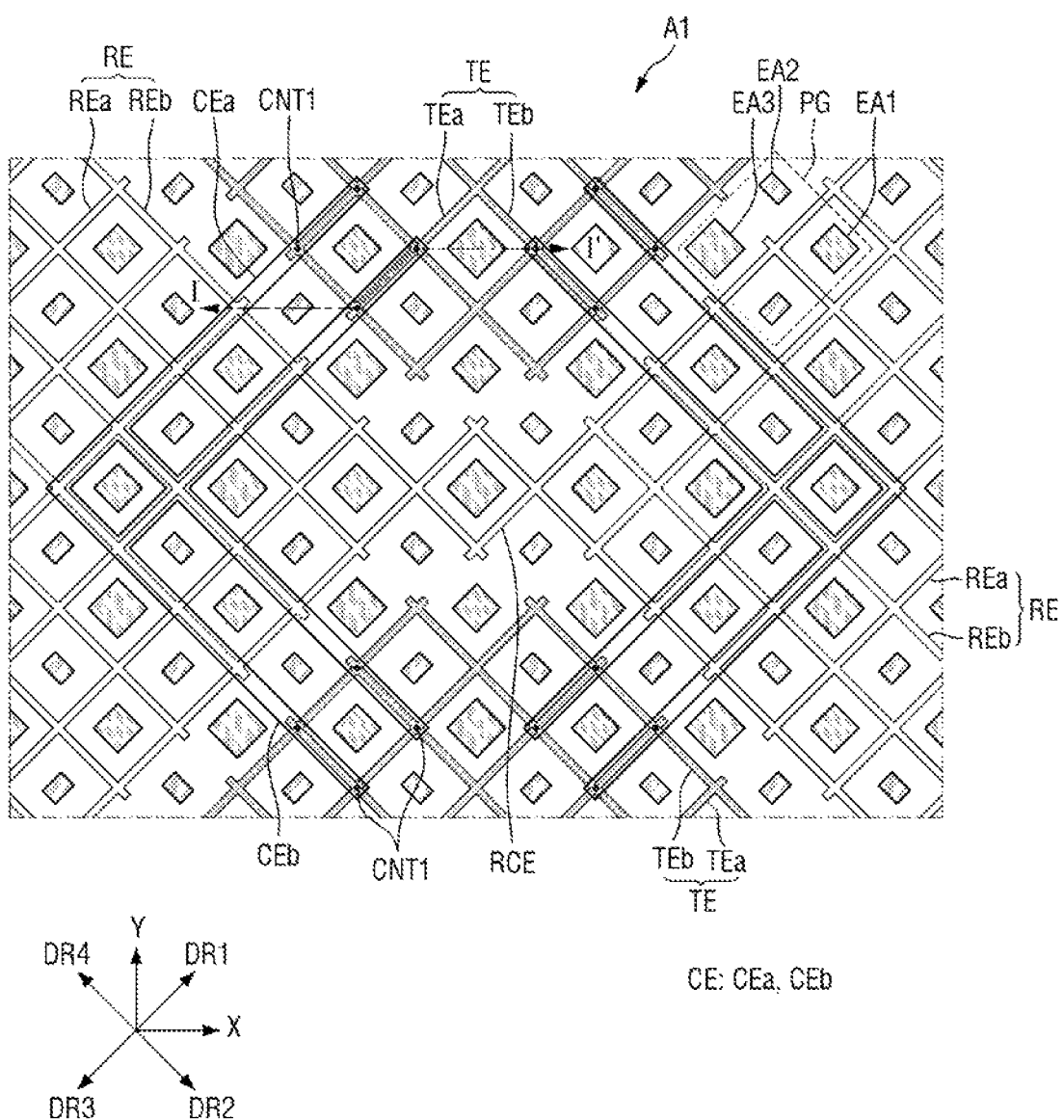
FIG. 7 is an enlarged view illustrating a part of a display device according to an embodiment of the present disclosure.

FIG. 6 is an enlarged view of area A1 of FIG. 5, and FIG. 7 is an enlarged view illustrating a part of a display device according to an embodiment of the present disclosure.

Referring to FIGS. 6 and 7, the plurality of driving electrodes TE, the plurality of sensing electrodes RE, and the plurality of dummy electrodes DME may be disposed on the same layer and may be spaced apart from each other.

The plurality of driving electrodes TE may be spaced apart from each other in the X-axis direction and the Y-axis direction. The driving electrodes TE adjacent in the Y-axis direction may be electrically connected through a bridge electrode CE.

The plurality of bridge electrodes CE may be disposed on a different layer from the driving electrode TE and the sensing electrode RE. The bridge electrode CE may include a first portion CEa and a second portion CEb. For example, the first portion CEa of the bridge electrode CE may be connected to the driving electrode TE disposed on one side through a first contact hole CNT1 and extend in a third direction DR3. The second portion CEb of the bridge electrode CE may be bent from the first portion CEa in an area overlapping the sensing electrode RE to extend in a second direction DR2, and may be connected to the driving electrode TE disposed on the other side through the first contact hole CNT1. Hereinafter, a first direction DR1 may be a direction between the X-axis direction and the Y-axis direction, a second direction DR2 may be a direction between the opposite direction of the Y-axis and the X-axis direction, a third direction DR3 may be an opposite direction of the first direction DR1, and a fourth direction DR4 may be an opposite direction of the second direction DR2. Accordingly, each of the plurality of bridge electrodes CE may connect the adjacent driving electrodes TE in the Y-axis direction.

The plurality of sensing electrodes RE may extend in the X-axis direction and may be spaced apart from each other in the Y-axis direction. The sensing electrodes RE adjacent in the X-axis direction may be electrically connected through a connection portion RCE. For example, the connection portion RCE of the sensing electrodes RE may be disposed within the shortest distance between the driving electrodes TE adjacent to each other.

For example, the plurality of driving electrodes TE, the plurality of sensing electrodes RE, and the plurality of dummy electrodes DME may be formed in a planar mesh structure or a mesh structure. The plurality of driving electrodes TE, the plurality of sensing electrodes RE, and the plurality of dummy electrodes DME may surround each of first to third emission areas EA1, EA2, and EA3 of a pixel group PG in plan view. Accordingly, the plurality of driving; electrodes TE, the plurality of sensing electrodes RE, and the plurality of dummy electrodes DME may not overlap first, second and third emission areas EA1, EA2, and EA3. The plurality of bridge electrodes CE may also not overlap the first to third emission areas EA1, EA2, and EA3. Accordingly the display device 10 may prevent the luminance of light conned from the first to third emission areas EA1, EA2, and EA3 from being reduced by the touch sensing unit TSU.

Each of the plurality of driving electrodes TE may include a first portion TEa extending in the first direction DR1 and a second portion TEb extending in the second direction DR2., Each of the plurality of sensing electrodes RE may include a first portion REa extending in the first direction DR1 and a second portion REb extending in the second direction DR2.

The plurality of pixels may include first, second and third sub-pixels, and each of the first to third sub-pixels may include the first to third emission areas EA1, EA2, and EA3. For example, the first emission area EA1 may emit light of a first color or red light, the second emission area EA2 may emit light of a second color or green light, and the third emission area EA3 may emit light of a third color or blue light, but is not limited thereto.

One pixel group PG may represent a white gray scale by including one first emission area EA1, two second emission areas EA2, and one third emission area EA3, but the configuration of the pixel group PG is not limited thereto. The white gray scale may be represented by a combination of light emitted from one first emission area EA1, light emitted from two second emission areas EA2, and light emitted from one third emission area EA3.

Figure 8:
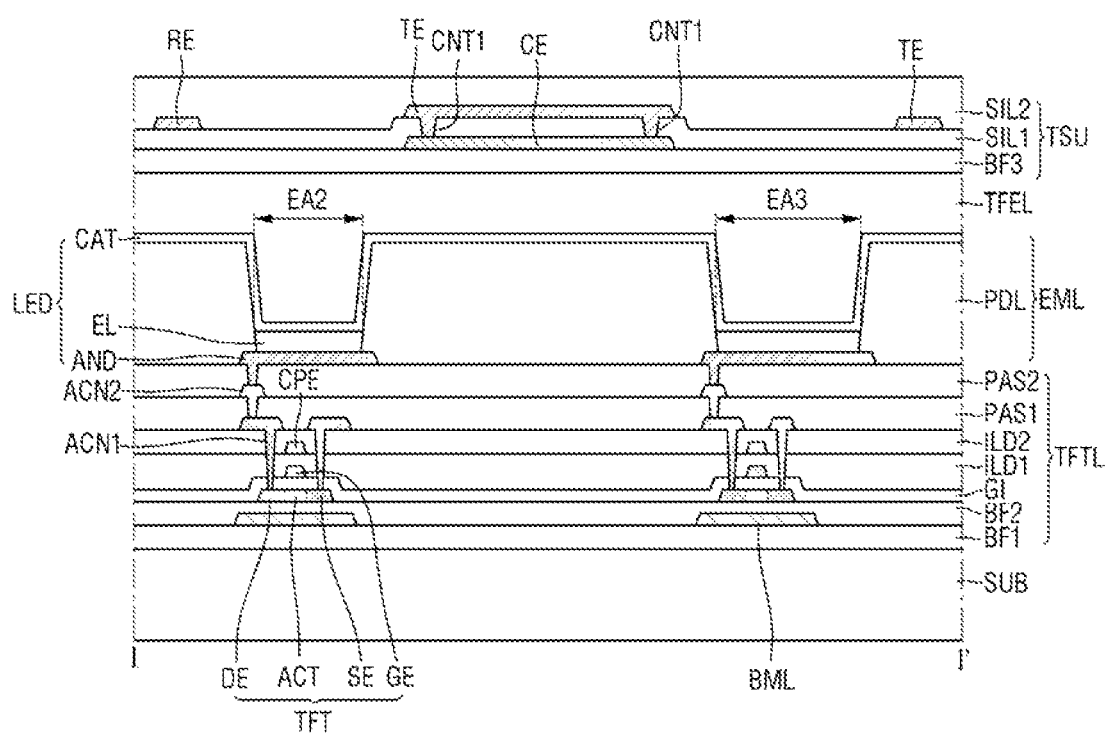
FIG. 8 is a cross-sectional view taken along line I-I' of FIG. 7.

FIG. 8 is a cross-sectional view taken along line I-I' of FIG. 7.

Referring to FIG. 8, the display panel 100 may include the display unit. DU and the touch sensing unit TSU. The display unit DU may include the substrate SUB, the thin film transistor layer TFTL, the light emitting element layer EML, and the encapsulation layer TFEL.

The substrate SUB may be a base substrate or a base member. The substrate SUB may be a flexible substrate which can be bent, folded or rolled. For example, the substrate SUB may include an insulating material such as a polymer resin such as polyimide (PI), but the present disclosure is not limited thereto. As another example, the SUB may include a glass material or a metal material.

The thin film transistor layer TFTL may include a first buffer layer BF1, a light blocking layer BML, a second buffer layer BF2, a thin film transistor TFT, a gate insulating layer GL, a first interlayer insulating layer ILD1, a capacitor electrode CPE, a second interlayer insulating layer ILD2, a first anode connection electrode ACN1, a first passivation layer PAS1, a second anode connection electrode ACN2, and a second passivation layer PAS2.

The first buffer layer BF1 may be disposed on the substrate SUB. The first buffer layer BF1 may include an inorganic layer capable of preventing penetration of air or moisture, For example, the first buffer layer BF1 may include a plurality of inorganic layers alternately stacked.

The light blocking layer BML may be disposed on the first buffer layer BF1. For example, the light blocking layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. As another example, the light blocking layer BML may be an organic layer including a black pigment.

The second buffer layer BF2 may be disposed on the first buffer layer BF1 and the light blocking layer BML. The light blocking layer BML may be sandwiched between the first and second buffer layers BF1 and BF2. The second buffer layer BF2 may include an inorganic layer capable of preventing penetration of air or moisture For example, the second buffer layer BF2 may include a plurality of inorganic layers alternately stacked.

The thin film transistor TFT may be disposed on the second buffer layer BF2, and may constitute a pixel circuit of each of a plurality of pixels. For example, the thin film transistor TFT may be a switching transistor or a driving transistor of the pixel circuit. The thin film transistor TFT may include a semiconductor region ACT, a source electrode SE, a drain electrode DE, and a gate electrode GE.

The semiconductor region ACT, the source electrode SE, and the drain electrode DE may be disposed on the second butler layer BF2. The semiconductor region ACT, the source electrode SE, and the drain electrode DE may overlap the light blocking layer BML in a thickness direction. The semiconductor region ACT may overlap the gate electrode GE in the thickness direction, and may be insulated from the gate electrode GE by the gate insulating layer GL. The source electrode SE and the drain electrode DE may be formed by making a material of the semiconductor region ACT conductive.

The gate electrode GE may be disposed on the gate insulating layer GL. The gate electrode GE may overlap the semiconductor region ACT with the gate insulating layer GI interposed therebetween.

The gate insulating layer GI may be disposed on the semiconductor region ACT, the source electrode SE, and the drain electrode DE. For example, the gate insulating layer GI may cover the semiconductor region ACT, the source electrode SE, the drain electrode DE, and the second buffer layer BF2, and may insulate the semiconductor region ACT from the gate electrode GE. The gate insulating layer GI may include a contact bole through which the first anode connection electrode ACN1 passes. The contact hole may expose a portion of the drain electrode DE.

The first interlayer insulating layer ILD1 may be disposed on the gate electrode GE and the gate insulating layer GI. The first interlayer insulating layer ILD1 may include a contact hole through which the first anode connection electrode ACN1 passes. The contact hole of the first interlayer insulating layer ILD1 may be connected to the contact hole of the gate insulating layer GI and the contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance. In this case, the capacitor electrode CPE and the gate electrode GE may correspond to two terminals of a capacitor.

The second interlayer insulating layer ILD2 may be disposed on the capacitor electrode CPE and the first interlayer insulating layer ILD1. The second interlayer insulating layer ILD2 may include a contact hole through which the first anode connection electrode ACN1 passes. The contact hole of the second inter layer insulating layer ILD2 may be connected to the contact hole of the first interlayer insulating layer ILD1 and the contact hole of the gate insulating layer GI.

The first anode connection electrode ACN1 may be disposed on the second interlayer insulating layer ILD2. The first anode connection electrode ACN1 may connect the drain electrode DE of the thin film transistor TFT to the second anode connection electrode ACN2. The first anode connection electrode ACN1 may be inserted into a contact hole provided in the second interlayer insulating layer ILD2, the contact hole provided in the first interlayer insulating layer ILD1, and the contact hole provided in the gate insulating layer GI to be in contact with the drain electrode DE of the thin film transistor TFT.

The first passivation layer PAS1 may be disposed on the first anode connection electrode ACN1 and the second interlayer insulating layer ILD2. The first passivation layer PAS1 may protect the thin film transistor TFT. The first passivation layer PAS1 may include a contact hole through which the second anode connection electrode ACN2 passes.

The second anode connection electrode ACN2 may be disposed on the first passivation layer PAS1. The second anode connection electrode ACN2 may connect the first anode connection electrode ACN1 to a pixel electrode AND of light emitting element LED. The second anode connection electrode ACN2 may be inserted into a contact hole provided in the first passivation layer PAS1 to be in contact with the first anode connection electrode ACN1.

The second passivation layer PAS2 may be disposed on the second anode connection electrode ACN2 and the first passivation layer PAS1. The second passivation layer PAS2 may include a contact hole through which the pixel electrode AND of the light emitting element LED passes.

The light emitting element layer EML may be disposed on the thin film transistor layer TFTL. The light emitting element layer EML may include the light emitting element LED and a pixel defining layer PDL. The light emitting element LED may include the pixel electrode AND, a light emitting layer EL, and a common electrode CAT.

The pixel electrode AND may be disposed on the second passivation layer PAS2. The pixel electrode AND may be disposed to overlap one of the first to third emission areas EA1, EA2, and EA3 defined by the pixel defining layer PDL. The pixel electrode AND may be connected to the drain electrode DE of the thin film transistor TFT through the first and second anode connection electrodes ACN1 and ACN2.

The light emitting layer EL may be disposed on the pixel electrode AND. For example, the light emitting layer EL may be an organic light emitting layer made of an organic material, but is not limited thereto. In the case of employing the organic light emitting layer as the light emitting layer EL, the thin film transistor TFT applies a predetermined voltage to the pixel electrode AND of the light emitting element LED, and if the common electrode CAT of the light emitting element LED receives a common voltage or a cathode voltage, holes and electrons can move to the light emitting layer EL through a hole transport layer and an electron transport layer and combine to produce light to be emitted by the light emitting layer EL.

The common electrode CAT may be arranged on the light emitting layer EL. For example, the common electrode CAT may be an electrode common to all of the pixels rather than individually specific to each of the pixels. The common electrode CAT may be disposed on the light emitting layer EL in the first to third emission areas EA1, EA2, and EA3, and may be disposed on the pixel defining layer PDL in an area other than the first to third emission areas EA1, EA2, and EA3. For example, the common electrode CAT may be disposed on the pixel defining layer PDL between the second and third emission areas EA2 and EA3.

The common electrode CAT may receive the common voltage or a low potential voltage. When the pixel electrode AND receives a voltage corresponding to the data voltage and the common electrode CAT receives the common voltage, a potential difference is formed between the pixel electrode AND and the common electrode CAT, so that the light emitting layer EL may emit light.

The pixel defining layer PDL may define the first to third emission areas EA1, EA2, and EA3. The pixel defining layer PDL may separate and insulate the pixel electrode AND of each of the plurality of light emitting elements ED.

The encapsulation layer TFEL may be disposed on the common electrode CAT to cover the plurality of light emitting elements LED. The encapsulation layer TFEL may include at least one inorganic layer to prevent oxygen or moisture from penetrating into the light emitting element layer EML. The encapsulation layer TFEL may include at least one organic layer to protect the light emitting element layer EML from foreign matters such as dust.

The touch sensing unit TSU may be disposed on the encapsulation layer TFEL. The touch sensing unit TSU may include a third buffer layer BF3, the bridge electrode CE, a first insulating layer SIL1, the driving electrode TE, the sensing electrode RE, and a second insulating layer SIL2.

The third buffer layer BF3 may be disposed on the encapsulation layer TFEL. The third buffer layer BF3 may have an insulating and optical function. The third buffer layer BF3 may include at least one inorganic layer. Optionally, the third buffer layer BF3 may be omitted.

The bridge electrode CE may be disposed on the third buffer layer BF3. The bridge electrode CE may be disposed on a different layer from the driving electrode TE and the sensing electrode RE, and may connect the adjacent driving electrodes TE in the Y-axis direction.

The first insulating layer SIL1 may be disposed on the bridge electrode CE and the third buffer layer BF3. The first insulating layer SIL1 may have an insulating and optical function. For example, the first insulating layer SIL1 may be an inorganic layer containing at least one of a silicon nitride layer, a silicon oxynitride layer, a silicon oxide layer, a titanium oxide layer, or an aluminum oxide layer.

The driving electrode TE and the sensing electrode RE may be disposed on the first insulating layer SIL1. Each of the driving electrode TE and the sensing electrode RE may not overlap the first to third emission areas EA1, EA2, and EA3. For example, each of the driving electrode TE and the sensing electrode RE may overlap the pixel defining layer FOIL Each of the driving electrode TE and the sensing electrode RE may be formed of a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The second insulating layer SIL2 may be disposed on the driving electrode TE, the sensing electrode RE, and the first insulating layer SIL1. The second insulating layer SIL2 may have an insulating and optical function. The second insulating layer SIL2 may be made of the material used in association with the first insulating layer SIL1.

Figure 9:
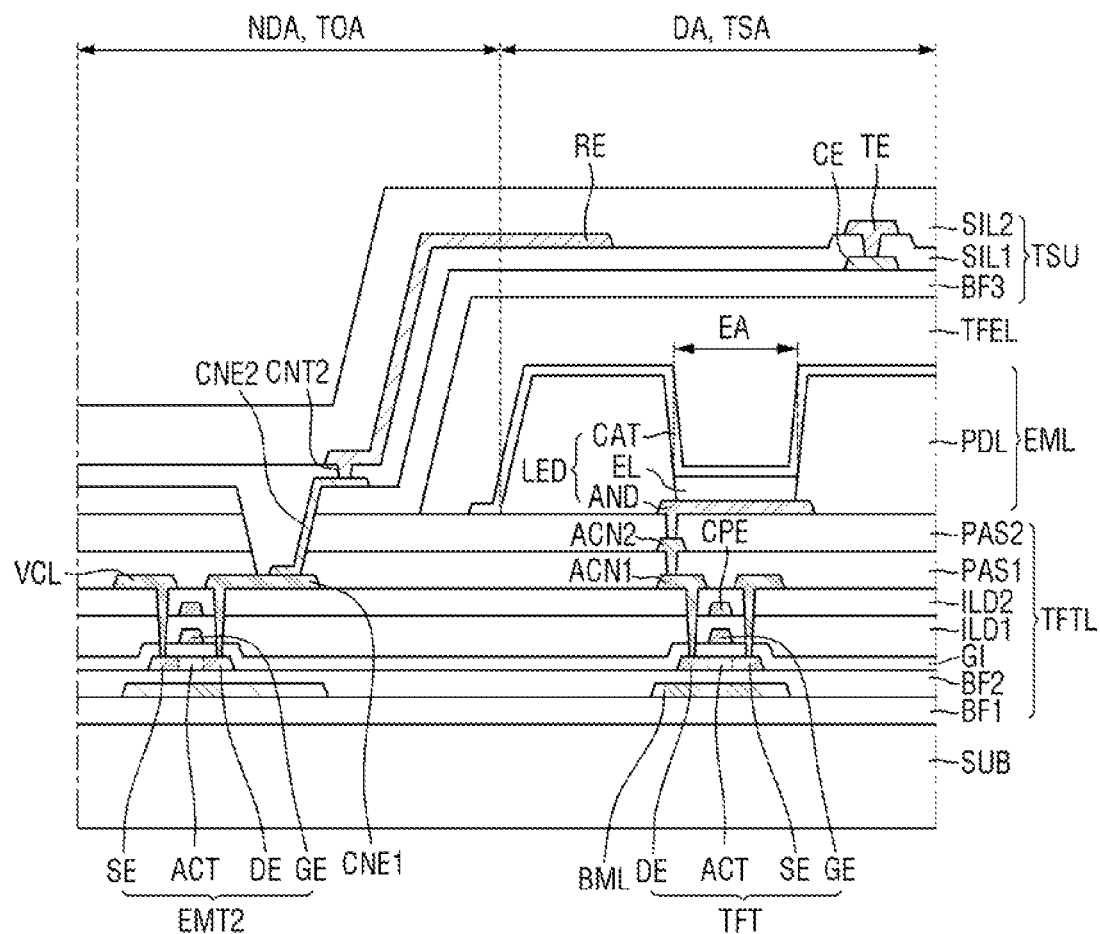
FIG. 9 is a cross-sectional view illustrating a display area and a non-display area in a display device according to an embodiment of the present disclosure.

FIG. 9 is a cross-sectional view illustrating a display area and a non-display area in a display device according to au embodiment of the present disclosure. The cross-sectional view of FIG. 9 further includes a non-display area in the cross-sectional view of FIG. 8, and the same configuration as the above-described configuration will be briefly described or omitted.

Referring to FIG. 9, the non-display au NDA and the touch peripheral area TOA may include the plurality of switching transistors EMT and the common voltage line VCL. The plurality of switching transistors EMT may include a first switching transistor EMT1 and a second switching transistor EMT2. FIG. 9 illustrates an example of the second switching transistor EMT2, but the first switching transistor EMT1 may also be formed in the same manner as the second switching transistor EMT2.

The second switching transistor EMT2 may be disposed on the second buffer layer BF2 and may be connected between the sensing electrodes RE and the common voltage line VCL. The second switching transistor EMT2 may be disposed on the same layer as the thin film transistor TFT of the display unit DU. The second switching transistor EMT2 may include the semiconductor region ACT, the drain electrode DE, the source electrode SE, and the gate electrode GE.

The semiconductor region ACT, the drain electrode DE, and the source electrode SE may be arranged on the second buffer layer BF2. The semiconductor region ACT, the drain electrode DE, and the source electrode SE may overlap the light blocking layer BML in a thickness direction. The semiconductor region ACT may overlap the gate electrode GE in the thickness direction, and may be insulated from the gate electrode GE by the gate insulating layer GI. The drain electrode DE and the source electrode SE may be formed by making a material of the semiconductor region ACT conductive.

The gate electrode GE may be disposed on the gate insulating layer GI. The gate electrode GE may overlap the semiconductor region ACT with the gate insulating layer GI interposed therebetween.

A first connection electrode CNE1 may be disposed on the second interlayer insulating layer ILD2. The first connection electrode CNE1 may be disposed on the same layer as the first anode connection electrode ACN1 and the common voltage line VCL. The first connection electrode CNE1 may connect the drain electrode DE of the second switching transistor EMT2 to a second connection electrode CNE2. The first connection electrode CNE1 may be inserted into a contact hole provided in the second interlayer insulating layer ILD2, the first interlayer insulating layer ILD1, and the gate insulating layer GI to be in contact with the drain electrode DE of the second switching transistor EMT2.

The second connection electrode CNE2 may be disposed on a first metal layer YML1 of the touch sensing unit TSU. The first metal layer YML1 may include the bride electrode CE and the second connection electrode CNE2. The second connection electrode CNE2 may be inserted into a contact hole provided in the third buffer layer BF3, the second protection layer PAS2, and the first passivation layer PAS1 to be in contact with the first connection electrode CNE1.

The driving electrode TE and the sensing electrode RE may be disposed on a second metal layer YML2 of the touch sensing unit TSU. The sensing electrode RE disposed on the left side of the touch sensor area TSA may extend to the touch peripheral area TOA, and may be inserted into a second contact hole CNT2 provided in the first insulating layer SIL1 to be in contact with the second connection electrode CNE2. Accordingly, the sensing electrode RE may be electrically connected to the drain electrode DE of the second switching transistor EMT2 through the first and second connection electrodes CNE1 and CNE2.

The common voltage line VCL may be disposed on the second interlayer insulating layer ILD2. The common voltage line VCL may be disposed on the same layer as the first connection electrode CNE1 and the first anode connection electrode ACN1. The common voltage line VCL may extend to the first touch pad unit TP1 via the outer edge of the touch peripheral area TOA. The common voltage line VCL may supply a common voltage to the sensing electrode RE through the second switching transistor EMT2 turned on during the electromagnetic sensing period. Here, the common voltage of the common voltage line VCL may be the same as the common voltage supplied to the common electrode CAT of the display unit DU, but is not limited thereto.

As another example, the common voltage line VCL may be disposed on the first metal layer YML1 or the second metal layer YML2 of the touch sensing unit TSU. In this case, the common voltage line VCL may be electrically connected to the source electrode SE of the second switching transistor EMT2 through at least one connection electrode.

Figure 10:
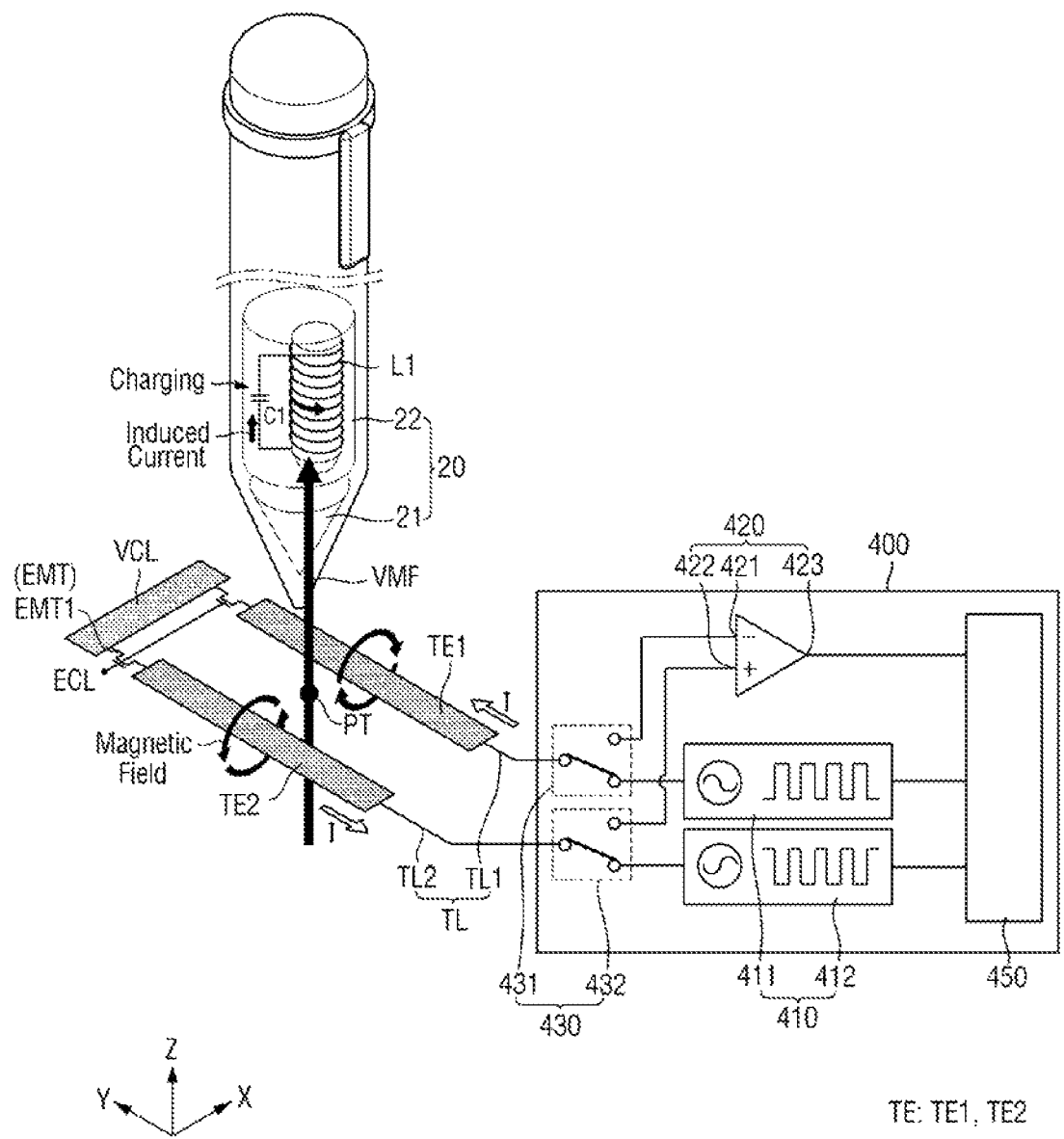
FIG. 10 is a view illustrating a sensing driving process and the charging of an input member in a sensing system according to an embodiment of the present disclosure.
Figure 11:
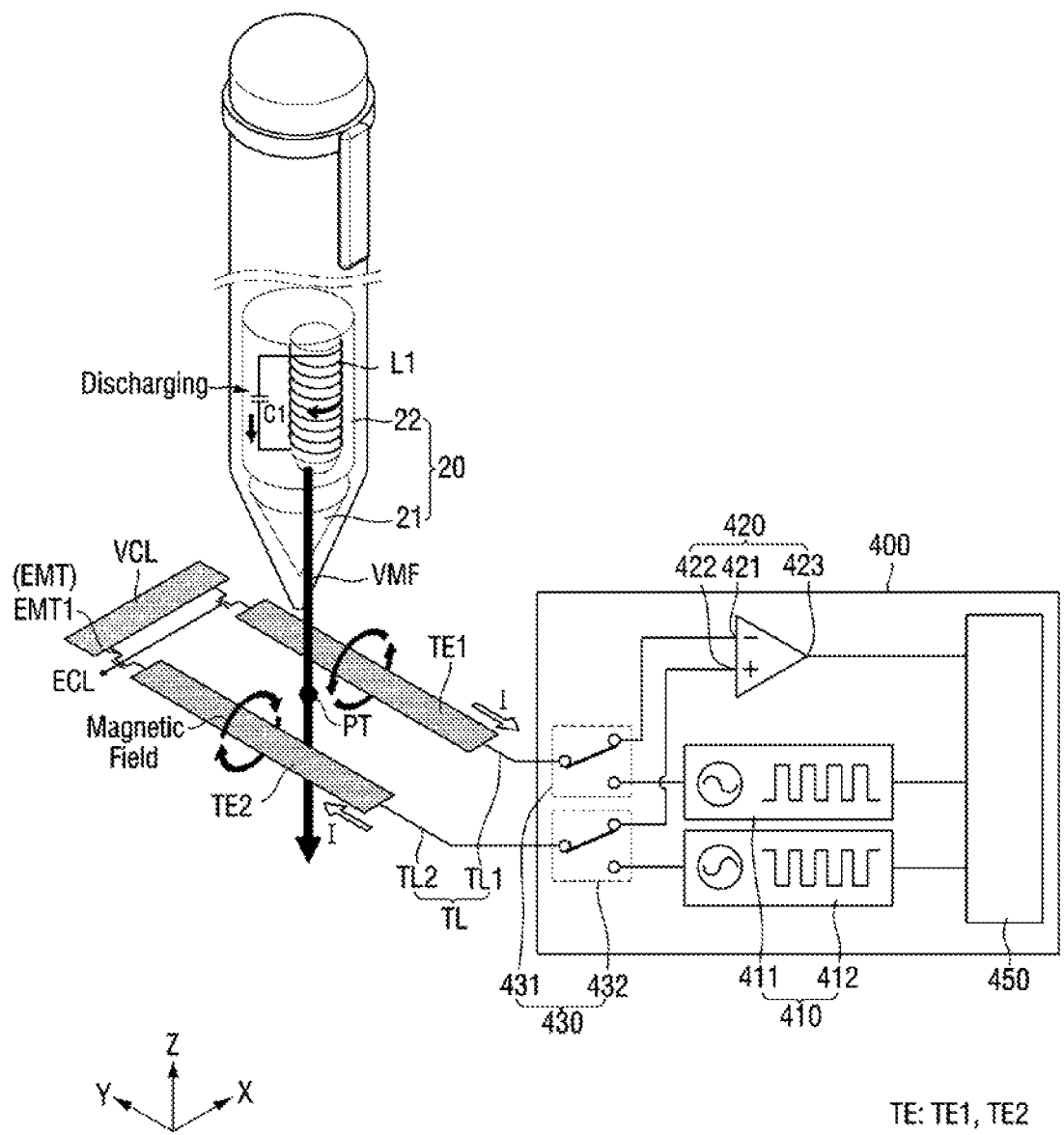
FIG. 11 is a view illustrating the discharging of an input member and the input sensing process in the sensing system according to an embodiment of the present disclosure.
Figure 12:
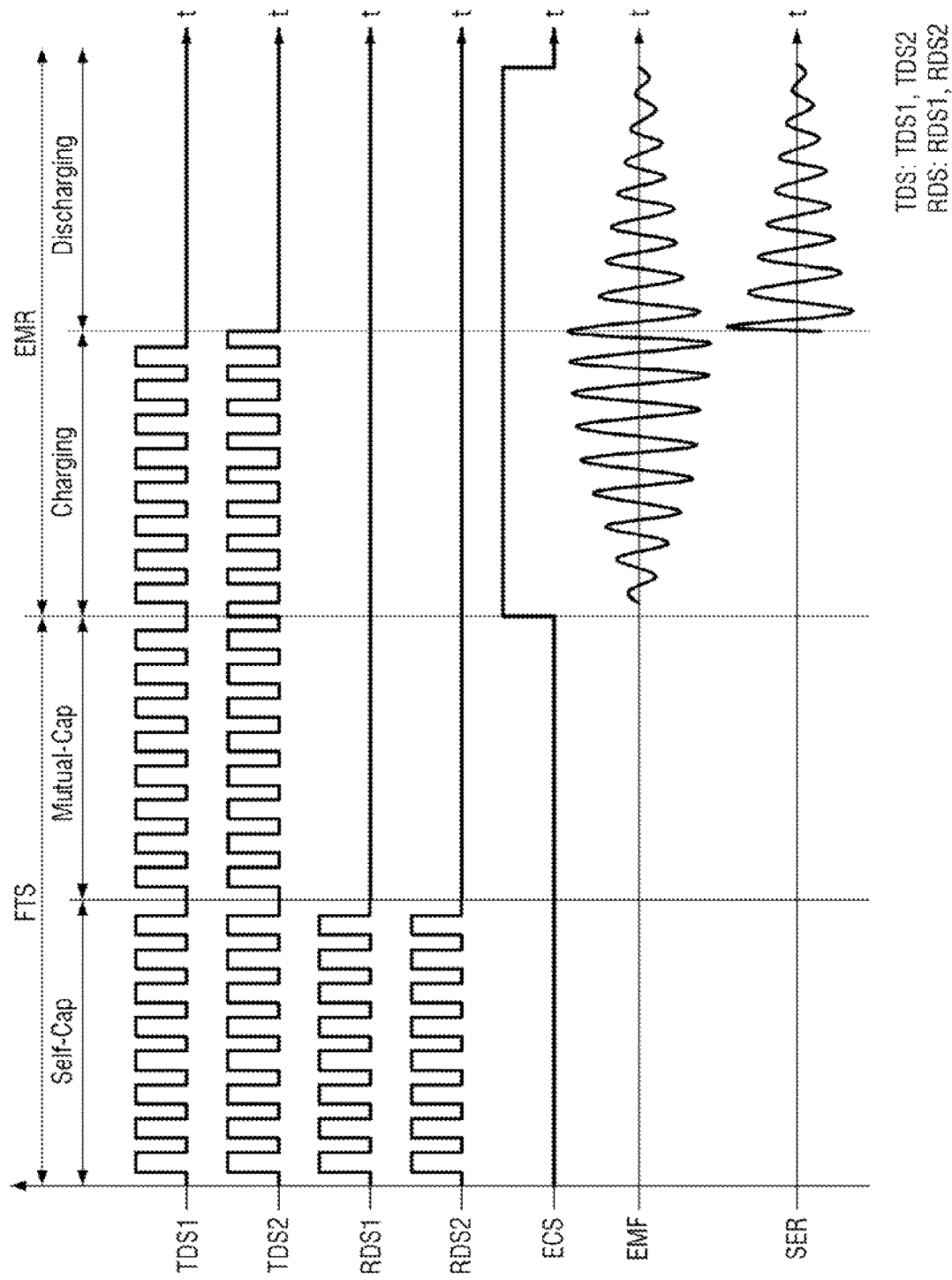
FIG. 12 is a waveform diagram illustrating a plurality of first driving signals, a plurality of second driving signals, a control signal, an electromotive force of an input member, and a differential sensing signal in a sensing system according to an embodiment of the present disclosure.

FIG. 10 is a view illustrating a sensing driving process and the charging of an input member in a sensing system according to an embodiment of the present disclosure, and FIG. 11 is a view illustrating the discharging of an input member and the input sensing process in the sensing system according to an embodiment of the present disclosure. FIG. 12 is a waveform diagram illustrating a plurality of first driving signals, a plurality of second driving signals, a control signal, an electromotive force of an input member, and a differential sensing signal in a sensing system according to an embodiment of the present disclosure.

Referring to FIGS. 10 to 12, the sensing system may include the display device 10 and the input member 20. The display device 10 may include the display panel 100, the display driver 200, the circuit board 300, and the touch driver 400.

The touch driver 400 may include a driving signal supply unit 410, a sensing signal receiving unit 420, a switching unit 430, and a control unit 450.

The driving signal supply unit 410 may be electrically connected to the plurality of driving electrodes TE through the switching unit 430 and the driving line TL. The driving signal supply unit 410 may supply a first driving signal TDS to the plurality of driving electrodes TE during the charging period of the electromagnetic sensing period EMR. For example, the driving signal supply unit 410 may supply a first driving signal TDS to some of the plurality of driving electrodes TE. As another example, the driving signal supply unit 410 may sequentially supply the first driving signal TDS to the plurality of driving electrodes TE. The first driving signal TDS may be a signal having a plurality of driving pulses. The first driving signal TDS may be a sine wave, a pulse wave, or a ramp wave having a predetermined frequency, but is not limited thereto. The frequency of the first driving signal TDS may correspond to a resonant frequency of the input member 20. For example, the frequency of the first driving signal TDS may be the same as a resonant frequency of a resonant circuit unit 22 of the input member 20, but is not limited thereto. The touch driver 400 may sense the touch of the input member 20 by receiving a signal of a specific frequency by the touch of the input member 20.

The driving signal supply unit 410 may include a first driving signal output module 411 and a second driving signal output module 412. The first driving signal output module 411 may supply a first-first driving signal TDS1 haying a first phase to a first driving electrode TE1. through a first driving line TL1 during the charging period of the electromagnetic sensing period EMR. The first driving electrode TE1 may be a driving electrode disposed to one side of a specific point PT among the plurality of driving electrodes TE. The second driving signal output module 412 may supply a first-second driving signal TDS2 having a second phase opposite to the first phase to a second driving electrode TE2 through a second driving line TL2 during the charging period of the electromagnetic sensing period EMR. A difference between the first phase and the second phase may be 180 degrees. The second driving electrode TE2 may be a driving electrode disposed to the other side of the specific point PT among the plurality of driving electrodes TE. For example, the second driving electrode TE2 may be disposed adjacent to the first driving electrode TE1. As another example, the second driving electrode TE2 may be spaced apart from the first driving electrode TE1 with at least one driving electrode TE interposed therebetween.

For example, when the first driving electrode TE1 receives the first-first driving signal TDS1 having the first phase, a current I may flow in the Y-axis direction and a magnetic field may be generated clockwise with respect to the Y-axis direction. When the second driving electrode TE2 receives the first-second driving signal TDS2 having the second phase opposite to the first phase, a current I may flow in a direction opposite to the Y-axis direction, and a magnetic field may be generated counterclockwise with respect to the Y-axis direction. Accordingly, the directions of the magnetic fields of the first driving electrode TE1 and the second driving electrode TE2 may coincide at the specific point PT, and thus, according to constructive interference of the magnetic fields, a magnetic field VMF may be generated in the third direction (Z-axis direction).

The input member 20 may be a stylus pen that supports an electromagnetic resonance method by using the driving electrode TE or the sensing electrode RE. The input member 20 may output a radio frequency signal in response to a magnetic field or electromagnetic signal of the touch sensing unit TSU.

The input member 20 may include a conductive tip 21 and the resonant circuit unit 22. The conductive tip 21 may be disposed on one end of the input member 20. The conductive tip 21 may form a capacitance with at least one of the plurality of touch electrodes SEN when the input member 20 touches the touch sensing unit TSU. The conductive tip 21 may be a dielectric including a metal material or conductive rubber, but is not limited thereto.

The resonant circuit unit 22 may include a coil L1 and a capacitor C1. The coil L1 may receive the magnetic field VMF formed in the third direction (Z-axis direction) induced by the touch sensing unit TSU to generate an induced current, The induced current flowing through the resonant circuit unit 22 may charge the capacitor C1. For example, an LC resonant frequency of the input member 20 may be determined based on the capacitance of the capacitor C1 and the inductance of the coil L1.

The input member 20 may be charged during the charging period of the electromagnetic sensing period EMR. When the input member 20 is adjacent to or in contact with the specific point PT, the input member 20 may receive the magnetic field VMF formed in the third direction (Z-axis direction) induced from the current I flowing through the first and second driving electrodes TE1 and TE2 during the charging period of the electromagnetic sensing period EMR. The coil L1 of the input member 20 may generate an induced current, and the induced current may charge the capacitor C1. Accordingly, the electromotive force EMF of the capacitor C1 may increase during the charging period of the electromagnetic sensing period EMR.

The input member 20 may be discharged during the discharging period of the electromagnetic sensing period EMR. When the input member 20 is adjacent to or in contact with the specific point PT, if the supply of the magnetic field VMF formed in the third direction (Z-axis direction) is stopped by the interruption of the supply of the first-first and first-second driving signals TDS1 and TDS2, the capacitor C1 may be discharged. Accordingly, a current may flow in the coil L1 in a direction opposite to that of the induced current, and the coil L1 may generate the magnetic field VMF passing through the specific point PT in a direction opposite to the third direction (Z-axis direction). The electromotive force EMF of the capacitor C1 may decrease during the discharging period of the electromagnetic sensing period EMR.

For example, when the magnetic field VMF passes through the specific point PT in a direction opposite to the third direction (Z-axis direction), a magnetic field may be generated counterclockwise with respect to the Y-axis direction around the first driving electrode TE1, and the current I of the first driving electrode TE1 may flow in a direction opposite to the Y-axis direction. Accordingly, the first driving electrode TE1 may provide a first sensing signal having a first phase to the touch driver 400. When the magnetic field VMF passes through the specific point PT in a direction opposite to the third direction (Z-axis direction), a magnetic field may be generated clockwise with respect to the Y-axis direction around the second driving electrode TE2, and the current I of the second driving electrode TE2 may flow in the Y-axis direction. Accordingly, the second driving electrode TE2 may provide a second sensing signal having a second phase opposite to the first phase to the touch driver 400.

The sensing signal receiving unit 420 may be connected to the plurality of driving, electrodes TE through the switching unit 430 and the driving line TL. The sensing signal receiving unit 420 may receive sensing signals of the plurality of driving electrodes TE through the driving line TL during the discharging period of the electromagnetic sensing period EMR. The sensing signal receiving unit 420 may be a differential amplifier. The sensing signal receiving unit 420 may differentially amplify the plurality of sensing signals to output a differential sensing signal SER. Here, differential amplification refers to amplifying a voltage difference between two input signals. Accordingly, the sensing signal receiving unit 420 may amplify a voltage difference between the plurality of sensing signals to output the differential sensing signal SER.

The sensing signal receiving unit 420 may include a first input terminal 421, a second input terminal 422, and an output terminal 423. When the input member 20 is adjacent to or in contact with the specific point PT, the first input terminal 421 may receive the first sensing signal having the first phase from the first driving electrode TE1 through the first driving line TL1, and the second input terminal 422 may receive the second sensing signal having the second phase opposite to the first phase from the second driving electrode TE2 through the second driving line TL2. The sensing signal receiving unit 420 may amplify a difference between the first and second sensing signals to output the differential sensing signal SER through the output terminal 423. The sensing signal receiving unit 420 may cancel (e.g., remove) noise included in the first and second sensing signals, and may amplify a difference between the first and second sensing signals to improve touch sensitivity.

The switching unit 430 may selectively connect the driving line TL to one of the driving signal supply unit 410 and the sensing signal receiving unit 420. The switching unit 430 may connect the driving signal supply unit 410 to the driving line TL during the charging period of the input member 20. The switching unit 430 may connect the sensing signal receiving unit 420 to the driving line TL during the discharging period of the input member 20. For example, the switching unit 430 may periodically connect each of the driving signal supply unit 410 and the sensing signal receiving unit 420 to the driving line TL. As another example, the switching unit 430 may connect each of the driving signal supply unit 410 and the sensing signal receiving unit 420 to the driving line TL based on a switching control signal of the control unit 450.

The switching unit 430 may include a first switching unit 431 and a second switching unit 432. The first switching unit 431 may connect the first driving signal output module 411 to the first driving line TL1 during the charging period of the electromagnetic sensing period EMR. The first driving signal output module 411 may supply the first-first driving signal TDS1 to the first driving electrode TE1 during the charging period of the electromagnetic sensing period EMR.

The first switching unit 431 may connect the first input terminal 421 of the sensing signal receiving unit 420 to the first driving line TL1 during the discharging period of the electromagnetic sensing period EMR. The first input terminal 421 may receive the first sensing signal from the first driving electrode TE1 during the discharging period of the electromagnetic sensing period EMR.

The second switching unit 432 may connect the second driving signal output module 412 to the second driving line TL2 during the charging period of the electromagnetic sensing period EMR. The second driving signal output module 412 may supply the first-second driving signal TDS2 to the second driving electrode TE2 during the charging period of the electromagnetic sensing period EMR.

The second switching unit 432 may connect the second input terminal 422 of the sensing signal receiving unit 420 to the second driving line TL2 during the discharging period of the electromagnetic sensing period EMR. The second input terminal 422 may receive the second sensing signal from the second driving electrode TE2 during the discharging period of the electromagnetic sensing period EMR.

The control unit 450 may control the operation of the driving signal supply unit 410, the sensing signal receiving unit 420, and the switching unit 430. The control unit 450 may control the operation timing of the driving signal supply unit 410, the sensing signal receiving unit 420, and the switching unit 430 during the charging period and the discharging period of the electromagnetic sensing period EMR. For example, the controller 450 may receive the differential sensing signal SER and determine whether the input of the input member 20 has been made at the specific point PT. As another example, the control unit 450 may receive a plurality of differential sensing signals SER to determine the input coordinates of the input member 20. When the frequency of the differential sensing signal SER corresponds to a preset frequency band, the control unit 450 may determine that the input member 20 has been touched, but the present disclosure is not limited thereto.

Accordingly, the touch driver 400 may supply the first-first and first-second driving signals TDS1 and TDS2 having opposite phases to the first and second driving electrodes TE1 and TE2 disposed to both sides of the specific point PT, respectively, to generate the magnetic field VMF in the third direction (Z-axis direction) by constructive interference of magnetic fields, thereby charging the input member 20. The touch driver 400 may differentially amplify the first and second sensing signals induced based on the magnetic field VMF in an opposite direction of the third direction (Z-axis direction) according to the discharge of the input member 20 to output the differential sensing signal SER and may determine whether the input of the input member 20 has been made.

Each of the first and second driving electrodes TE1 and TE2 may be connected to the common voltage line VCL through the first switching transistor EMT1 during the electromagnetic sensing period EMR. The electromagnetic control line ECL may supply a control signal ECS of the gate-on level to a plurality of first switching transistors EMT1 during the electromagnetic sensing period EMR. For example, one end of the driving electrodes TE connected to the driving line TL may correspond to the driving electrode TE disposed on the lower side of the touch sensor area TSA in FIG. 5, and the other end of the driving electrode TE connected to the first switching transistor EMT1 may correspond to the driving electrode TE disposed on the upper side of the touch sensor area TSA in FIG. 5. The common voltage line VCL may supply a common voltage to the other end of the driving electrodes TE disposed farthest from the driving line TL or the touch driver 400, so that the potential of the other end of the driving electrodes TE may be stably maintained. Accordingly, the common voltage line VCL may supply a common voltage to the other end of the driving electrodes TE, so that the sensing sensitivity at the other end of the driving electrodes TE may be improved. The display device 10 may include the switching transistor EMT and the common voltage line VCL disposed in the touch peripheral area TOA, so that the reliability of the sensor may be secured over the entire area of the touch sensor area TSA.

FIGS. 10 to 12 illustrate the process of sensing the touch of the input member 20 using the plurality of driving electrodes TE, but the display device 10 may supply the second driving signal RDS to the plurality of sensing electrodes RE in the same manner to sense the touch of the input member 20.

The touch driver 400 may sense the input of the user's body dining the first period and sense the input of the input member 20 during the second period. For example, the first period may be a touch sensing period FTS, and the second period may be an electromagnetic sensing period EMR.

The touch driver 400, during the self-capacitance sensing period Self-Cap of the touch sensing period FTS, may supply the plurality of first driving signals TDS to the plurality of driving electrodes TE, and may supply the plurality of second driving signals RDS to the plurality of sensing electrodes RE. The touch driver 400 may sense an amount of change of the self-capacitance of each of the plurality of driving electrodes TE and the plurality of sensing electrodes RE by receiving the sensing signal from each of the plurality of driving electrodes TE and the plurality of sensing electrodes RE during the self-capacitance sensing period Self-Cap of the touch sensing period FTS.

The touch driver 400 may supply the plurality of first driving signals TDS to the plurality of driving electrodes TE during the mutual capacitance sensing period Mutual-Cap of the touch sensing period FTS. The touch driver 400 may sense an amount of change of the mutual capacitance between the plurality of driving electrodes TE and the plurality of sensing electrodes RE by receiving the sensing signal from the plurality of sensing electrodes RE during the mutual capacitance sensing period Mutual-Cap of the touch sensing period FTS.

The electromagnetic control line ECL may supply the control signal ECS of the gate-off level to the plurality of switching transistors EMT during the touch sensing period FTS. Accordingly, the plurality of switching transistors EMT may be turned off during the touch sensing period FTS.

The display device 10 may sense the touch of the input member 20 by using the touch sensing unit TSU that senses the touch of the user's body. The display device 10 may sense a touch of the user's body during the touch sensing period FTS using the touch sensing unit TSU, and may sense the approach or contact of the input member 20 such as an input pen during, the electromagnetic sensing, period EMR. Accordingly, the display device 10 may not include a separate sensor layer or a digitizer layer for the electromagnetic resonance of the input member 20, so that the thickness of the display device 10 may be decreased, and the costs may be reduced.

Figure 13:
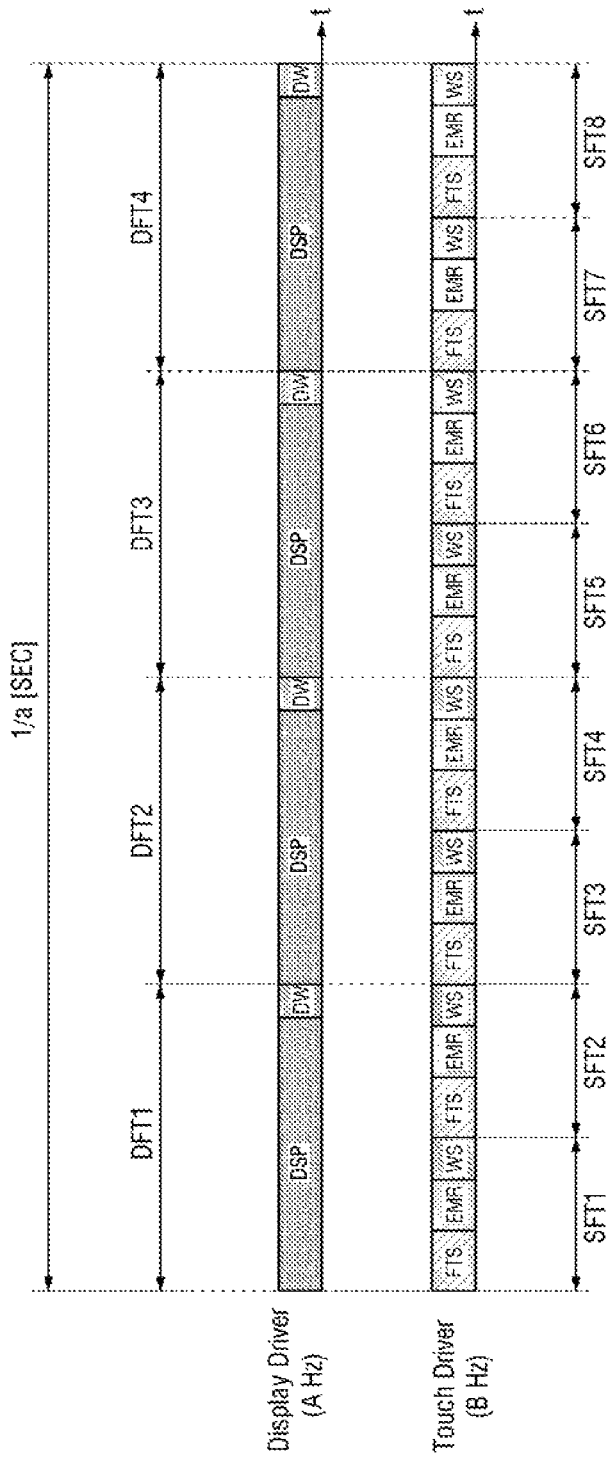
FIG. 13 is a timing diagram illustrating the operation of a display driver and a touch driver in a display device according to an embodiment of the present disclosure.

FIG. 13 is a timing diagram illustrating the operation of a display driver and a touch driver in a display device according to an embodiment of the present disclosure.

Referring to FIG. 13, the display driver 200 may drive the display unit DU at a driving frequency of A Hz (A being a positive integer). In a plurality of display frame periods DFT1, DFT2, DFT3, and DFT4, the display driver 200 may supply a gate signal and a data voltage to the plurality of pixels during a display period DSP, and may stop the supply of the gate signal and the data voltage during a display standby period DW. Each of first, second, third and fourth display frame periods DFT1, DFT2, DFT3, and, DFT4 may correspond to 1/a sec (a being a positive integer). For example, the display driver 200 may sequentially supply a gate signal to the pixels arranged along, a plurality of rows during the display period DSP in the first display frame period DFT1, and the plurality of pixels may display images in an order selected by the gate signal. The display driver 200 may not supply the gate signal and the data voltage to the plurality of pixels during the display standby period DW in the first display frame period DFT1, and voltages in the plurality of pixels may be initialized.

The touch driver 400 may be synchronized with the display driver 200 to drive the touch sensing unit TSU. The touch driver 400 may receive a timing control signal from a main processor or a main controller, and may be synchronized with the display driver 200. For example, the touch driver 400 may drive the touch sensing unit TSU at a driving frequency of N times (N being a positive integer) the driving frequency of the display driver 200 but is not limited thereto.

The touch driver 400 may drive the touch sensing unit TSU at a driving frequency of B Hz (B being a positive integer). The touch driver 400 may drive the touch sensing unit TSU during a plurality of touch frame periods SFT1, SFT2, SFT3, SFT4, SFT5, SFT6, SFT7 and SFT8 determined by the driving frequency. The touch driver 400 may sense the touch of the user's body during a touch sensing period. FTS in a first touch frame period SFT1, may sense the touch of the input member 20 during the electromagnetic sensing period EMR in the first touch frame period SFT1, and may stop the supply of the drinking signal during a touch standby period WS in the first touch frame period SFT1. This may be repeated in each of the second to eighth frame periods SFT1 to SFT8.

Referring to FIG. 13 in conjunction with FIG. 12, the touch driver 400, during the self-capacitance sensing period Self-Cap of the touch sensing period FTS, may supply the plurality of first driving signals TDS to the plurality of driving electrodes TE, and may supply the plurality of second driving signals RDS to the plurality of sensing electrodes RE. The touch driver 400 may sense an amount of change of the self-capacitance of each of the plurality of driving electrodes TE and the plurality of sensing electrodes RE by receiving the sensing signal from each of the plurality of driving electrodes TE and the plurality of sensing electrodes RE during the self-capacitance sensing period Self-Cap of the touch sensing period FTS.

The touch driver 400 may supply the plurality of first driving signals IDS to the plurality of driving electrodes TE during the mutual capacitance sensing period Mutual-Cap of the touch sensing period FTS. The touch driver 400 may sense an amount of change of the mutual capacitance between the plurality of driving electrodes TE and the plurality of sensing electrodes RE by receiving the sensing signal from the plurality of sensing electrodes RE during the mutual capacitance sensing period Mutual-Cap of the touch sensing period FTS.

The touch driver 400 may supply the first-first and first-second driving signals TDS1 and TDS2 and receive the first and second sensing signals during the electromagnetic sensing period EMR to determine whether the input of the input member 20 has been made. Accordingly, the touch driver 400 may sense both the input of the user's body and the input of the input member 20 during the first touch frame period SFT1.

The touch driver 400 may sequentially perform the touch sensing period FTS, the electromagnetic sensing period EMR, and the touch standby period WS during the first touch frame period SFT1, but the order of the touch method is not limited thereto. The length of the touch sensing period FTS may be greater than the length of the electromagnetic sensing period EMR, but the present disclosure is not limited thereto.

Figure 14:
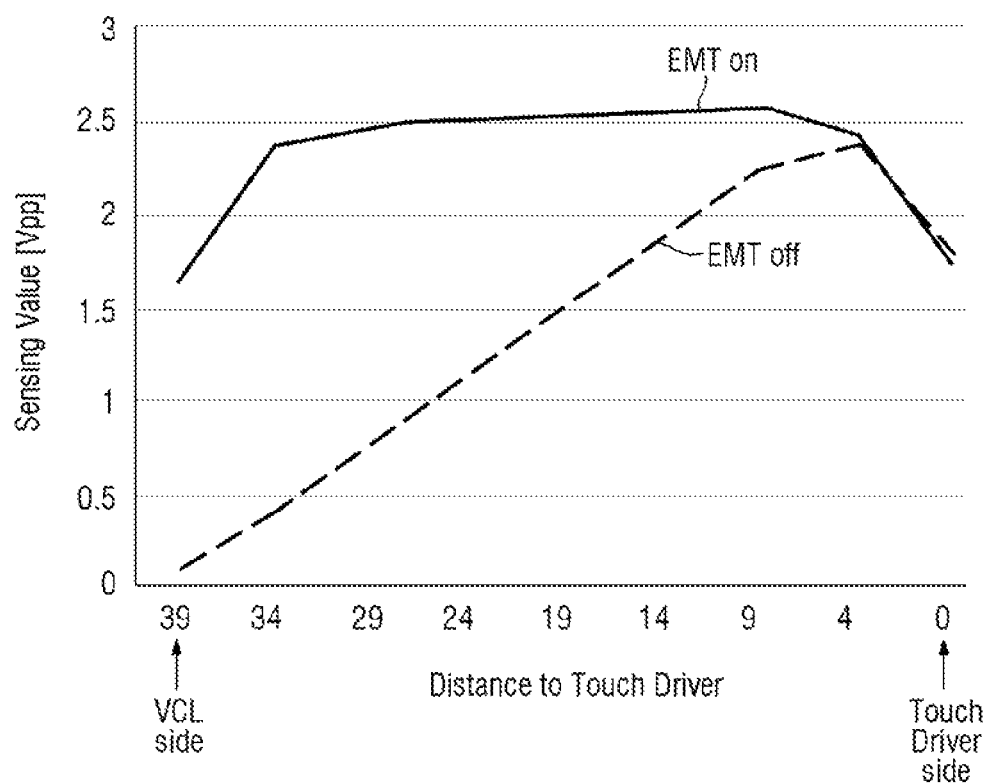
FIG. 14 is a graph illustrating the sensing sensitivity of a sensing system according to an embodiment of the present disclosure.

FIG. 14 is a graph illustrating the sensing sensitivity of a sensing system according to an embodiment of the present disclosure.

Referring to FIG. 14, when the plurality of switching transistors EMT are turned off (EMT off) during the electromagnetic sensing period EMR, the common voltage line VCL may not supply a common voltage to the driving electrodes TE and the sensing electrodes RE during the electromagnetic sensing period EMR. In this case, a sensing value by the touch electrodes SEN adjacent to the touch driver 400 may be relatively high (touch driver side), and a sensing value by the touch electrodes SEN spaced far apart from the touch driver 400 may be relatively low (VCL side). Accordingly, when the plurality of switching transistors EMT are turned off (EMT off) during the electromagnetic sensing period EMR, a difference in sensing sensitivity may occur according to the position of the touch electrodes SEN. The configuration in which the plurality of switching transistors EMT are turned off during the electromagnetic sensing period EMR (EMT off) may correspond to the configuration in which the touch sensing unit TSU does not include the plurality of switching transistors EMT and the common voltage line VCL.

When the plurality of switching transistors EMT are turned on (EMT on) during the electromagnetic sensing period EMR, the common voltage line VCL may supply a common voltage to the driving electrodes TE and the sensing electrodes RE during the electromagnetic sensing period EMR. In this case, a value sensed by the touch electrodes SEN spaced far apart from the touch driver 400 may be relatively increased (VCL side). Accordingly, when the plurality of switching transistors EMT are turned on (EMT on) during the electromagnetic sensing period EMR, the sensing sensitivity by the touch electrodes SEN adjacent to the common voltage line VCL (VCL side) may be improved. The display device 10 may include the switching transistor EMT and the common voltage line VCL disposed in the touch peripheral area TOA, so that the reliability of the sensor may be secured over the entire area of the touch sensor area TSA.

Figure 15:
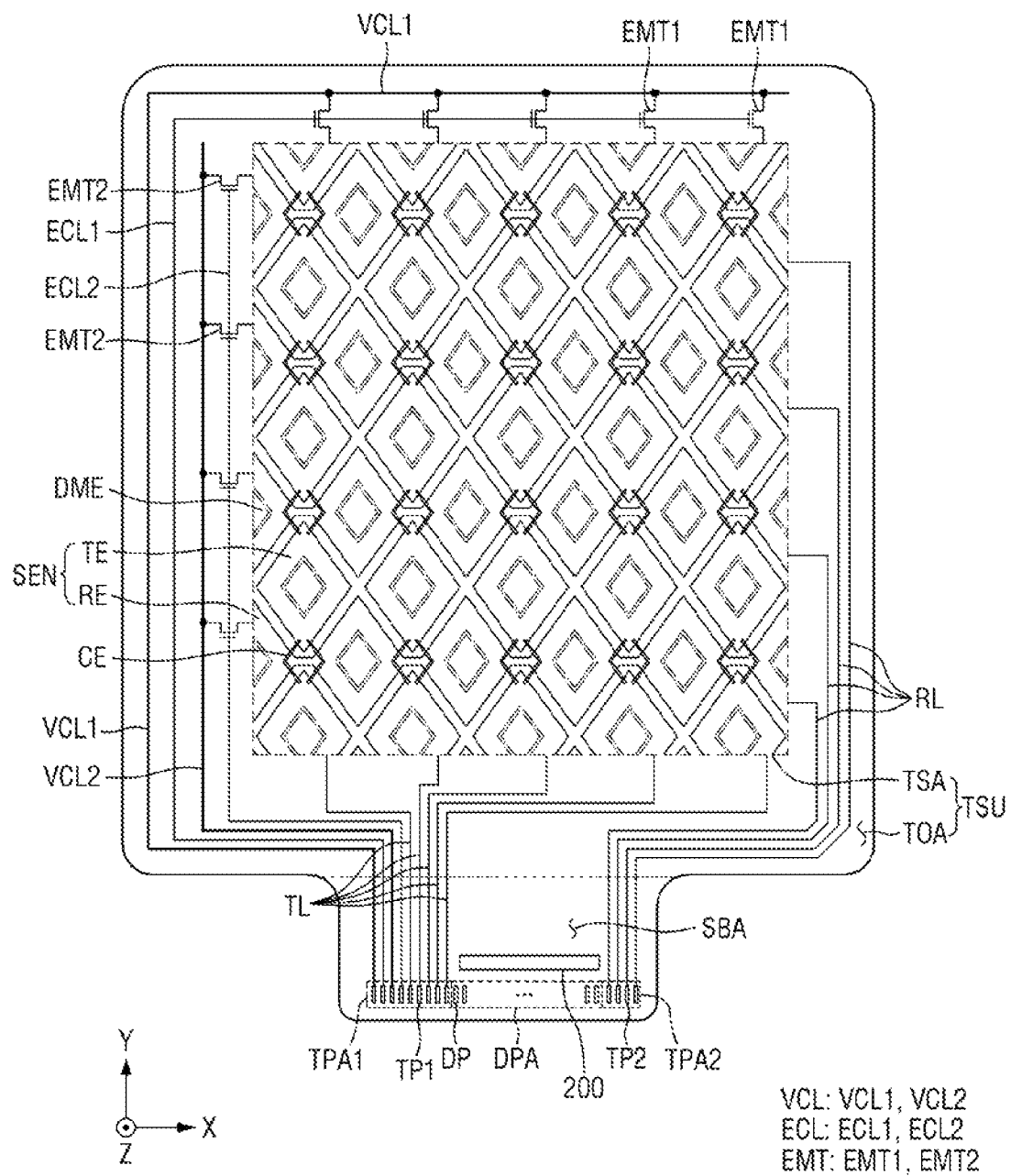
FIG. 15 is a plan view illustrating a touch sensing unit of a display device according to an embodiment of the present disclosure.
Figure 16:
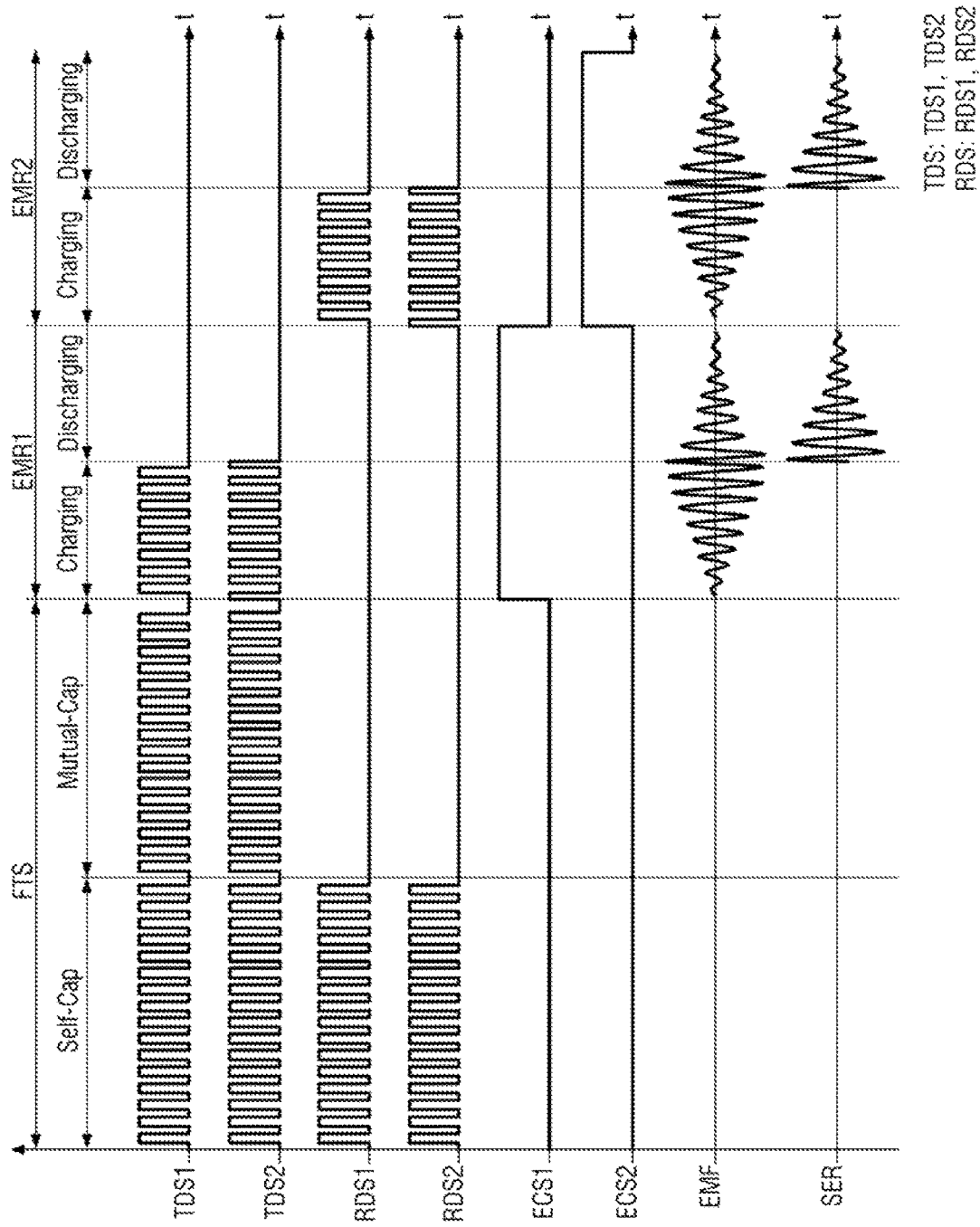
FIG. 16 is a waveform diagram illustrating a plurality of first driving signals, a plurality of second driving signals, a first control signal, a second control signal, an electromotive force of an input member, and a differential sensing signal in a sensing system according to an embodiment of the present disclosure.

FIG. 15 is a plan view illustrating a touch sensing unit of a display device according to an embodiment of the present disclosure, and FIG. 16 is a waveform diagram illustrating a plurality of first driving signals, a plurality of second driving signals, a first control signal, a second control signal, an electromotive force of an input member, and a differential sensing signal in a sensing system according to an embodiment of the present disclosure. The touch sensing unit TSU of FIG. 15 has a different configuration of the common voltage line VCL and the electromagnetic control line in the touch sensing unit TSU of FIG. 5, and the same configuration as the above-described configuration for FIG. 5 will be briefly described or omitted.

Referring to FIGS. 15 and 16, the touch sensor area TSA may include the plurality of touch electrodes SEN and the plurality of dummy electrodes DME, The plurality of touch electrodes SEN may include a plurality of driving electrodes TE and a plurality of sensing electrodes RE.

The touch peripheral area TOA may include the driving line TL, the sensing line RL, the plurality of switching transistors EMT, the electromagnetic control line ECL, and the common voltage line VCL.

The switching transistor EMT may be a switching element connected between the plurality of touch electrodes SEN and the common voltage line VCL. The plurality of switching transistors EMT may include a first switching transistor EMT1 and a second switching transistor EMT2. The first switching transistor EMT1 may be disposed on the upper side of the touch peripheral area TOA, The first switching transistor EMT1 may be disposed on the opposite side of the driving line TL. The first switching transistor EMT1 may be connected to the driving electrodes TE disposed fluffiest from the driving line TL. The first switching transistor EMT1 may be disposed between the driving electrodes TE and the first common voltage line VCL1 disposed on the upper side of the touch sensor area TSA. The first switching transistor EMT1 may be turned on based on a first control signal ECS1 of a first electromagnetic control line ECL1. In other words, the first switching transistor EMT1 may be turned on in response to the first control signal ECS1. The first electromagnetic control line ECL1 may supply the first control signal ECS1 of the gate-on level to the plurality of first switching. transistors EMT1 during a first electromagnetic sensing period EMR1. The first switching transistor EMT1 may be turned off during the touch sensing period FTS and a second electromagnetic sensing period EMR2, and the driving electrodes TE may not receive a common voltage. The first switching transistor EMT1 may be turned on during the first electromagnetic sensing period EMR1 to supply a common voltage to the driving electrodes TE.

The second switching transistor EMT2 may be disposed on the left side of the touch peripheral area TOA. In the alternative, the second switching transistor EMT2 may be disposed on the right side of the touch peripheral area TOA when the sensing line RL is disposed on the left side of the touch peripheral area TOA, The second switching transistor EMT2 may be disposed on the opposite side of the sensing line RL. The second switching transistor EMT2 may be connected to the sensing electrodes RE disposed farthest from the sensing line RL. The second switching transistor EMT2 may be disposed between the sensing electrodes RE and a second common voltage line VCL2 disposed on the left side of the touch sensor area TSA. The second switching transistor EMT2 may be turned on based on a second control signal ECS2 of a second electromagnetic control line ECL2. In other words, the second switching transistor EMT2 may be turned on in response to the second control signal ECS2. The second electromagnetic control line ECL2 may supply the second control signal ECS2 of the gate-on level to a plurality of second switching transistors EMT2 during the second electromagnetic sensing period EMR2. The second switching transistor EMT2 may be turned off during the touch sensing period FTS and the first electromagnetic sensing period EMR1, and the sensing electrodes RE may not receive a common voltage. The second switching transistor EMT2 may be turned on during the second electromagnetic sensing period EMR2 to supply a common voltage to the sensing electrodes RE.

The electromagnetic control line ECL may supply a control signal to the gate electrode of the plurality of switching transistors EMT The electromagnetic control line ECL may include the first and second electromagnetic control lines ECL1 and ECL2.

The first electromagnetic control line ECL1 may supply the first control signal ECS1 to the gate electrode of the first switching transistor EMT1. The first electromagnetic control line ECL1 may extend to the first touch pad unit TP1 via the upper side, the left side, and the lower side of the touch peripheral area TOA.

The second electromagnetic control line ECL2 may supply the second control signal ECS2 to the gate electrode of the second switching transistor EMT2. The second electromagnetic control line ECL2 may extend to the first touch pad unit TP1 via the left side and the lower side of the touch peripheral area. TOA, In this configuration, the first and second switching transistors EMT1 and EMT2 may be independently controlled.

The common voltage line VCL may be disposed along the periphery of the touch peripheral area TOA. The common voltage line VCL may include the first and second common voltage lines VCL1 and VCL2. The first common voltage line VCL1 may be disposed closer to the edges of the touch peripheral area TOA than the second common voltage line VCL2. In addition, the first electromagnetic control line ECL1 may be disposed between the first and second common voltage lines VCL1 and VCL2. The first common voltage line VCL1 may extend to the first touch pad unit TP1 via the upper side, the left side, and the lower side of the touch peripheral area TOA. The first common voltage line VCL1 may supply a common voltage to the driving electrodes TE during the first electromagnetic sensing period EMR1. The second common voltage Fine VCL2 may extend to the first touch pad unit TP1 via the left side and the lower side of the touch peripheral area TOA. The second common voltage line VCL2 may supply a common voltage to the sensing electrodes RE during the second electromagnetic sensing period EMR2. For example, the common voltage of the first and second common voltage lines VCL1 and VCL2 and the common voltage supplied to the display unit. DU may be the same, but are not limited thereto. As another example, the common voltages of the first and second common voltage lines VCL1 and VCL2 may be different from each other. One common voltage of the first and second common voltage lines VCL1 and VCL2 may have a constant potential, and the other common voltage of the first and second common voltage lines VCL1 and VCL2 may be a sine wave, a pulse wave, or a ramp wave having a predetermined frequency.

The driving electrodes TE may be connected to the first common voltage line VCL1 through the first switching transistor EMT1 during the first electromagnetic sensing period EMR1. The first electromagnetic control line ECL1 may supply the first control signal ECS1 of the gate-on level to the plurality of first switching transistors EMT1 during the first electromagnetic sensing period EMR1. The first common voltage line VCL1 may supply a common voltage to the other end of the driving electrodes TE disposed farthest from the driving line TL or the touch driver 400, so that the potential of the other end of the driving electrodes TE may be stably maintained. The first common voltage line VCL1 may supply a common voltage to the other end of the driving electrodes TE, so that the sensing sensitivity at the other end of the driving electrodes TE may be improved.

The sensing electrodes RE may be connected to the second common voltage line VCL2 through the second switching transistor EMT2 during the second electromagnetic sensing period EMR2. The second electromagnetic control line ECL2 may supply the second control signal ECS2 of the gate-on level to a plurality of second switching transistors EMT2 during the second electromagnetic sensing period EMR2. The second common voltage line VCL2 may supply a common voltage to the other end of the sensing electrodes RE disposed farthest from the sensing line RL or the touch driver 400, so that the potential of the other end of the sensing electrodes RE may be stably maintained. The second common voltage line VCL2 may supply a common voltage to the other end of the sensing electrodes RE, so that the sensing sensitivity at the other end of the sensing electrodes RE may be improved.

Accordingly, the display device 10 may include the first and second switching transistors EMT1 and EMT2 and the first and second common voltage lines VCL1 and VCL2 disposed in the touch peripheral area TOA, so that the reliability of the sensor may be secured over the entire area of the touch sensor area TSA.

The touch driver 400, during the self-capacitance sensing period Self-Cap of the touch sensing period FTS, may supply the plurality of first driving signals TDS to the plurality of driving electrodes TE, and may supply the plurality of second driving signals R DS to the plurality of sensing electrodes RE. The touch driver 400 may sense an amount of change of the self-capacitance of each of the plurality of driving electrodes TE and the plurality of sensing electrodes RE by receiving the sensing signal from each of the plurality of driving electrodes TE and the plurality of sensing electrodes RE during the self-capacitance sensing period Self-Cap of the touch sensing period FTS.

The touch driver 400 may supply the plurality of first driving signals TDS to the plurality of driving electrodes TE during the mutual capacitance sensing period Mutual-Cap of the touch sensing period FTS. The touch driver 400 may sense an amount of change of the mutual capacitance between the plurality of driving electrodes TE and the plurality of sensing electrodes RE by receiving the sensing signal from the plurality of sensing electrodes RE during the mutual capacitance sensing period Mutual-Cap of the touch sensing period FTS.

The first electromagnetic control line ECL1 may supply the first control signal ECS1 of the gate-off level to the first switching transistor EMT1 during the touch sensing period FTS. The second electromagnetic control line ECL2 may supply the second control signal ECS2 of the gate-off level to the second switching transistor EMT2 during the touch sensing period FTS. Accordingly, the first and second switching transistors EMT1 and EMT2 may be turned off during the touch sensing period FTS.

The display device 10 may sense the touch of the input member 20 by using the touch sensing unit TSU that senses the touch of the user's body. The display device 10 may sense a touch of the user's body during the touch sensing period FTS using the touch sensing unit TSU, and may sense the approach or contact of the input member 20 such as an input pen during the first and second electromagnetic sensing periods EMR1 and EMR2. Accordingly, the display device 10 may not include a separate sensor layer or a digitizer layer for the electromagnetic resonance of the input member 20, so that the thickness of the display device 10 may be decreased, and the costs may be reduced.

Figure 17:
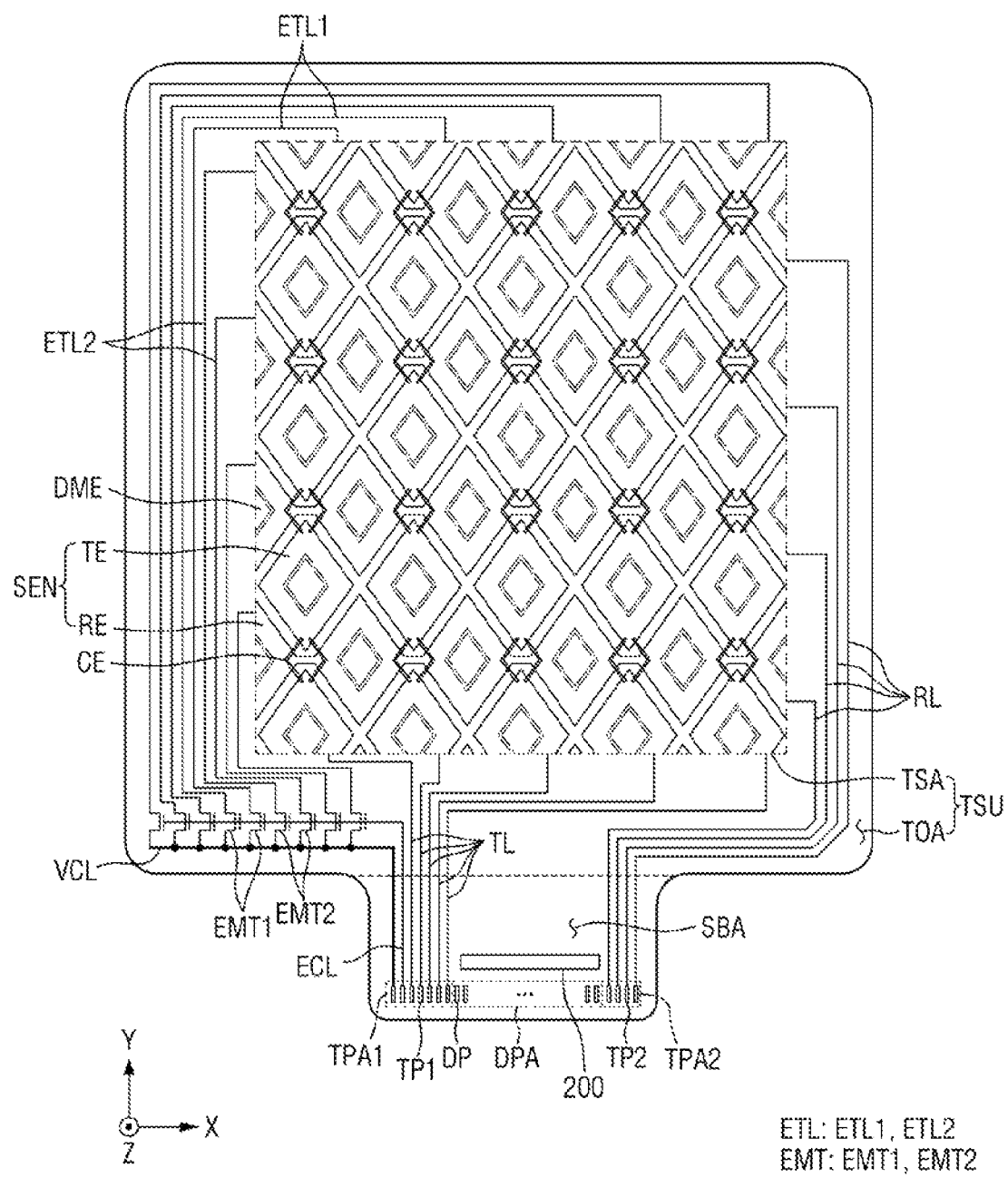
FIG. 17 is a plan view illustrating a touch sensing unit of a display device according to an embodiment of the present disclosure.

FIG. 17 is a plan view illustrating a touch sensing unit of a display device according to an embodiment of the present disclosure. The touch sensing unit TSU of FIG. 17 has a different configuration of the voltage line VCL and the electromagnetic control line ECL by further including the extension line ETL in the touch sensing unit TSU of FIG. 5, and the same configuration as the above-described configuration for FIG. 5 will be briefly described or omitted.

Referring to FIG. 17, the touch sensor area TSA may include a plurality of touch electrodes SEN and a plurality of dummy electrodes DME. The plurality of touch electrodes SEN may include a plurality of driving electrodes TE and a plurality of sensing electrodes RE.

The touch peripheral area TOA may include the driving line IL, the sensing line RL, the plurality of extension lines ETL, the plurality of switching transistors EMT, the electromagnetic control line ECL, and the common voltage line VCL.

The plurality of extension lines ETL may electrically connect the touch electrodes SEN to the plurality of switching transistors EMT. The plurality of extension lines ETL may include first and second extension lines ETL1 and ETL2. The first extension line ETL1 may be connected to the driving electrodes TE disposed on the upper side of the touch sensor area TSA. The first extension line ETL1 may extend to the first switching transistor EMT1 via the upper side and the left side of the touch peripheral area TOA. Accordingly, the first extension line ETL1 may electrically connect the driving electrodes TE to the first switching transistor EMT1. Although FIG. 17 shows four first extension lines ETL1 this is merely an example and the number of first extension lines ETL1 may correspond to the number of columns of driving electrodes TE in the touch peripheral area TOA.

The second extension line ETL2 may be connected to the sensing electrodes RE disposed on the left side of the touch sensor area TSA. The second extension line ETL2 may extend to the second switching transistor EMT2 via the left side of the touch peripheral area TOA. Accordingly, the second extension line ETL2 may electrically connect the sensing electrodes RE to the second witching transistor EMT2. Although FIG. 17 shows four second extension lines ETL2, this is merely an example and the number of second extension lines ETL2 may correspond to the number of row of sensing electrodes RE in the touch peripheral area TOA.

The switching transistor EMT may be a switching element connected between the plurality of touch electrodes SEN and the common voltage line VCL. The plurality of switching transistors EMT may include a first switching transistor EMT1 and a second switching transistor EMT2. The first and second switching transistors EMT1 and EMT2 may be disposed in a line on the lower side of the touch peripheral area TOA. The first switching transistor EMT1 ma be connected to the driving electrodes TE disposed farthest from the driving line TL through the first extension line ETL1. The first switching transistor EMT1 may be electrically connected between the driving electrodes TE and the common voltage line VCL disposed on the upper side of the touch sensor area TSA. The first switching transistor EMT1 may be turned on based on the control signal ECS of the electromagnetic control line ECL. The electromagnetic control line ECL may supply a control signal ECS of the gate-on level to a plurality of first switching transistors EMT1 during the electromagnetic sensing period EMR. The first switching transistor EMT1 may be turned off during the touch sensing period FTS, and the driving electrodes TE may not receive a common voltage. The first switching transistor EMT1 may be turned on during the electromagnetic sensing period EMR to supply a common voltage to the driving electrodes TE.

The second switching transistor EMT2 may be connected to the sensing electrodes RE disposed farthest from the sensing line RL through the second extension line ETL2. The second switching transistor EMT2 may be electrically connected between the sensing electrodes RE and the common voltage line VCL disposed on the left side of the touch sensor area TSA. The second switching transistor EMT2 may be turned on based on the control signal ECS of the electromagnetic control line ECL. The electromagnetic control line ECL may supply the control signal ECS of the gate-on level to the plurality of second switching transistors EMT2 during the electromagnetic sensing period EMR. The second switching transistor EMT2 may be turned off during the touch sensing period FTS, and the sensing electrodes RE may not receive a common voltage. The second switching transistor EMT2 may be turned on during the electromagnetic sensing period EMR to supply a common voltage to the sensing electrodes RE.

The electromagnetic control line ECL may supply the control signal ECS to the gate electrode of the first and second switching transistors EMT1 and EMT2. The electromagnetic. control line ECL may extend to the first touch pad unit TP1 via the lower side of the touch peripheral area TOA.

The common voltage line VCL may be disposed outside the touch peripheral area TOA, The common voltage line VCL may extend to the first touch pad unit TP1 via the lower side of the touch peripheral area TOA. The common voltage line VCL may not extend along the left and upper sides of the touch peripheral area TOA. The common voltage line VCL may supply a common voltage to the driving electrodes TE and the sensing electrodes RE during the electromagnetic sensing period EMR. For example, the common voltage of the common voltage line VCL may be the same as the common voltage supplied to the display unit DU, but is not limited thereto. As another example, the common voltage of the common voltage line VCL may have a constant potential. As another example, the common voltage of the common voltage line VCL may be a sine wave, a pulse wave, or a ramp wave having a predetermined frequency.

The driving electrodes TE may be connected to the common voltage line VCL through the first extension line ETL1 and the first switching transistor EMT1 during the electromagnetic sensing period EMR. The electromagnetic control line ECL may supply a control signal ECS of the gate-on level to a plurality of first switching transistors EMT1 during the electromagnetic sensing period EMR. The common voltage line VCL may supply a common voltage to the other end of the driving electrodes TE disposed farthest from the driving line TL or the touch driver 400, so that the potential of the other end of the driving electrodes TE may be stably maintained. The common voltage line VCL may supply a common voltage to the other end of the driving electrodes TE, so that the sensing sensitivity at the other end of the driving electrodes TE may be improved.

The sensing electrodes RE may be connected to the common voltage line VCL through the second extension line ETL2 and the second switching transistor EMT2 during the electromagnetic sensing period EMR. The electromagnetic control line ECL may supply the control signal ECS of the gate-on level to the plurality of second switching transistors EMT2 during the electromagnetic sensing period EMR. The common voltage line VCL may supply a common voltage to the other end of the sensing electrodes RE disposed farthest from the sensing line RL or the touch driver 400, so that the potential of the other end of the sensing electrodes RE may be stably maintained. The common voltage line VCL may supply a common voltage to the other end of the sensing electrodes RE, so that the sensing sensitivity at the other end of the sensing electrodes RE may be improved.

Accordingly, the display device 10 may include the first and second extension lines ETL1 and ETL2, the first and second switching transistors EMT1 and EMT2, and the common voltage line VCL disposed in the touch peripheral area TOA, so that reliability of the sensor may be secured over the entire area of the touch sensor area TSA.

As another example, the plurality of switching transistors EMT and the common voltage line VCL may be disposed on the circuit board 300. In this case, the connection relationship between the extension line ETL, the plurality of switching transistors EMT, and the common voltage line VCL may be the same as the configuration illustrated in FIG. 17. As another example, the touch driver 400 may include the plurality of switching transistors EMT and a common voltage line VCL. In this case, the extension line ETL may be connected to the touch driver 400.

Figure 18:
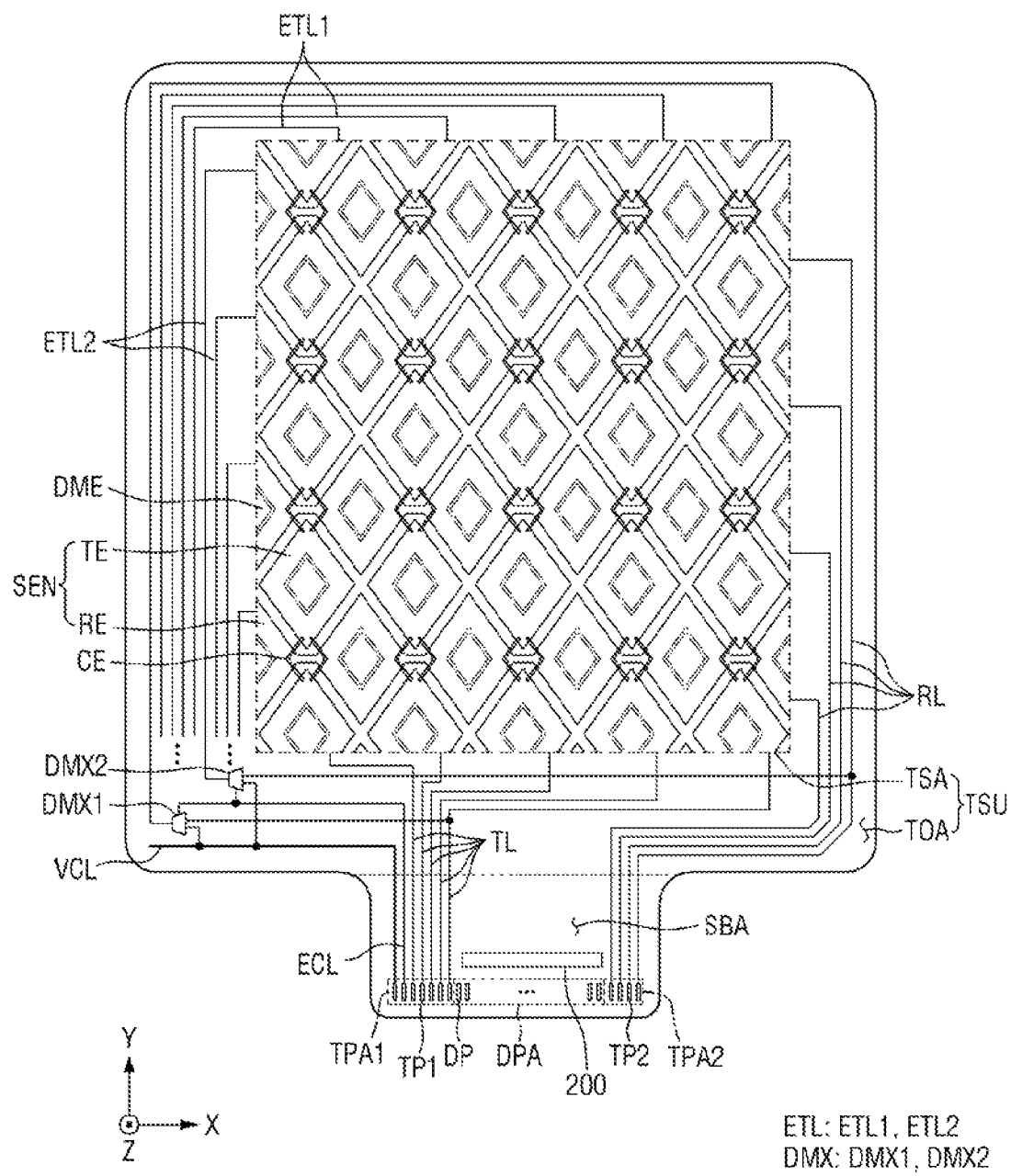
FIG. 18 is a plan view illustrating a touch sensing unit of a display device according to an embodiment of the present disclosure.

FIG. 18 is a plan view illustrating a touch sensing unit of a display device according to an embodiment of the present disclosure. The touch sensing unit TSU of FIG. 18 further includes a demultiplexer DMX in the touch sensing unit TSU of FIG. 17, and the same configuration as the above-described configuration for FIG. 17 will be briefly described or omitted.

Referring to FIG. 18, the touch sensor area TSA may include a plurality of touch electrodes SEN and a plurality of dummy electrodes DME. The plurality of touch electrodes SEN may include a plurality of driving electrodes TE and a plurality of sensing electrodes RE.

The touch peripheral area TOA may include the driving line TE, the sensing line RL, the plurality of extension lines ETL, a plurality of demultiplexers DMX, the electromagnetic control line ECL, and the common voltage line VCL.

The plurality of extension lines ETL may electrically connect the touch electrodes SEN to the plurality of demultiplexers DMX. The plurality of extension lines ETL may include the first and second extension lines ETL1 and ETL2. The first extension line ETL1 may be connected to the driving electrodes TE disposed on the upper side of the touch sensor area TSA. The first extension line ETL1 may extend to a first demultiplexer DMX1 via the upper side and the left side of the touch peripheral area TOA. Accordingly, the first extension line ETL1 may electrically connect the driving electrodes TE to the first demultiplexer DMX1.

The second extension line ETL2 may be connected to the sensing electrodes RE disposed on the left side of the touch sensor area TSA. The second extension line ETL2 may extend to a second demultiplexer DMX2 via the left side of the touch peripheral area TOA. Accordingly, the second extension line ETL2 may electrically connect the sensing electrodes RE to the second demultiplexer DMX2.

The plurality of demultiplexers DMX may be a switching element connected between the plurality of touch electrodes SEN and the common voltage line VCL. The plurality of demultiplexers DMX may include the first and second demultiplexers DMX1 and DMX2. The first and second demultiplexers DMX1 and DMX2 may be disposed on the lower side of the touch peripheral area TOA. The first demultiplexer DMX1 may time-divide one input into two outputs. The first demultiplexer DMX1 may electrically connect the first extension line ETL1 to the driving line TL or the common voltage line VCL based on the control signal ECS of the electromagnetic control line ECL. The first demultiplexer DMX1 may electrically connect the first extension line ETL1 to the driving line TL during the touch sensing period FTS. In other words, one end of the driving electrodes TE directly connected to the driving line TL and the other end of the driving electrodes TE directly connected to the first extension line ETL1 may be connected to each other to be connected to the touch driver 400. Accordingly, the first demultiplexer DMX1 may reduce the resistance of the plurality of driving electrodes TE, and the sensing sensitivity to the touch of the user's body may be improved.

The first demultiplexer DMX1 may electrically connect the first extension line ETL1 to the common voltage line VCL during the electromagnetic sensing period EMR. Accordingly, the first demultiplexer DMX1 may supply a common voltage to the other end of the driving electrodes TE through the first extension line ETL1, and may improve the sensing sensitivity at the other end of the driving electrodes TE. The display device 10 may secure the reliability of the sensor over the entire area of the touch sensor area TSA.

The second demultiplexer DMX2 may time-divide one input into two outputs. The second demultiplexer DMX2 may electrically connect the second extension line ETL2 to the sensing line RL or the common voltage line VCL based on the control signal ECS of the electromagnetic control line ECL. The second demultiplexer DMX2 may electrically connect the second extension line ETL2 to the sensing line RL during the touch sensing period FTS. In other words, one end of the sensing electrodes RE directly connected to the sensing line RL and the other end of the sensing electrodes RE directly connected to the second extension line ETL2 may be connected to each other to be connected to the touch driver 400. Accordingly, the second demultiplexer DMX2 may reduce the resistance of the plurality of sensing electrodes RE, and the sensing sensitivity to the touch of the user's body may be improved, The second demultiplexer DMX2 may electrically connect the second extension line ETL2 to the common voltage line VCL during the electromagnetic sensing period EMR. Accordingly, the second demultiplexer DMX2 may supply a common voltage to the other end of the sensing electrodes RE through the second extension line ETL2, and may improve the sensing sensitivity at the other end of the sensing electrodes RE, The display device 10 may secure the reliability of the sensor over the entire area of the touch sensor area TSA.

The electromagnetic control line may supply the control signal ECS to the first and second demultiplexers DMX1 and DMX2. The electromagnetic control line ECL may extend to the first touch pad unit TP1 via the lower side of the touch peripheral area TOA.

The common voltage line VCL may be disposed outside the touch peripheral area TOA. The common voltage line VCL may extend to the first touch pad unit TP1 via the lower side of the touch peripheral area TOA. The common voltage line VCL may not extend to the left and upper sides of the touch peripheral area TOA. The common voltage line VCL may supply a common voltage to the driving electrodes TE and the sensing electrodes RE during the electromagnetic sensing period EMR. For example, the common voltage of the common voltage line VCL may be the same as the common voltage supplied to the display unit DU, but is not limited thereto. As another example, the common voltage of the common voltage line VCL may have a constant potential. As another example, the common voltage of the common voltage line VCL may be a sine wave, a pulse wave, or a ramp wave having a predetermined frequency.

As another example, the plurality of demultiplexers DMX and the common voltage line VCL may be disposed on the circuit board 300. In this case, the connection relationship between the extension line ETL, the plurality of demultiplexers DMX, the driving line TL, the sensing line RL, and the common voltage line VCL may be the same as the configuration illustrated in FIG. 18. AS another example, the touch driver 400 may include the plurality of demultiplexers DMX and the common voltage line VCL. In this case, the extension line ETL may be connected to the touch driver 400.

Figure 19:
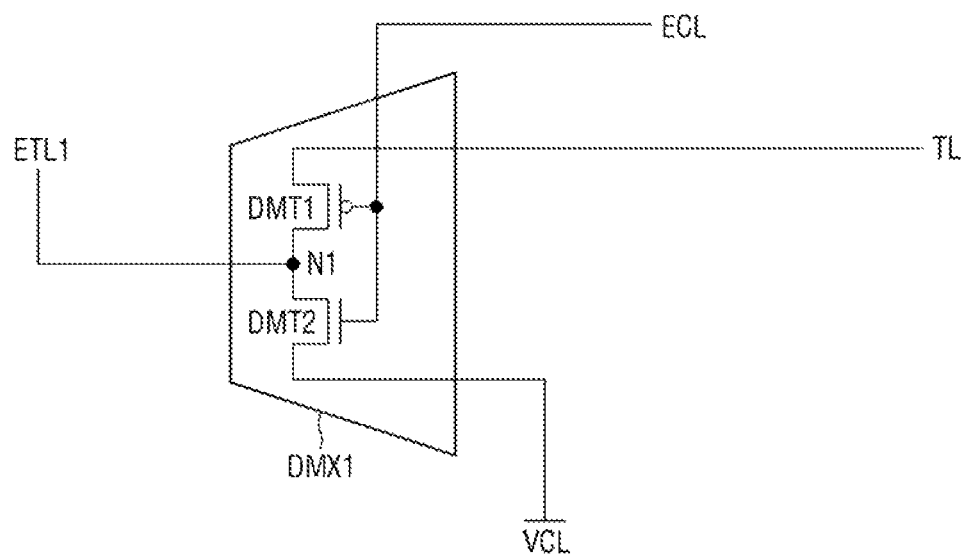
FIG. 19 is a circuit diagram illustrating an example of a first demultiplexer in the display device of FIG. 18.

FIG. 19 is a circuit diagram illustrating one example of a first demultiplexer in the display device of FIG. 18. Since the configuration of the second demultiplexer DMX2 may be the same as the configuration of the first demultiplexer DMX1 and the driving timing may be different, the description of the second demultiplexer DMX2 will be omitted.

Referring to FIG. 19, the first demultiplexer DMX1 may include first and second demux transistors DMT1 and DMT2. The first and second demux transistors DMT1 and DMT2 may correspond to different types of transistors.

The first demux transistor DMT1 may correspond to a p-type transistor, but is not limited thereto. A gate electrode of the first demux transistor DMT1 may be connected to the electromagnetic control line ECL The first demux transistor DMT1 may be turned on by receiving the control signal ECS of the gate low level from the electromagnetic control line The control signal ECS may be provided to the electromagnetic control line ECL in response to a signal provided to the first touch pad unit TP1. A first electrode of the first demux transistor DMT1 may be connected to the first extension line ETL1 through a first node N1, and a second electrode of the first demux transistor DMT1 may be connected to the driving line TL.

The second demux transistor DMT2 may correspond to an n-type transistor, but is not limited thereto. A gate electrode of the second demux transistor DMT2 may be connected to the electromagnetic control line ECL. The second demux transistor DMT2 may be turned on by receiving the control signal ECS of the gate high level from the electromagnetic control line ECL. A first electrode of the second demux transistor DMT2 may be connected to the first extension line ETL1 through the first node N1, and a second electrode of the second demux transistor DMT2 may be connected to the common voltage line VCL. As can be seen, the first node N1 may be connected to each of the first and second demux transistors DMT1 and DMT2.

Figure 20:
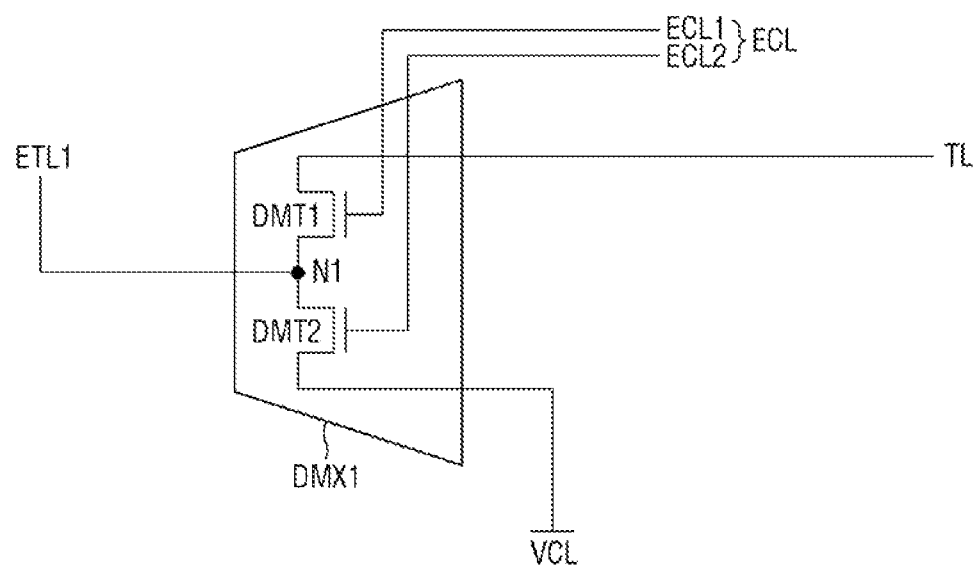
FIG. 20 is a circuit diagram illustrating an example of a first demultiplexer in the display device of FIG. 18.

FIG. 20 is a circuit diagram illustrating another example of a first demultiplexer in the display device of FIG. 18.

Referring to FIG. 20, the first demultiplexer DMX1 may include the first and second demux transistors DMT1 and DMT2. The first and second demux transistors DMT1 and DMT2 may correspond to the same type of transistor.

The first demux transistor DMT1 may correspond to an n-type transistor, but is not limited thereto. A gate electrode of the first demux transistor DMT1 may be connected to the first electromagnetic control line ECL1. The first demux transistor DMT1 may be turned on by receiving the first control signal ECS1 of the gate high level from the first electromagnetic control line ECL1. A first electrode of the first demux transistor DMT1 may be connected to the first extension line ETL1 through a first node N1, and a second electrode of the first demux transistor DMT1 may be connected to the driving line TL.

The second demux transistor DMT2 may correspond to an n-type transistor, but is not limited thereto. The gate electrode of the second demux transistor DMT2 may be connected to the second electromagnetic control line ECL2. The second demux transistor DMT2 may be turned on by receiving the second control signal ECS2 of the gate high level from the second electromagnetic control line ECL2. A first electrode of the second demux transistor DMT2 may be connected to the first extension line ETL1 through the first node N1, and a second electrode of the second demux transistor DMT2 may be connected to the common voltage line VCL. By connecting the first and second demux transistors DMT1 and DMT2 to different electromagnetic control lines, the first and second demux transistors DMT1 and DMT2 may be independently controlled.

Figure 21:
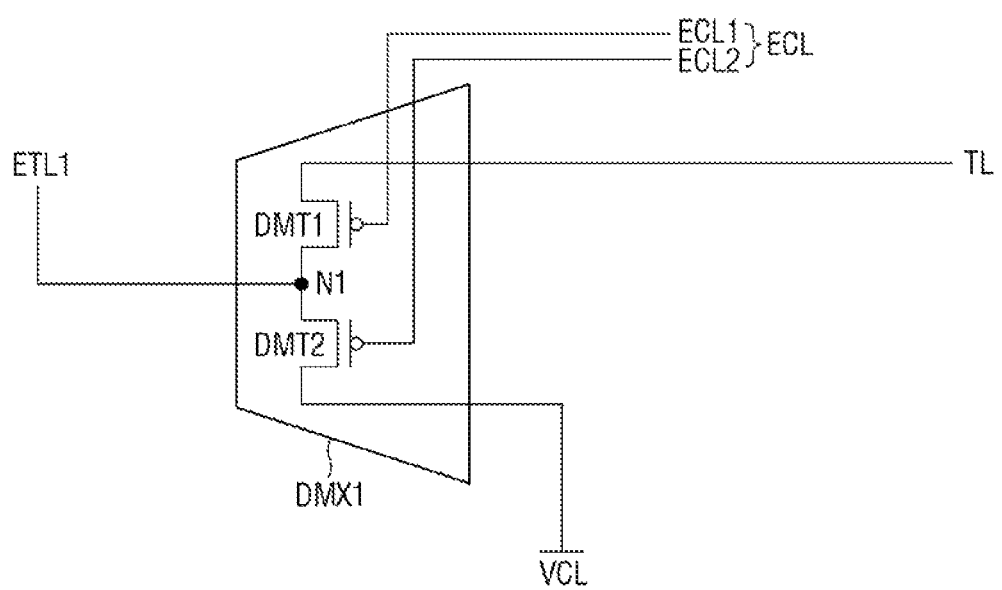
FIG. 21 is a circuit diagram illustrating an example of a Frig demultiplexer in the display device of FIG. 18.

FIG. 21 is a circuit diagram illustrating yet another example of a first demultiplexer in the display device of FIG. 18.

Referring to FIG. 21, the first demultiplexer DMX1 may include the first and second demux transistors DMT1 and DMT2. The first and second demux transistors DMT1 and DMT2 may correspond to the same type of transistor.

The first demux transistor DMT1 may correspond to a p-type transistor, but is not limited thereto. A gate electrode of the first demux transistor DMT1 may be connected to the first electromagnetic control line ECL1. The first demux transistor DMT1 may be turned on by receiving the first control signal ECS1 of the gate low level from the first electromagnetic control line ECL1. A first electrode of the first demux transistor DMT1 way be connected to the first extension line ETL1 through a first node N1, and a second electrode of the first demux transistor DMT1 may be connected to the driving line TL.

The second demux transistor DMT2 may correspond to a p-type transistor, but is not limited thereto. The gate electrode of the second demux transistor DMT2 may be connected to the second electromagnetic control line ECL2, The second demux transistor DMT2 may be turned on by receiving the second control signal ECS2 of the gate low level from the second electromagnetic control line ECL2. A first electrode of the second demux transistor DMT2 may be connected to the first extension line ETL1 through the first node N1, and a second electrode of the second demux transistor DMT2 may be connected to the common voltage line VCL.

Figure 22:
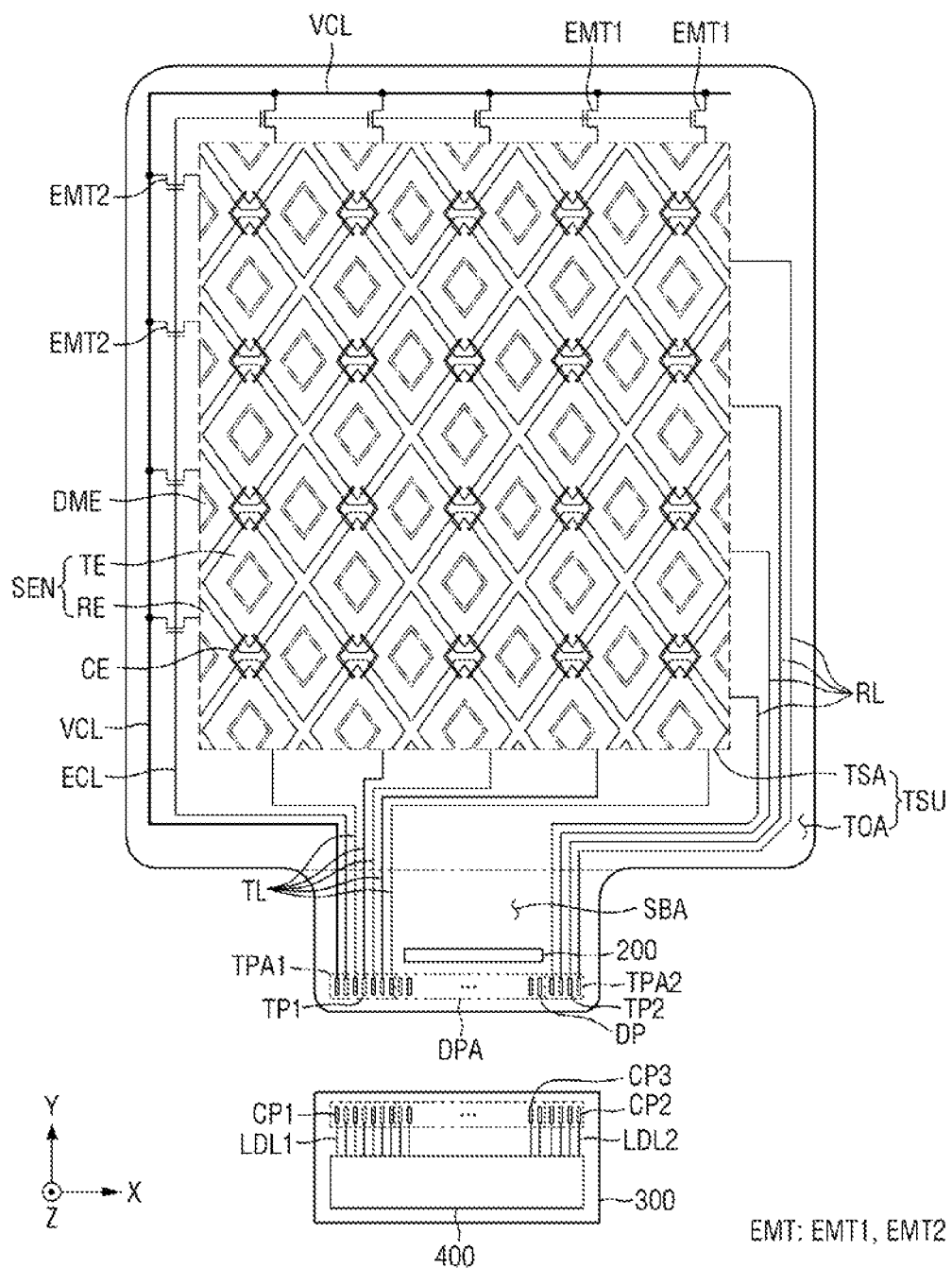
FIG. 22 is a plan view illustrating a touch sensing unit, a circuit board, and a touch driver of a display device according to an embodiment of the present disclosure.

FIG. 22 is a plan view illustrating a touch sensing unit, a circuit board, and a touch driver of a display device according to an embodiment of the present disclosure. FIG. 22 is a diagram illustrating a connection relationship between the first and second touch pad units TP1 and TP2 of the touch sensing unit TSU, and first and second contact pad units CP1 and CP2 of the circuit board 300, and the same configuration as the above-described configurations will be briefly described or omitted.

Referring to FIG. 22, the display pad area DPA, the first touch pad area TPA1, and the second touch pad area TPA2 may be disposed at the edge of the sub-region SBA. The display pad area DPA, the first touch pad area TPA1, and the second touch pad area TPA2 may be electrically connected to the circuit board 300 by using a low-resistance high-reliability material such as an anisotropic conductive film or self assembly anisotropic conductive paste (SAP).

The display pad area DPA may include a plurality of display pad units DP. The plurality of display pad units DP may be connected to the main processor through the circuit board 300. Each of the plurality of display pad units DP may be connected to each of a plurality of third contact pad units CP3 of the circuit board 300. The plurality of display pad units DP may be connected to the circuit board 300 to receive digital video data, and may supply the digital video data to the display driver 200.

The first touch pad area TPA1 may be disposed on one side of the display pad area DPA, and may include a plurality of first touch pad units TP1. Each of the plurality of first touch pad units TP1 may be connected to each of the plurality of first contact pad units CPI of the circuit board 300. The plurality of first touch pad units TP1 may be electrically connected to the touch driver 400 through the plurality of first contact pad units CP1 and first lead lines LDL1. The plurality of first touch pad units TP1 may supply the first driving signal TDS to the plurality of driving lines TL. The plurality of first touch pad units TP1 may supply a common voltage to the common voltage line VCL.

The second touch pad area TPA2 may be disposed on the other side of the display pad area DPA, and may include a plurality of second touch pad units TP2. For example, the second touch pad area TPA2 may be disposed on a second side of the display pad area DPA, while the first touch pad area TPA1 may be disposed on a first side of the display pad are DPA. Each of the plurality of second touch pad units TP2 may be connected to each of the plurality of second contact pad units CP2 of the circuit hoard 300. The plurality of second touch pad units TP2 may be electrically connected to the touch driver 400 through the plurality of second contact pad units CP2 and second lead lines LDL2 The plurality of second touch pad units TP2 may receive sensing signals from the plurality of sensing lines RL.

The touch driver 400 may be mounted on the circuit hoard 300. The touch driver 400 may be connected to the plurality of driving lines TL, the electromagnetic control line ECL, and the common voltage line VCL through the first lead line LDL1, the first contact pad unit CP1, and the first touch pad unit TP1. The touch driver 400 may be connected to the plurality of sensing lines RL through the second lead line LDL2, the second contact pad unit CP2, and the second touch pad unit TP2.

The touch driver 400, during the self-capacitance sensing period Self-Cap of the touch sensing period FTS, may supply the plurality of first driving signals TDS to the plurality of driving electrodes TE, and may supply the plurality of second driving signals RDS to the plurality of sensing electrodes RE. The touch driver 400 may sense an amount of change of the self-capacitance of each of the plurality of driving electrodes TE and the plurality of sensing electrodes RE by receiving the sensing signal from each of the plurality of driving electrodes TE and the plurality of sensing electrodes RE during the self-capacitance sensing period Self-Cap of the touch sensing period FTS.

The touch driver 400 may supply the plurality of first driving signals TDS to the plurality of driving electrodes TE during the mutual capacitance sensing period Mutual-Cap of the touch sensing period FTS. The touch driver 400 may sense an amount of change of the mutual capacitance between the plurality of driving electrodes TE and the plurality of sensing electrodes RE by receiving the sensing signal from the plurality of sensing, electrodes RE during the mutual capacitance sensing period Mutual-Cap of the touch sensing period FTS. Accordingly, the touch driver 400 may sense the input of the user's body during the touch sensing period FTS.

The touch driver 400 may supply the plurality of first driving signals TDS to the plurality of driving electrodes TE during the electromagnetic sensing period EMR. The touch driver 400 may sense the input of the input member 20 by receiving sensing signals from the plurality of driving electrodes TE during the electromagnetic sensing period EMR. The touch driver 400 may supply the plurality of second driving signals RDS to the plurality of sensing electrodes RE during the electromagnetic sensing period EMR. The touch driver 400 may sense the input of the input member 20 by receiving sensing signals from the plurality of sensing electrodes RE during the electromagnetic sensing period EMR.

The display device 10 may sense a touch of the user's body during the touch sensing period FTS by including the touch driver 400 implemented as one integrated circuit (IC), and may sense an approach or contact of the input member 20 such as an input pen during the electromagnetic sensing period EMR.

Figure 23:
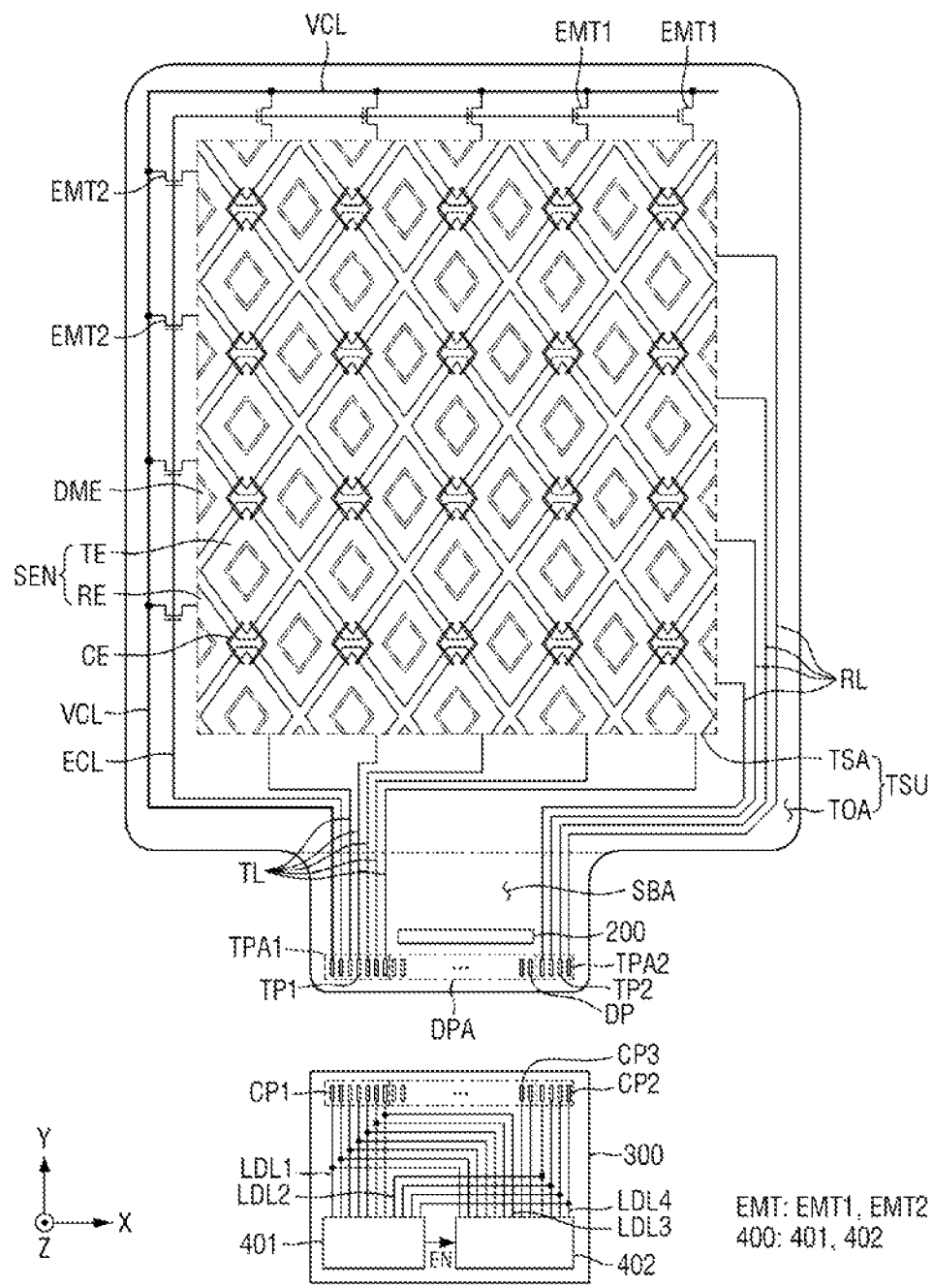
FIG. 23 is a plan view illustrating a touch sensing unit, a circuit board, a touch driving circuit, and an electromagnetic driving circuit of a display device according to another embodiment.

FIG. 23 is a plan view illustrating a touch sensing unit, a circuit board, a touch driving circuit, and an electromagnetic driving circuit of a display device according to an embodiment of the present disclosure. The display device of FIG. 23 has different configurations of the touch driving circuit 401 and the electromagnetic driving circuit 402 from the display device of FIG. 22, and the same configuration as the above-described configuration of FIG. 22 will be briefly described or omitted.

Referring to FIG. 23, the touch driver 400 may include a touch driving circuit 401 and an electromagnetic driving circuit 402.

The touch driving circuit 401 may be connected to the plurality of driving lines TL, the electromagnetic control line ECL, and the common voltage line VCL through the first lead line LDL1 the first contact pad unit CP1, and the first touch pad unit TP1. The touch driving circuit 401 may be connected to the plurality of sensing, lines RL through the second lead line LDL2, the second contact pad unit CP2, and the second touch pad unit TP2.

The touch driving circuit 401, during the self-capacitance sensing period Self-Cap of the touch sensing period FTS, may supply the plurality of first driving signals TDS to the plurality of driving electrodes TE, and may supply the plurality of second driving signals RDS to the plurality of sensing electrodes RE. The touch driving circuit 401 may sense an amount of change of the self-capacitance of each of the plurality of driving electrodes TE and the plurality of sensing electrodes RE by receiving the sensing signal from each of the plurality of driving electrodes TE and the plurality of sensing electrodes RE during the self-capacitance sensing period Self-Cap of the touch sensing period FTS.

The touch driving circuit 401 may supply the plurality of first driving signals TDS to the plurality of driving electrodes TE during the mutual capacitance sensing period Mutual-Cap of the touch sensing period FTS. The touch driving circuit 401 may sense an amount of change of the mutual capacitance between the plurality of driving electrodes TE and the plurality of sensing electrodes RE by receiving the sensing signal from the plurality of sensing electrodes RE during the mutual capacitance sensing period Mutual-Cap. Accordingly, the touch driving circuit 401 may sense the input of the user's body during the touch sensing period FTS of the touch sensing period FTS.

The touch driving circuit 401 may supply an enable signal EN to the electromagnetic driving circuit 402. The electromagnetic driving circuit 402 may be synchronized with the touch driving circuit 401 based on the enable signal EN, and may drive the touch sensing unit TSU during the electromagnetic sensing period EMR immediately after the touch sensing period FTS.

The electromagnetic driving circuit 402 may be connected to the plurality of driving lines TL, the electromagnetic control line ECL, and the common voltage line VCL through a third lead line LDL3, the first contact pad unit CP1, and the first touch pad unit TP1. The electromagnetic driving circuit 402 may be connected to the plurality of sensing lines RL through a fourth lead line LDL4, the second contact pad unit CP2, and the second touch pad unit TP2.

The electromagnetic driving circuit 402 may supply the plurality of first driving signals TDS to the plurality of driving electrodes TE during the electromagnetic sensing period EMR. The electromagnetic driving circuit 402 may sense the input of the input member 20 by receiving sensing signals from the plurality of driving electrodes TE during the electromagnetic sensing period EMR. The electromagnetic driving circuit 402 may supply the plurality of second driving signals RDS to the plurality of sensing electrodes RE during the electromagnetic sensing period EMR. The electromagnetic driving circuit 402 may sense the input of the input member 20 by receiving sensing signals from the plurality of sensing electrodes RE during the electromagnetic sensing period EMR.

The display device 10, by including the touch driving circuit 401 and the electromagnetic driving circuit 402 implemented as separate ICs, may sense the touch of the user's body during the touch sensing period FTS using the touch driving circuit 401, and may sense the approach or contact of the input member 20 such as an input pen during the electromagnetic sensing period EMR using the electromagnetic driving circuit 402.

Figure 24:
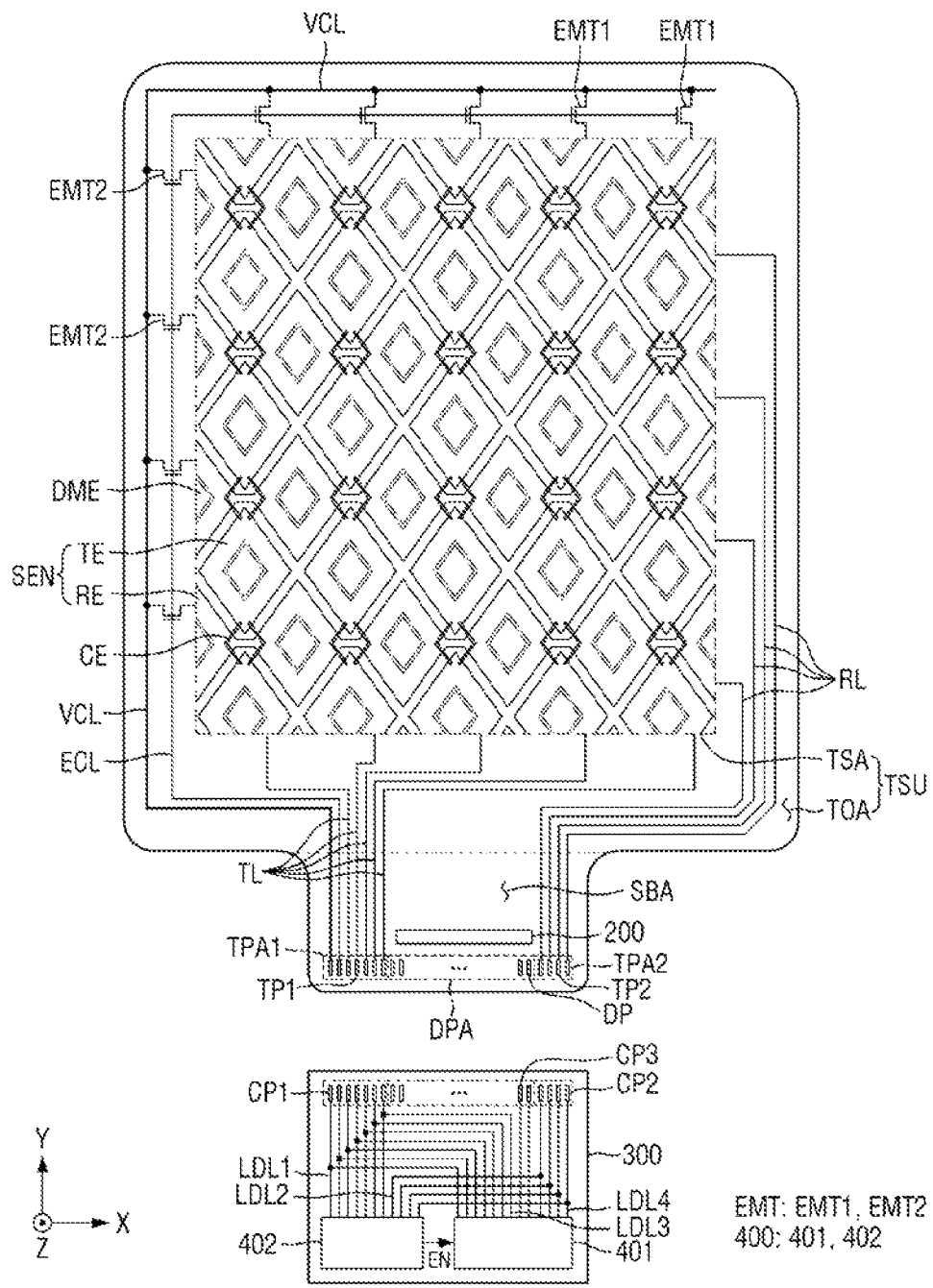
FIG. 24 is a plan view illustrating a touch sensing unit, a circuit board, a touch driving circuit, and an electromagnetic driving circuit of a display device according, to an embodiment of the present disclosure.

FIG. 24 is a plan view illustrating a touch sensing unit, a circuit board, a touch driving circuit, and an electromagnetic driving circuit of a display device according to an embodiment of the present disclosure.

Referring to FIG. 24, the touch driver 400 may include the touch driving circuit 401 and the electromagnetic driving circuit 402.

The electromagnetic driving circuit 402 may be connected to the plurality of driving lines TL, the electromagnetic control line ECL and the common voltage line VCL through the first lead line LDL1, the first contact pad unit CP1, and the first touch pad unit TP1. The electromagnetic driving circuit 402 may be connected to the plurality of sensing lines RL through the second lead line LDL2, the second contact pad unit CP2, and the second touch pad unit TP2.

The electromagnetic driving circuit 402 may supply the plurality of first driving signals TDS to the plurality of driving electrodes TE during the electromagnetic sensing period EMR. The electromagnetic driving circuit 402 may sense the input of the input member 20 by receiving sensing signals from the plurality of driving electrodes TE during the electromagnetic sensing period EMR. The electromagnetic driving circuit 402 may supply the plurality of second driving, signals RDS to the plurality of sensing electrodes RE during the electromagnetic sensing period EMR. The electromagnetic driving circuit 402 may sense the input of the input member 20 by receiving sensing signals from the plurality of sensing electrodes RE during the electromagnetic sensing, period EMR.

The electromagnetic driving circuit 402 may supply the enable signal EN to the touch driving circuit 401. This is different from the embodiment of FIG. 23 in which the touch driving circuit 401 supplies to the enable signal EN to the electromagnetic driving circuit 402, The touch driving circuit 401 may be synchronized with the electromagnetic driving circuit 402 based on the enable signal EN, and may drive the touch sensing unit TSU during the touch sensing period FTS.

The touch driving circuit 401 may be connected to the plurality of driving lines TL, the electromagnetic control line ECL, and the common voltage line VCL through the third lead line LDL3, the first contact pad unit CP1, and the first touch pad unit TP1. The touch driving circuit 401 may be connected to the plurality of sensing lines RL through the fourth lead line LDL4, the second contact pad unit CP2, and the second touch pad unit TP2.

The touch driving circuit 401 may sense an amount of change of the self-capacitance of each of the plurality of driving electrodes TE and the plurality of sensing electrodes RE during the self-capacitance sensing period Self-Cap of the touch sensing period FTS. The touch driving circuit 401 may sense an amount of change of the mutual capacitance between the plurality of driving electrodes TE and the plurality of sensing electrodes RE during the mutual capacitance sensing period Mutual-Cap of the touch sensing period FTS. Accordingly, the touch driving circuit 401 may sense the input of the user's body during the touch sensing period FTS.

The display device 10, by including the touch driving circuit 401 and the electromagnetic driving circuit 402 implemented as separate ICs, may sense the touch of the user's body during the touch sensing period FTS using the touch driving circuit 401, and may sense the approach or contact of the input member 20 such as an input pen during the electromagnetic sensing, period EMR using the electromagnetic driving circuit 402.

Figure 25:
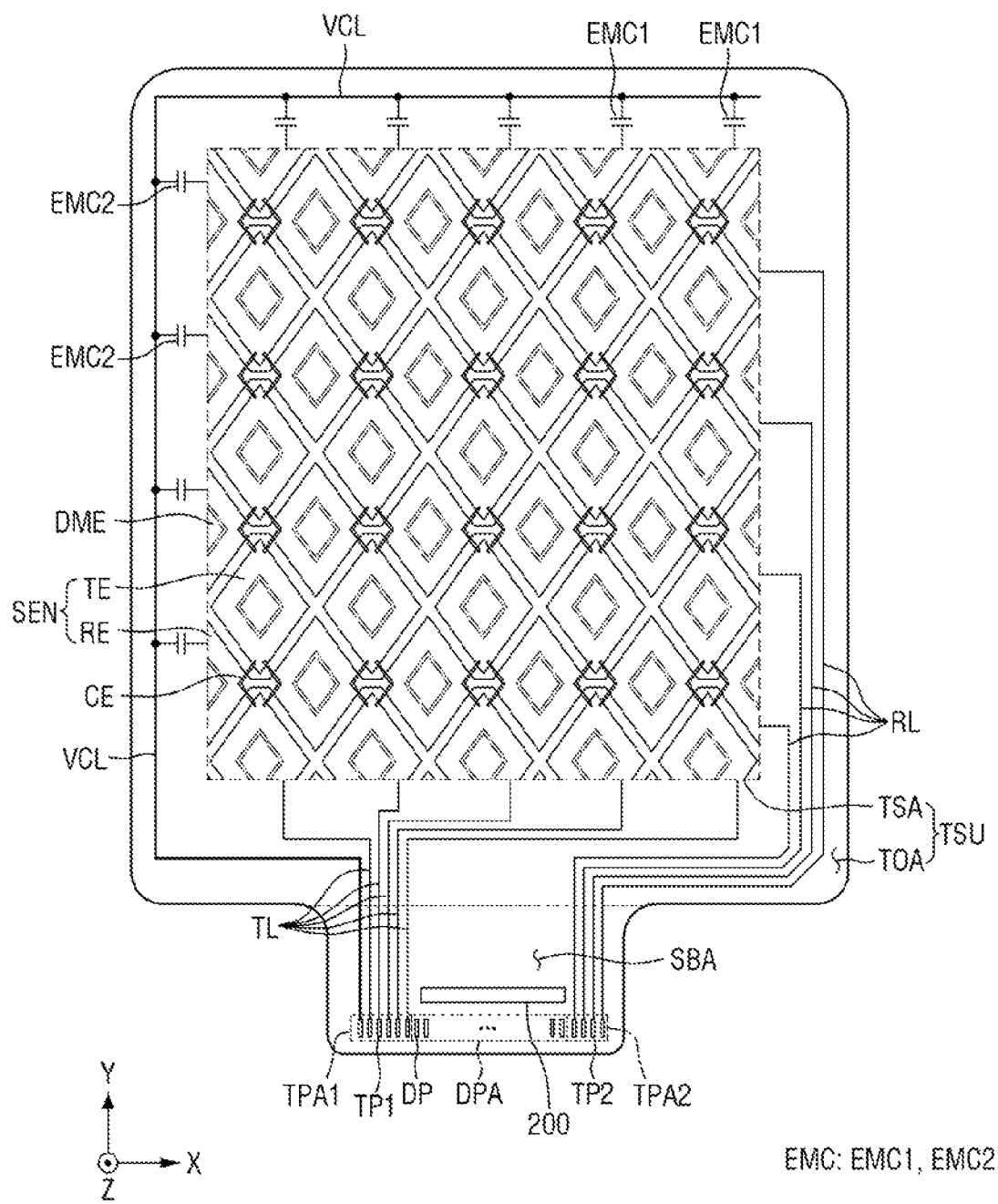
FIG. 25 is a plan view illustrating a touch sensing unit of a display device according to an embodiment of the present disclosure.

FIG. 25 is a plan view illustrating a touch sensing unit of a display device according to an embodiment of the present disclosure. The touch sensing unit TSU of FIG. 25 has a different configuration of a coupling capacitor EMC from the touch sensing unit TSU of FIG. 5, and the same configuration as the above-described configuration of FIG. 5 will be briefly described or omitted.

Referring to FIG. 25, the touch sensing unit TSU may include a touch sensor area TSA for sensing a user's touch, and a touch peripheral area TOA disposed around the touch sensor area TSA.

The touch sensor area TSA may include a plurality of touch electrodes SEN and a plurality of dummy electrodes DME. The plurality of touch electrodes SEN may form mutual capacitance or self-capacitance to sense a touch of an object or a person. The plurality of touch electrodes SEN may include a plurality of driving electrodes TE and a plurality of sensing electrodes RE.

The touch peripheral area TOA may include the driving line TL, the sensing line RL, a plurality of coupling capacitors EMC, and the common voltage line VCL.

The plurality of coupling capacitors EMC may include a first coupling capacitor EMC1 and a second coupling capacitor EMC2. The first coupling capacitor EMC1 may be disposed on the upper side of the touch peripheral area TOA. The first coupling capacitor EMC1 may be disposed on the opposite side of the driving line TL. The first coupling capacitor EMC1 may be connected to the driving electrodes TE disposed farthest from the driving line TL. The first coupling capacitor EMC1 may be disposed between the driving electrodes TE and the common voltage line VCL disposed on the upper side of the touch sensor area TSA. Accordingly, the first coupling capacitor EMC1 may maintain a potential difference between the driving electrodes TE and the common voltage line VCL. The first coupling capacitor EMC1 may be connected to each driving electrode TE column.

The second coupling capacitor EMC2 may be disposed on the left side of the touch peripheral area TOA. The second coupling capacitor EMC2 may be disposed on the opposite side of the sensing line RL. The second coupling capacitor EMC2 may be connected to the sensing electrodes RE disposed farthest from the sensing line RL. The second coupling capacitor EMC2 may be disposed between the sensing electrodes RE and the common voltage line VCL disposed on the left side of the touch sensor area TSA. Accordingly, the second coupling capacitor EMC2 may maintain a potential difference between the sensing electrodes RE and the common voltage line VCL. The second coupling capacitor EMC2 may be connected to each sensing electrode RE column.

The common voltage line VCL may be disposed along the periphery of the touch peripheral area TOA. The common voltage line VCL may extend to the first touch pad unit TP1 via the upper side, the left side, and the lower side of the touch peripheral area TOA. The number of common voltage lines is not limited to that illustrated in FIG. 25. For example, the common voltage of the common voltage line VCL may be the same as the common voltage supplied to the display unit DU, but is not limited thereto. As another example, the common voltage of the common voltage line VCL may have a constant potential. As another example, the common voltage of the common voltage line VCL may be a sine wave, a pulse wave, or a ramp wave having a predetermined frequency.

One end of the plurality of driving electrodes TE may be connected to the driving line TL, and the other end of the plurality of driving electrodes TE may be connected to the first coupling capacitor EMC1. In other words, a first end of the plurality of driving electrodes IF may be connected to the driving line TL, and a second end of the plurality of driving electrodes TE may be connected to the first coupling capacitor EMC1, The first coupling capacitor EMC1 may maintain a potential difference between the common voltage line VCL and the other end (e.g., second end) of the driving electrodes TE disposed farthest from the driving line TL or the touch driver 400, and thus may stably maintain the potential of the other end of the driving electrodes TE. The first coupling capacitor EMC1 may improve sensing sensitivity at the other end (e.g., second end) of the driving electrodes TE.

One end of the plurality of sensing electrodes RE may be connected to the sensing line RL, and the other end of the plurality of sensing electrodes RE may be connected to the second coupling capacitor EMC2. In other words, a first end of the plurality of sensing electrodes RE may be connected to the sensing line RL, and a second end of the plurality of sensing electrodes RE may be connected to the second coupling capacitor EMC2. The second coupling capacitor EMC2 may maintain a potential difference between the common voltage line VCL and the other end (e.g., second end) of the sensing electrodes RE disposed farthest from the sensing line RL or the touch driver 400, and thus may stably maintain the potential of the other end (e.g., second end) of the sensing electrodes RE. The second coupling capacitor EMC2 may improve sensing sensitivity at the other end of the sensing electrodes RE.

Accordingly, the display device 10 may include the coupling capacitor EMC and the common voltage line VCL disposed in the touch peripheral area TOA, so that the reliability of the sensor may be secured over the entire area of the touch sensor area TSA.

The display device 10 may sense the touch of the input member 20 by using the touch sensing unit TSU that senses the touch of the user's body. The display device 10 may sense a touch of the user's body during the touch sensing period FTS using the touch sensing unit TSU, and may sense the approach or contact of the input member 20 such as an input pen during the electromagnetic sensing period EMR. Accordingly, the display device 10 may not include a separate sensor layer or a digitizer layer for the electromagnetic resonance of the input member 20, so that the thickness of the display device 10 may be decreased, and the costs may be reduced.

Figure 26:
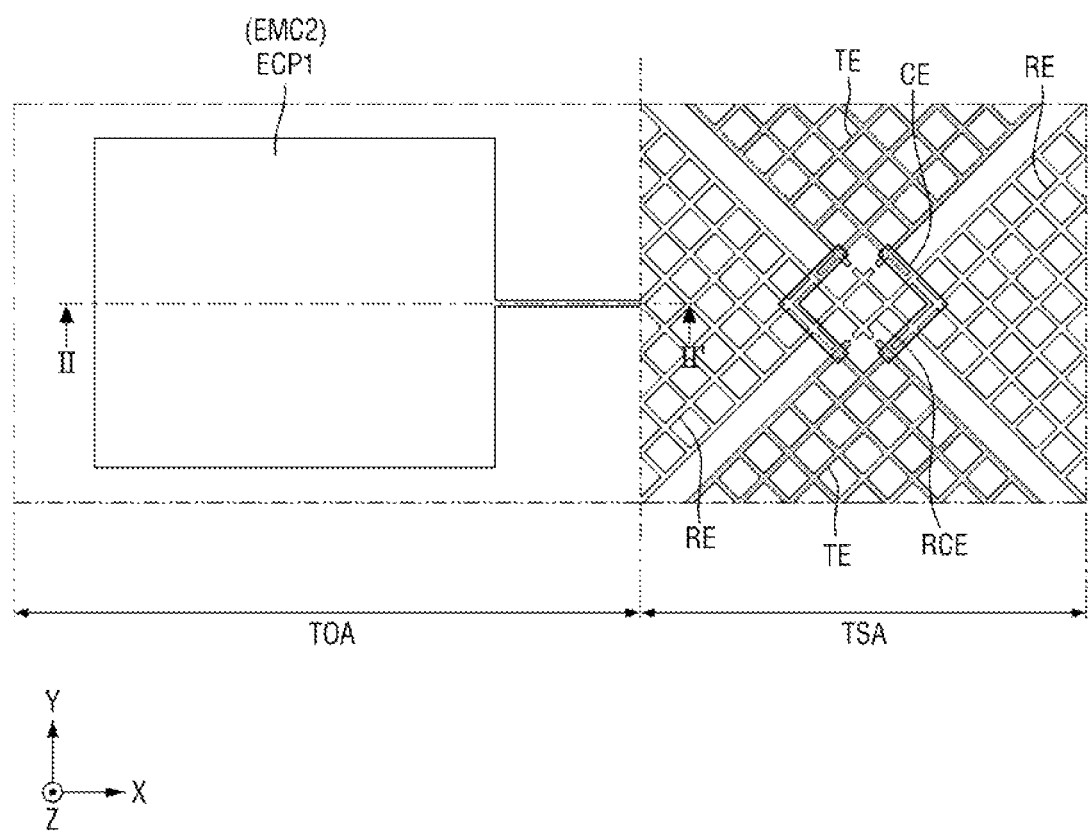
FIG. 26 is a plan view illustrating an example of a touch sensing unit of the display device of FIG. 25.
Figure 27:
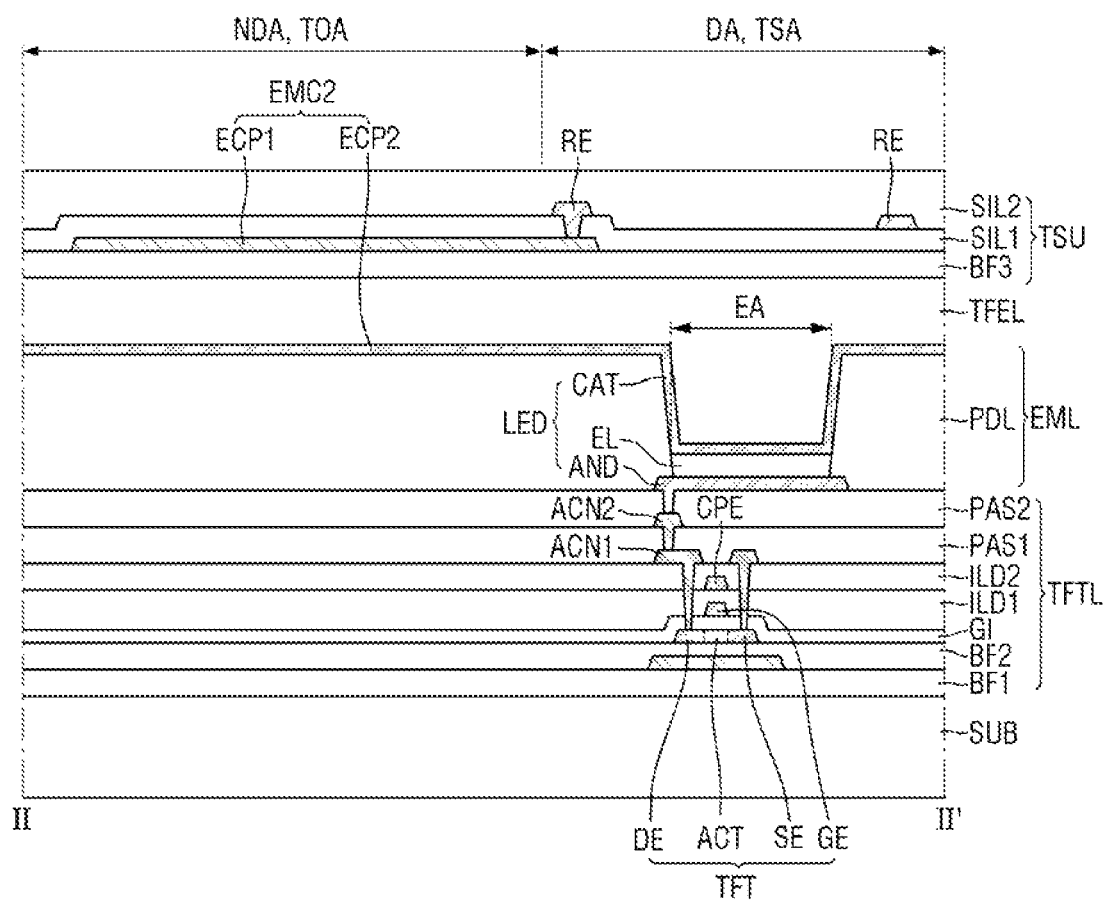
FIG. 27 is a cross-sectional view taken along line of II-II' FIG. 26.

FIG. 26 is a plan view illustrating an example of a touch sensing unit of the display device of FIG. 25, and FIG. 27 is a cross-sectional view taken along line II-II' of FIG. 26.

Referring to FIGS. 26 and 27, the non-display area NDA and the touch peripheral area TOA may include the second coupling capacitor EMC2. FIGS. 26 and 27 illustrate the example of the second coupling capacitor EMC2, but the first coupling capacitor EMC1 may also be formed in the same manner as the second coupling capacitor EMC2.

The second coupling capacitor EMC2 may maintain a potential difference between the sensing electrodes RE and the common electrode CAT. The second coupling capacitor EMC2 may include a first capacitor electrode ECP1 and a second capacitor electrode ECP2. The first capacitor electrode ECP1 may be disposed on the first metal layer YML1 of the touch sensing unit TSU. The first capacitor electrode ECP1 may be connected to the sensing electrode RE of the touch sensor area TSA through a contact hole provided in the first insulating layer SIL1. For example, the sensing electrode RE connected to the first capacitor electrode ECP1 may correspond to the sensing line RL or the other end of the sensing electrodes RE disposed farthest from the touch driver 400. The first capacitor electrode ECP1 may be a plate electrode having a predetermined area.

The second capacitor electrode ECP2 may be a portion of the common voltage line VCL integrally formed with the common electrode CAT of the display unit DU. The second capacitor electrode ECP2 may correspond to a portion of the common voltage line VCL that overlaps the first capacitor electrode ECP1. The common electrode CAT may be implemented in the form of an electrode common to all pixels of the display unit DU, and may extend to the non-display area NDA. Accordingly, the common electrode CAT may be a cathode electrode that supplies a common voltage to the light emitting element LED of the display unit DU, and may be the second capacitor electrode ECP2 that supplies a common voltage to the second coupling capacitor EMC2 of the touch peripheral area TOA. Accordingly, the second capacitor electrode ECP2 may correspond to the common voltage line VCL of FIG. 25, and the display device 10 may not include a separate voltage line. The display device 10 may supply a common voltage to the second coupling capacitor EMC2 using the common electrode CAT of the display unit DU. The display device 10 may stably maintain the potential of the other end of the sensing electrodes RE, and may improve the sensing sensitivity at the other end of the sensing electrodes RE.

Figure 28:
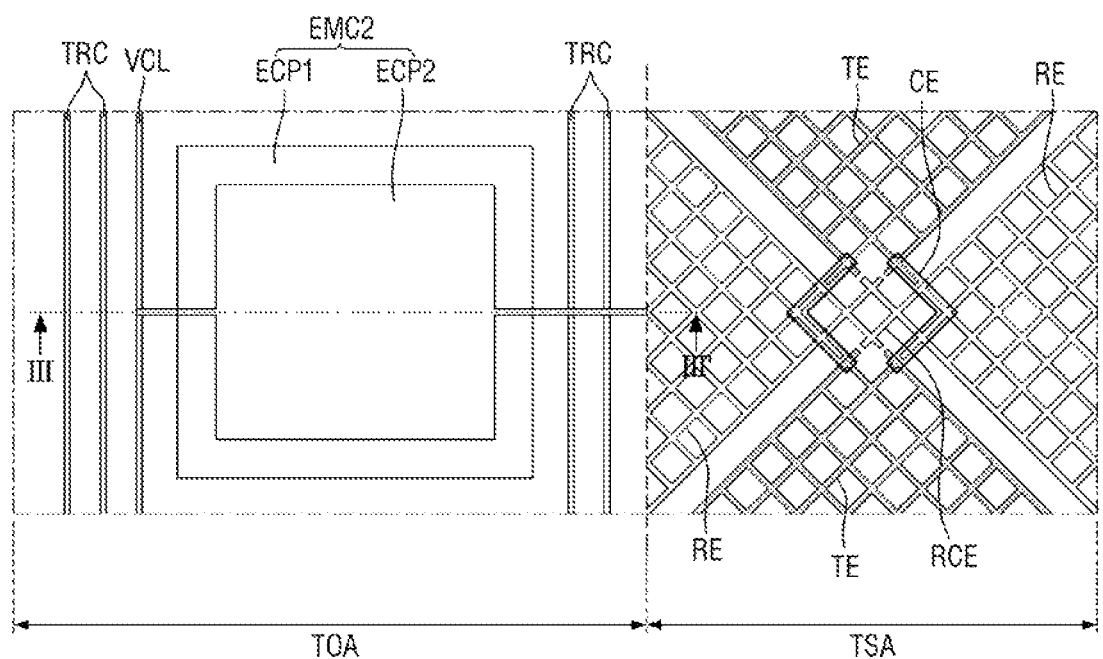
FIG. 28 is a plan view illustrating an example of a touch sensing unit of the display device of FIG. 25.
Figure 29:
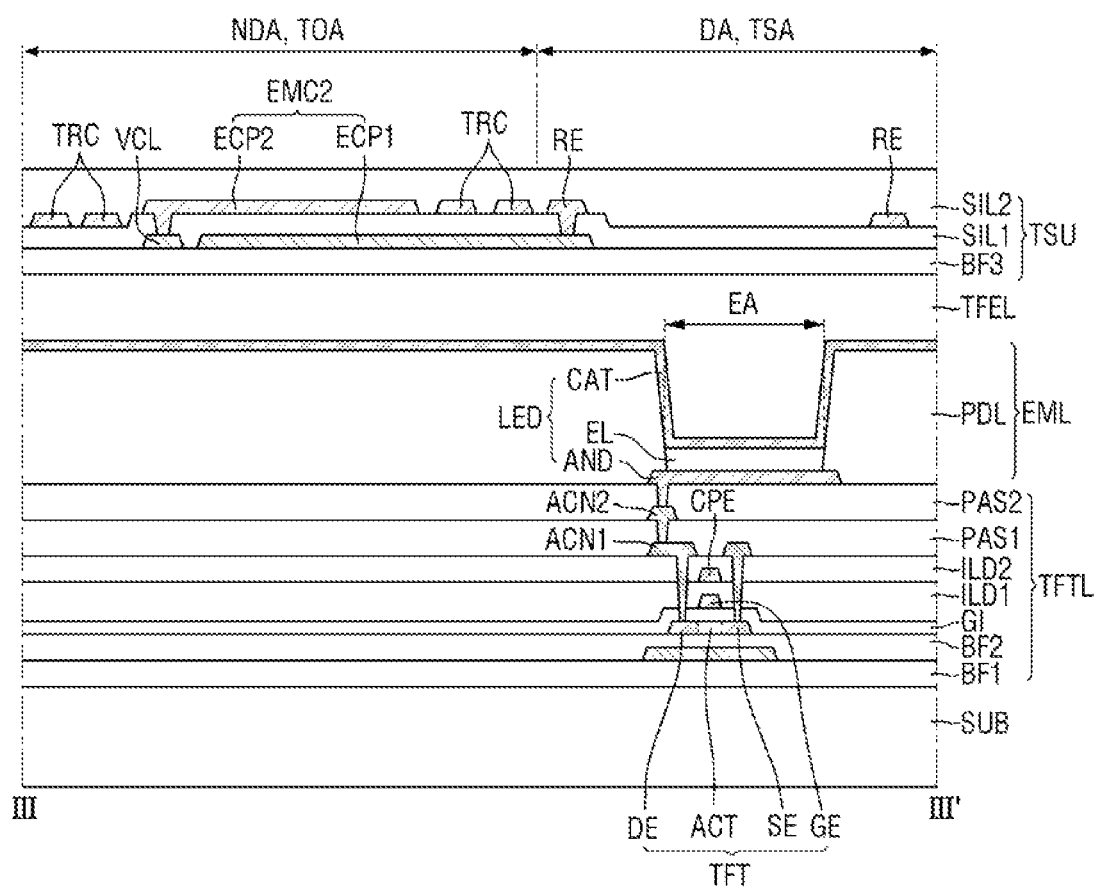
FIG. 29 is a cross-sectional view taken along line III-III' of FIG. 28.

FIG. 28 is a plan view illustrating another example of a touch sensing unit of the display device of FIG. 25, and FIG. 29 is a cross-sectional view taken along line III-III' of FIG. 28.

Referring to FIGS. 28 and 29, the non-display area NDA and the touch peripheral area TOA may include the second coupling capacitor EMC2. FIGS. 28 and 29 illustrate the example of the second coupling capacitor EMC2, but the first coupling capacitor EMC1 may also be formed in the same manner as the second coupling capacitor EMC2.

The second coupling capacitor EMC2 may maintain a potential difference between the sensing electrodes RE and the common voltage line VCL. The second coupling capacitor EMC2 may include a first capacitor electrode ECP1 and a second capacitor electrode ECP2.

The first capacitor electrode ECP1 may be disposed on the first metal layer YML1 of the touch sensing unit TSU. The first capacitor electrode ECP1 may be connected to the sensing electrode RE of the touch sensor area TSA through a contact hole provided in the first insulating layer SIL1. For example, the sensing electrode RE connected to the first capacitor electrode ECP1 may correspond to the sensing line RL or the other end of the sensing electrodes RE disposed farthest from the touch driver 400. The first capacitor electrode ECP1 may be a plate electrode having a predetermined area.

The second capacitor electrode ECP2 may be disposed on the second metal layer YML2 of the touch sensing unit TSU. The second capacitor electrode ECP2 may be connected to the common voltage line VCL disposed in the first metal layer YML1 through a contact hole provided in the first insulating layer SIL1. The second capacitor electrode ECP2 may receive a common voltage from the common voltage line VCL. The second capacitor electrode ECP2 may overlap the first capacitor electrode ECP1, and may be a plate electrode having a predetermined area. The display device 10 may supply a common voltage to the second coupling, capacitor EMC2 using the common voltage line VCL. The display device 10 may stably maintain the potential of the other end of the sensing electrodes RE, and may improve the sensing sensitivity at the other end of the sensing electrodes RE.

A plurality of trace lines TRC may be disposed on the second metal layer YML2. For example, the plurality of trace lines TRC may be disposed on the first insulating layer SIL1. The plurality of trace lines IRC may extend along the touch peripheral area TOA, and may be insulated from the common voltage line VCL or the second coupling capacitor EMC2. A part of the plurality of trace lines TRC may be disposed between the second capacitor electrode ECP2 and the sensing electrode RE, and another part of the plurality of trace lines TRC may be disposed outside the common voltage line VCL. For example, the second capacitor electrode ECP2 may be disposed between pairs of the plurality of trace lines TRC. The plurality of trace lines TRC may transmit a predetermined signal or voltage. Optionally, the plurality of trace lines TRC may be omitted.

Figure 30:
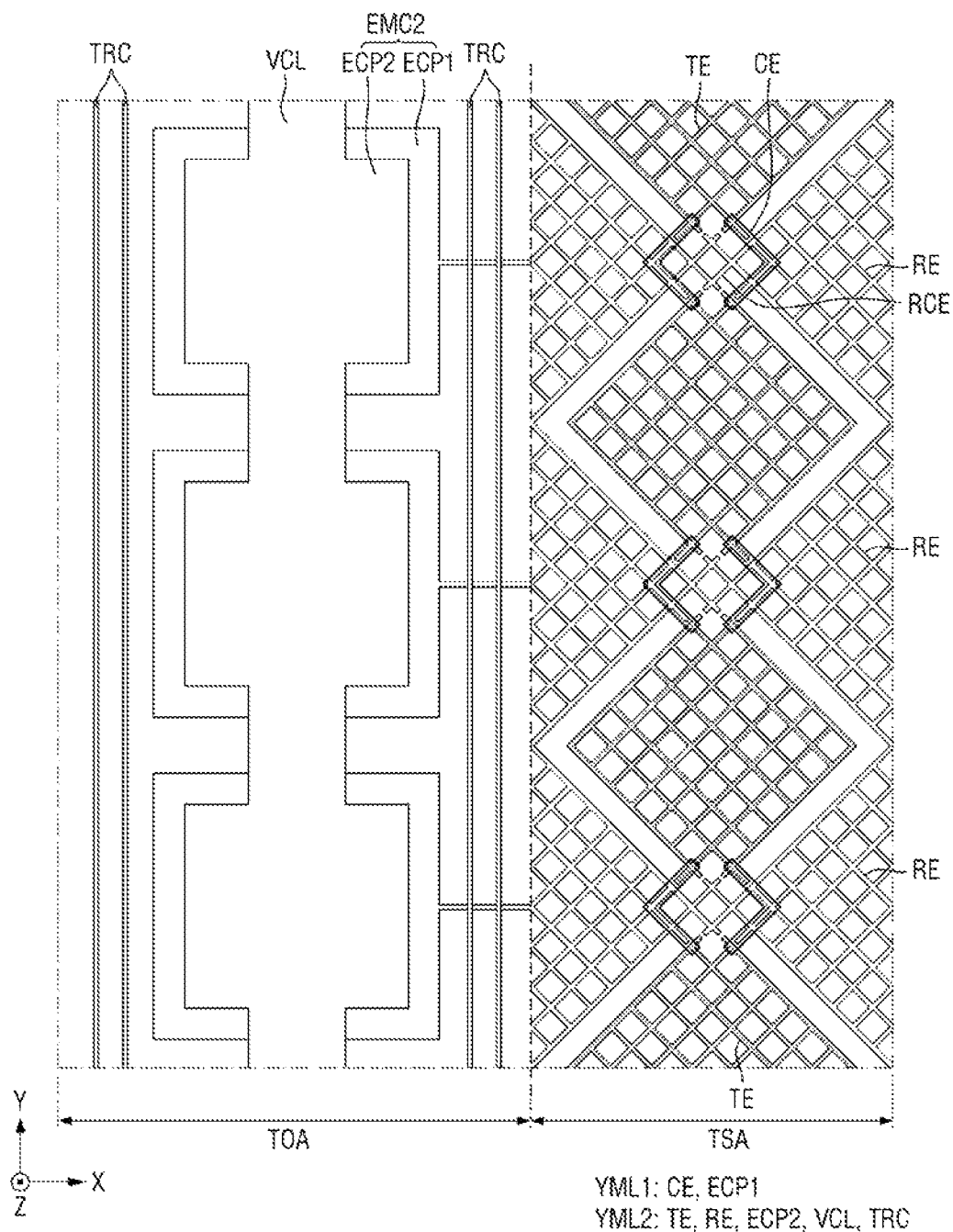
FIG. 30 is a plan view illustrating an example of a touch sensing unit of the display device of FIG. 25.

FIG. 30 is a plan view illustrating yet another example of a touch sensing unit of the display device of FIG. 25.

Referring to FIG. 30, the non-display area NDA and the touch peripheral area TOA may include a second coupling capacitor EMC2. FIG. 30 illustrates the example of the second coupling capacitor EMC2, but the first coupling capacitor EMC1 may also be formed in the same manner as the second coupling capacitor EMC2.

The second coupling capacitor EMC2 may maintain a potential difference between the sensing electrodes RE and the common voltage line VCL. The second coupling capacitor EMC2 may include a first capacitor electrode ECP1 and a second capacitor electrode ECP2. The first capacitor electrode ECP1 may be disposed on the first metal layer YML1 of the touch sensing unit TSU. The first capacitor electrode ECP1 may be connected to the sensing electrode RE of the touch sensor area TSA. This connection is illustrated by the three horizontal portions connecting the first capacitor electrode ECP1 to the sensing electrodes RE. For example, the sensing electrode RE connected to the first capacitor electrode ECP1 may correspond to the sensing line RE or the other end of the sensing electrodes RE disposed farthest from the touch driver 400. The first capacitor electrode ECP1 may be a plate electrode having a predetermined area. The plurality of first capacitor electrodes ECP1 corresponding to each of the plurality of sensing electrodes RE may be spaced apart from each other in the Y-axis direction. For example, one first capacitor electrode ECP1 may correspond to the sensing electrodes RE connected to one sensing line RL, but is not limited thereto.

The second capacitor electrode ECP2 may be disposed on the second metal layer YML2 of the touch sensing unit TSU. The second capacitor electrode ECP2 and the common voltage line VCL may be integrally formed and disposed on the second metal layer YML2. The common voltage line VCL may extend in the Y-axis direction, and the second capacitor electrode ECP2 may correspond to a portion of the common voltage line VCL that overlaps the first capacitor electrode ECP1. The plurality of second capacitor electrodes ECP2 may be connected to each other by the common voltage line VCL. The length of the second capacitor electrode ECP2 in the X-axis direction may be greater than the length of the common voltage line VCL in the X-axis direction, but is not limited thereto. The second capacitor electrode ECP2 may receive a common voltage from the common voltage line VCL. The display device 10 may supply a common voltage to the second coupling capacitor EMC2 using the common voltage line VCL. The display device 10 may stably maintain the potential of the other end of the sensing electrodes RE, and may improve the sensing sensitivity at the other end of the sensing electrodes RE.

A plurality of trace lines TRC may be disposed on the second metal layer YML2. The plurality of trace lines TRC may extend along the touch peripheral area TOA, and may be insulated from the common voltage line VCL or the second coupling capacitor EMC2. A part of the plurality of trace lines TRC may be disposed between the second coupling capacitor EMC2 and the sensing electrode RE, and another part of the plurality of trace lines TRC may be disposed outside the common voltage line VCL. The plurality of trace lines TRC may transmit a predetermined signal or voltage. Optionally, the plurality of trace lines TRC may be omitted.

Figure 31:
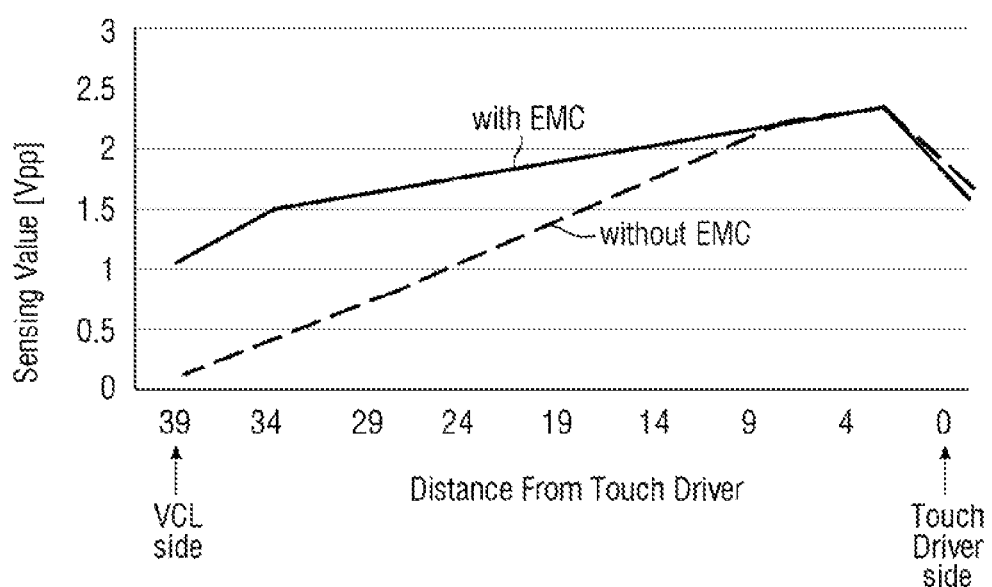
FIG. 31 is a graph illustrating sensing sensitivity of a sensing system according to an embodiment of the present disclosure.

FIG. 31 is a graph illustrating sensing sensitivity of a sensing system according to an embodiment of the present disclosure.

Referring to FIG. 31, when the touch sensing unit TSU does not include the coupling capacitor EMC (without the EMC), the potential of the other end of the touch electrodes SEN may be unstable. In this case, a sensing value by the touch electrodes SEN adjacent to the touch driver 400 may be relatively high (touch driver side), and a sensing value by the touch electrodes SEN spaced far apart from the touch driver 400 may be relatively low (VCL side). Accordingly, when the touch sensing unit TSU does not include the coupling capacitor EMC (without the EMC), a difference in sensing sensitivity may occur according to the positions of the touch electrodes SEN.

When the touch sensing unit TSU includes the coupling capacitor EMC (with the EMC), the plurality of coupling capacitors EMC may stably maintain the potential of the other end of the touch electrodes SEN. In this case, a value sensed by the touch electrodes SEN spaced far apart from the touch driver 400 may be relatively increased (VCL side). Accordingly, when the touch sensing unit TSU includes the coupling capacitor EMC (with the EMC), the sensing sensitivity by the touch electrodes SEN adjacent to the common voltage line VCL may be improved (VCL side). The display device 10 may include the coupling capacitor EMC and the common voltage line VCL disposed in the touch peripheral area TOA, so that the reliability of the sensor may be secured over the entire area of the touch sensor area TSA.

Figure 32:
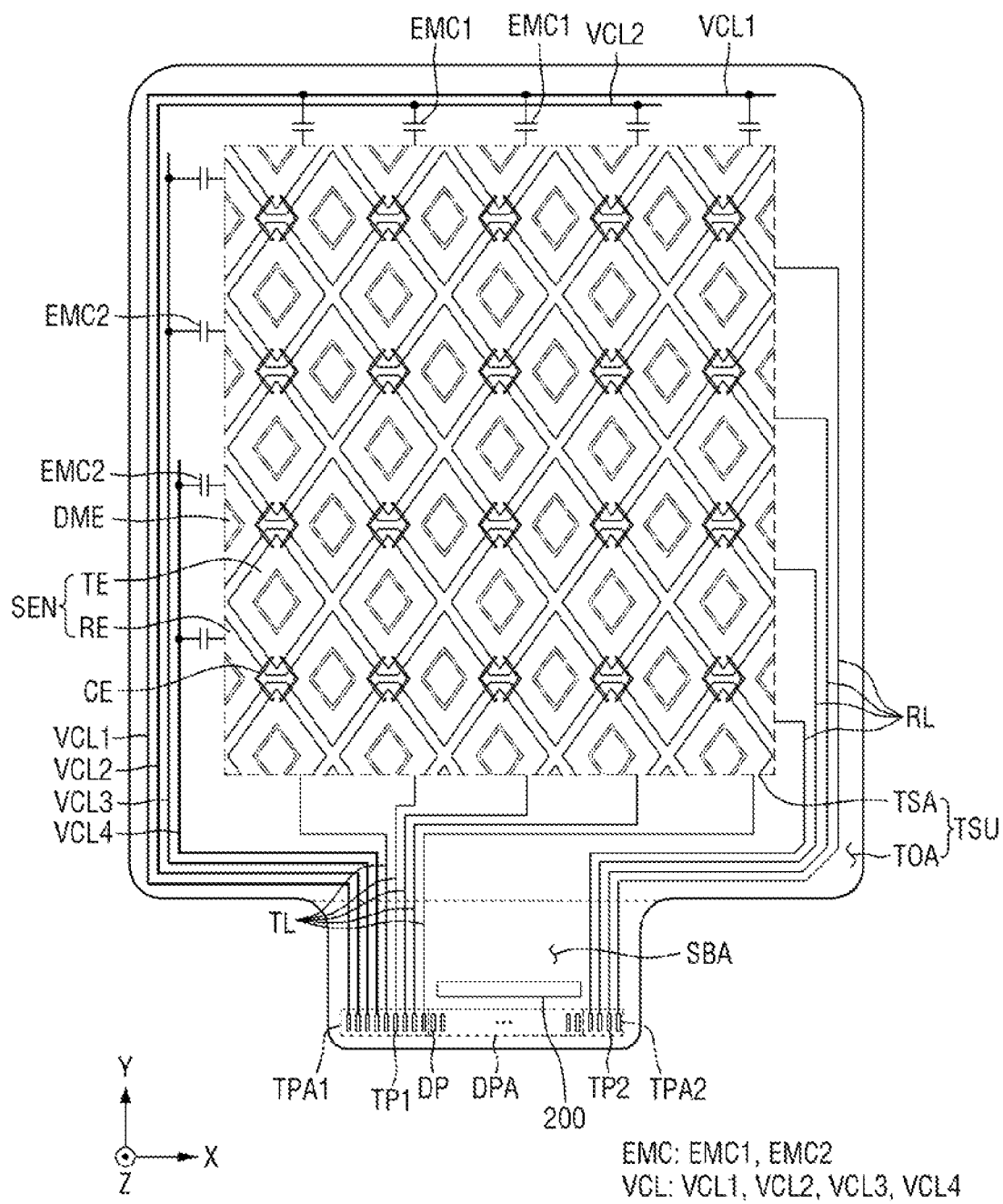
FIG. 32 is a plan view illustrating a touch sensing unit of a display device according to an embodiment of the present disclosure.

FIG. 32 is a plan view illustrating a touch sensing unit of a display device according to an embodiment of the present disclosure. The touch sensing unit TSU of FIG. 32 has different configurations of the coupling capacitor EMC and the common voltage line VCL from the touch sensing unit TSU of FIG. 25, and the same configuration as the above-described configuration of FIG. 25 will be briefly described or omitted.

Referring to FIG. 32, the touch sensor area TSA may include a plurality of touch electrodes SEN and a plurality of dummy electrodes DME, The plurality of touch electrodes SEN may, include a plurality of driving electrodes TE and a plurality of sensing electrodes RE.

The touch peripheral area TOA may include the driving line TL, the sensing line RL, a plurality of coupling capacitors EMC, and the plurality of the common voltage line VCL.

The plurality of coupling capacitors EMC may include a first coupling capacitor EMC1. and a second coupling capacitor EMC2. The first coupling capacitor EMC1 may be disposed on the upper side of the touch peripheral area TOA. The first coupling capacitor EMC1 may be disposed on the opposite side of the driving line TL. The first coupling capacitor EMC1 may be connected to the driving electrodes TE disposed farthest from the driving line TL. A part of the plurality of first coupling capacitors EMC1 may be disposed between the driving electrodes TE and the first common voltage line VCL1. In other words, first portion of the plurality of first coupling capacitors EMC1 may be disposed between the driving electrodes TE and the first common voltage line VCL1. Another part of the plurality of first coupling capacitors EMC1 may be disposed between the driving electrodes TE and the second common voltage line VCL2. In other words, a second portion of the plurality of first coupling capacitors EMC1 may be disposed between the driving electrodes TE and the second common voltage line VCL2. For example, the plurality of first coupling capacitors EMC1 may be alternately connected to the first or second common voltage line VCL1 or VCL2 according to a disposed order, but the present disclosure is not limited thereto. Accordingly, the first coupling capacitor EMC1 may maintain a potential difference between the first or second common voltage line VCL1 or VCL2 and the driving electrodes TE.

The second coupling capacitor EMC2 may be disposed on the left side of the touch peripheral area TOA. The second coupling capacitor EMC2 may be disposed on the opposite side of the sensing line RL. The second coupling capacitor EMC2 may be connected to the sensing electrodes RE disposed farthest from the sensing line RL. A part of the plurality of second coupling capacitors EMC2 may be disposed between the sensing electrodes RE and a third common voltage line VCL3. In other words, a first portion of the plurality of second coupling capacitors EMC2 may be disposed between the sensing electrodes RE and a third common voltage line VCL3. Another part of the plurality of second coupling capacitors EMC2 may be disposed between the sensing electrodes RE and a fourth common voltage line VCL4. In other words, a second portion of the plurality of second coupling capacitors EMC2 may be disposed between the sensing electrodes RE and a fourth common voltage line VCL4. For example, the second coupling capacitors EMC2 disposed on the upper side may be connected to the third common voltage line VCL3, and the second coupling capacitors EMC2 disposed on the lower side may be connected to the fourth common voltage line VCL4, but the present disclosure is not limited thereto. Accordingly, the second coupling capacitor EMC2 may maintain a potential difference between the third or fourth common voltage line VCL3 or VCL4 and the sensing electrodes RE.

The common voltage line VCL may be disposed along the periphery of the touch peripheral area TOA. The common voltage line VCL may include the first to fourth common voltage lines VCL1, VCL2, VCL3, and VCL4. The first and second common voltage lines VCL1 and VCL2 may extend to the first touch pad unit TP1 via the upper side, the left side, and the lower side of the touch peripheral area TOA. The first and second common voltage lines VCL1 and VCL2 may be connected to the other end of the plurality of first coupling capacitors EMC1.

The third and fourth common voltage lines VCL3 and VCL4 may extend to the first touch pad unit TP1 via the left side and the lower side of the touch peripheral area TOA. The third and fourth common voltage lines VCL3 and VCL4 may be connected to the other end of the plurality of second coupling capacitors EMC2. For example, the common voltage of the first to fourth common voltage lines VCL1, VCL2, VCL3, and VCL4 may be the same as the common voltage supplied to the display unit DU, but is not limited thereto. For another example, the common voltage of at least one of the first to fourth common voltage lines VCL1, VCL2, VCL3, and VCL4 may be different. A common voltage of a part of the first to fourth common voltage lines VCL1, VCL2, VCL3, and VCL4 may have a constant potential, and a common voltage of another part of the first to fourth common voltage lines VCL1, VCL2, VCL3 and VCL4 may be a sine wave, a pulse wave, or a ramp wave having a predetermined frequency.

One end of the plurality of driving electrodes TE may be connected to the driving line TL, and the other end of the plurality of driving electrodes TE may be connected to the first coupling capacitor EMC1. The first coupling, capacitor EMC1 may maintain a potential difference between the first or second common voltage line VCL1 or VCL2, and the other end of the driving electrodes TE, and thus may stably maintain the potential of the other end of the driving electrodes TE. The first coupling capacitor EMC1 may improve sensing sensitivity at the other end of the driving electrodes TE.

One end of the plurality of sensing electrodes RE may be connected to the sensing line RL, and the other end of the plurality of sensing electrodes RE may be connected to the second coupling capacitor EMC2. The second coupling capacitor EMC2 may maintain a potential difference between the third or fourth common voltage line VCL3 or VCL4, and the other end of the sensing electrodes RE, and thus may stably maintain the potential of the other end of the sensing electrodes RE. The second coupling capacitor EMC2 may improve sensing sensitivity at the other end of the sensing electrodes RE.

Accordingly, the display device 10 may include the coupling capacitor EMC and the common voltage line VCL disposed in the touch peripheral area TOA, so that the reliability of the sensor may be secured over the entire area of the touch sensor area TSA.

The display device 10 may sense the touch of the input member 20 by using the touch sensing unit TSU that senses the touch of the user's body. The display device 10 may sense a touch of the user's body during the touch sensing period FTS using the touch sensing unit TSU, and may sense the approach or contact of the input member 20 such as an input pen during the electromagnetic sensing period EMR. Accordingly, the display device 10 may not include a separate sensor layer or a digitizer layer for the electromagnetic resonance of the input member 20, so that the thickness of the display device 10 may be decreased, and the costs may be reduced.

Figure 33:
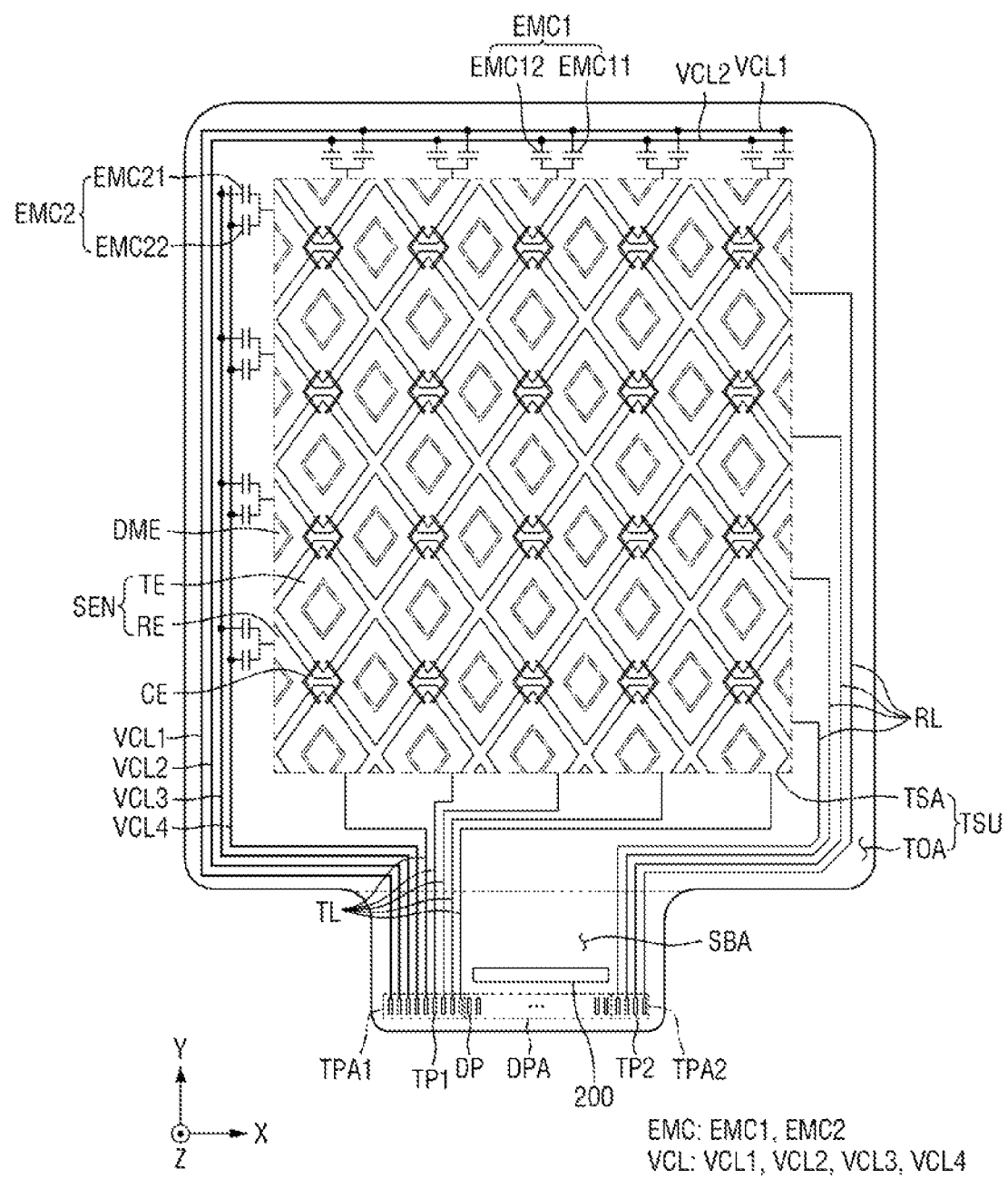
FIG. 33 is a plan view illustrating a touch sensing unit of a display device according to an embodiment of the present disclosure.

FIG. 33 is a plan view illustrating a touch sensing unit of a display device according to an embodiment of the present disclosure. The touch sensing unit TSU of FIG. 33 has a different configuration of the coupling capacitor EMC from the touch sensing unit TSU of FIG. 32, and the same configuration as the above-described configuration of FIG. 32 will be briefly described or omitted.

Referring to FIG. 33, the touch sensor area TSA may include the plurality of touch electrodes SEN and the plurality of dummy electrodes DME. The plurality of touch electrodes SEN may include a plurality of driving electrodes TE and a plurality of sensing electrodes RE.

The touch peripheral area TOA may include the driving line TL, the sensing line RL, a plurality of coupling capacitors EMC, and the plurality of the common voltage line VCL.

The plurality of coupling capacitors EMC may include a first coupling capacitor EMC1 and a second coupling capacitor EMC2. The first coupling capacitor EMC1 may include a first-first coupling capacitor EMC11 and a first-second coupling capacitor EMC12. The first-first and first-second coupling capacitors EMC11 and EMC12 may be disposed on the upper side of the touch peripheral area TOA.

The first-first and first-second coupling capacitors EMC11 and EMC12 may be disposed on the opposite side of the driving line The first-first and first-second coupling capacitors EMC11 and EMC12 may be connected to the driving electrodes TE disposed farthest from the driving line TL. The first-first coupling capacitor EMC11 may be disposed between the driving electrodes TE and the first common voltage line VCL1. The first-second coupling capacitor EMC12 may be disposed between the driving electrode TE connected to the first-first coupling capacitor EMC11 and the second common voltage line VCL2. One driving electrode TE may be connected to each of the first-first and first-second coupling capacitors EMC11 and EMC12. Accordingly, the first coupling capacitor EMC1 may maintain a potential difference between the first or second common voltage line VCL1 or VCL2 and the driving electrodes TE.

The second coupling capacitor EMC2 may include a second-first coupling capacitor. EMC21 and a second-second coupling capacitor EMC22. The second-first and second-second coupling capacitors EMC21 and EMC22 may be disposed on the left side of the touch peripheral area TOA. The second-first and second-second coupling capacitors EMC21 and EMC22 may be disposed on the opposite side of the sensing line RL. The second-first and second-second coupling capacitors EMC21 and EMC22 may be connected to the sensing electrodes RE disposed farthest from the sensing line RL. The second-first coupling capacitor EMC21 may be disposed between the sensing electrodes RE and the third common voltage line VCL3. The second-second coupling capacitor EMC22 may be disposed between the sensing electrode RE connected to the second-first coupling capacitor EMC21 and the fourth common voltage line VCL4. One sensing electrode RE may be connected to each of the second-first and second-second coupling capacitors EMC21 and EMC22. Accordingly, the second coupling capacitor EMC2 may maintain a potential difference between the third or fourth common voltage line VCL3 or VCL4 and the sensing electrodes RE.

One end of the plurality of driving electrodes TE may be connected to the driving line TL, and the other end of the plurality of driving electrodes TE may be connected to the first coupling capacitor EMC1. The first coupling capacitor EMC1 may maintain a potential difference between the first or second common voltage line VCL1 or VCL2, and the other end of the driving electrodes TE, and thus may stably maintain the potential of the other end of the driving electrodes TE. The first coupling capacitor EMC1 may improve sensing sensitivity at the other end of the driving electrodes TE.

One end of the plurality of sensing electrodes RE may be connected to the sensing line RL, and the other end of the plurality of sensing electrodes RE may be connected to the second coupling capacitor EMC2. The second coupling capacitor EMC2 may maintain a potential difference between the third or fourth common voltage line VCL3 or VCL4, and the other end of the sensing electrodes RE, and thus may stably maintain the potential of the other end of the sensing electrodes RE. The second coupling capacitor EMC2 may improve sensing sensitivity at the other end of the sensing electrodes RE.

Accordingly, the display device 10 may include the coupling capacitor EMC and the common voltage line VCL disposed in the touch peripheral area TOA, so that the reliability of the sensor may be secured over the entire area of the touch sensor area TSA.

The display device 10 may sense the touch of the input member 20 by using the touch sensing unit TSU that senses the touch of the user's body. The display device 10 may sense a touch of the user's body during the touch sensing period FTS using the touch sensing unit TSU, and may sense the approach or contact of the input member 20 such as an input pen during the electromagnetic sensing period EMR. Accordingly, the display device 10 may not include a separate sensor layer or a digitizer layer for the electromagnetic resonance of the input member 20, so that the thickness of the display device 10 may be decreased, and the costs may be reduced.

Figure 34:
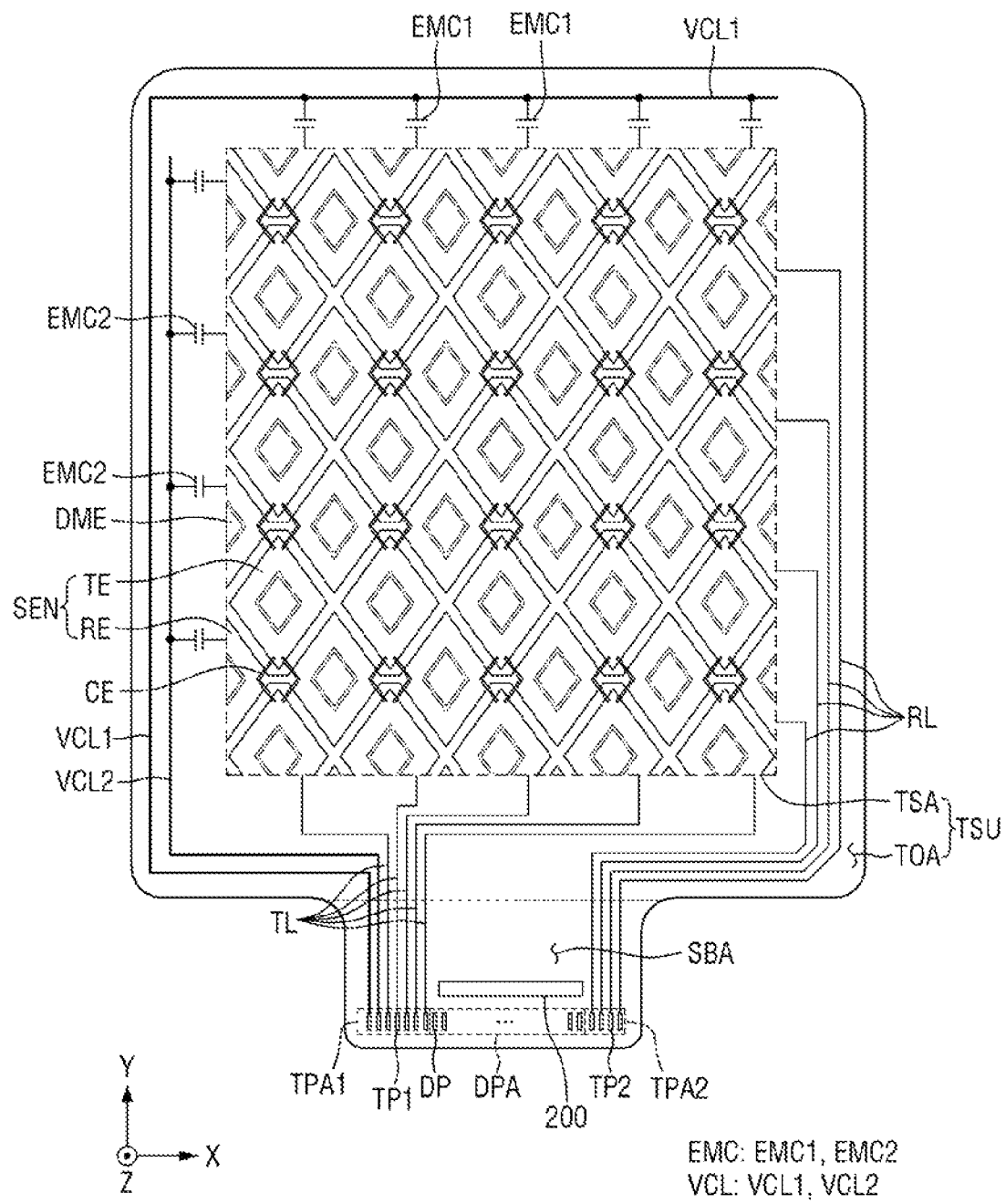
FIG. 34 is a plan view illustrating a touch sensing unit of a display device according to an embodiment of the present disclosure.
Figure 35:
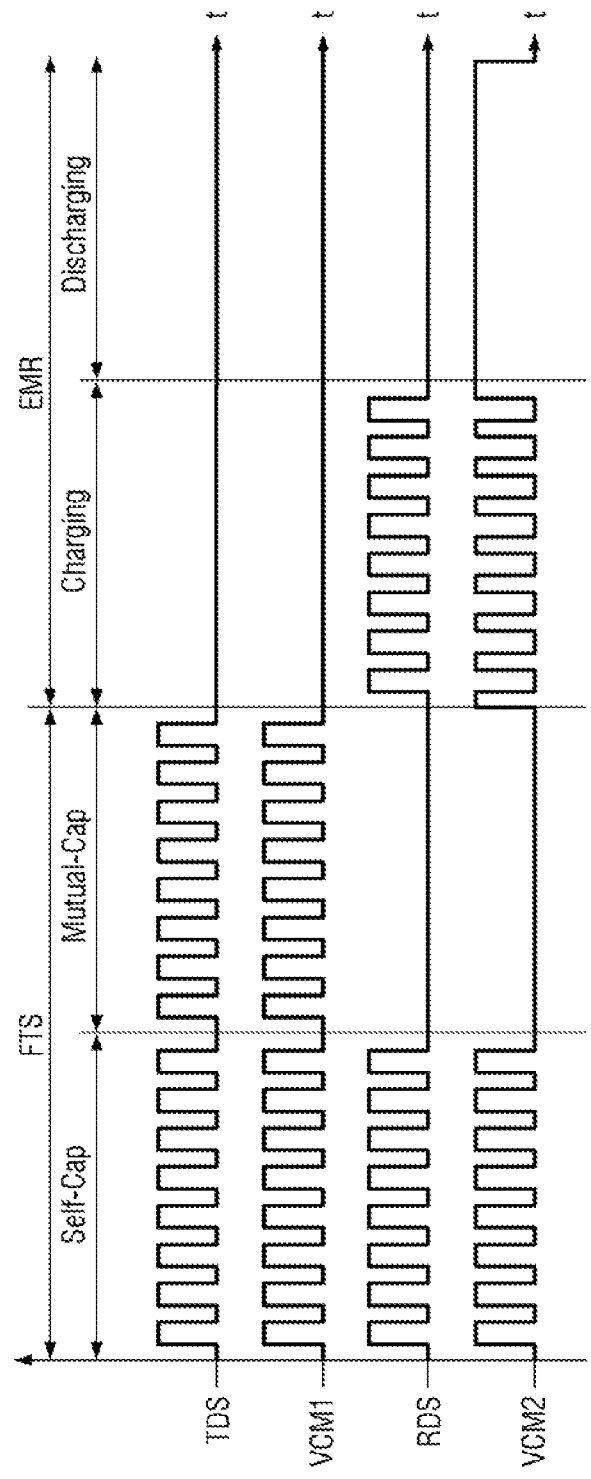
FIG. 35 is a waveform diagram illustrating a signal applied to the touch sensing unit of FIG. 34.

FIG. 34 is a plan view illustrating a touch sensing unit of a display device according to an embodiment of the present disclosure, and FIG. 35 is a waveform diagram illustrating a signal applied to the touch sensing unit of FIG. 34.

Referring to FIGS. 34 and 35, the touch sensor area TSA may include the plurality of touch electrodes SEN and the plurality of dummy electrodes DME The plurality of touch electrodes SEN may include a plurality of driving electrodes TE and a plurality of sensing electrodes RE.

The touch peripheral area TOA may include the driving line TL, the sensing line RL, a plurality of coupling capacitors EMC, and the plurality of the common voltage line VCL.

The plurality of coupling capacitors EMC may include a first coupling capacitor EMC1. and a second coupling capacitor EMC2. The first coupling capacitor EMC1 may be disposed on the upper side of the touch peripheral area TOA. The first coupling capacitor EMC1 may be disposed on the opposite side of the driving line TL. The first coupling capacitor EMC1 may be connected to the driving electrodes TE disposed farthest from the driving line TL. The plurality of first coupling capacitors EMC1 may be disposed between the driving electrodes TE and the first common voltage line VCL1. Accordingly, the first coupling capacitor EMC1 may maintain a potential difference between the first common voltage line VCL1 and the driving electrodes TE.

The second coupling capacitor EMC2 may be disposed on the left side of the touch peripheral area TOA. The second coupling capacitor EMC2 may be disposed on the opposite side of the sensing line RL. The second coupling capacitor EMC2 may be connected to the sensing electrodes RE disposed farthest from the sensing line RL. The plurality of second coupling, capacitors EMC2 may be disposed between the sensing electrodes RE and the second common voltage line VCL2. Accordingly, the second coupling capacitor EMC2 may maintain a potential difference between the second common voltage line VCL2 and the sensing electrodes RE.

The touch driver 400, during the self-capacitance sensing period Self-Cap of the touch sensing period FTS, may supply the plurality of first driving signals TDS having a first phase to the plurality of driving electrodes TE, and may supply the plurality of second driving signals RDS having, a first phase to the plurality of sensing electrodes RE. The touch driver 400, during the self-capacitance sensing period Self-Cap of the touch sensing period FTS, may supply a first common voltage VCM1 having a first phase to the first common voltage line VCL1, and may supply a second common voltage VCM2 having a first phase to the second common voltage line VCL2. Accordingly, the plurality of first driving signals TDS and the first common voltage VCM1 may have the same phase, and the plurality of second driving signals RDS and the second common voltage VCM2 may have the same phase, so that the touch driver 400 may stably maintain the potential of the other end of the driving, electrodes TE and the potential of the other end of the sensing electrodes RE. The touch driver 400 may sense an amount of change of the self-capacitance of each of the plurality of driving electrodes TE and the plurality of sensing electrodes RE by receiving the sensing signal from each of the plurality of driving electrodes TE and the plurality of sensing electrodes R during the self-capacitance sensing period Self-Cap of the touch sensing period FTS.

The touch driver 400 may supply the plurality of first driving signals IDS having the first phase to the plurality of driving electrodes TE during the mutual capacitance sensing period Mutual-Cap of the touch sensing period FTS. The touch driver 400 may supply the first common voltage VCM1 having the first phase to the first common voltage line VCL1 during the mutual capacitance sensing period Mutual-Cap of the touch sensing period FTS. Accordingly, the plurality of first driving signals TDS and the first common voltage VCM1 may have the same phase, so that the touch driver 400 may stably maintain the potential of the other end of the driving electrodes TE. The touch driver 400 may sense an amount of change of the mutual capacitance between the plurality of driving electrodes TE and the plurality of sensing electrodes RE by receiving the sensing signal from the plurality of sensing electrodes RE during the mutual capacitance sensing period Mutual-Cap of the touch sensing period FTS.

The touch driver 400 may supply the second driving signal RDS having the first phase to the plurality of sensing electrodes RE during the charging period of the electromagnetic sensing period EMR. The touch driver 400 may supply the second common voltage VCM2 having the second phase to the second common voltage line VCL2 during the charging period of the electromagnetic sensing, period EMR. The first phase of the second driving signal RDS and the second phase of the second common voltage VCM2 may be opposite to each other. Accordingly, the potential difference across both ends of the second coupling capacitor EMC2 may be doubled compared to a case where the second common voltage VCM2 has a constant potential. A current flowing through the second coupling capacitor EMC2 may be doubled compared to a case where the second common voltage VCM2 has a constant potential. The second coupling capacitor EMC2 may improve sensing sensitivity at the other end of the sensing electrodes RE.

The touch driver 400 may supply the second common voltage VCM2 to the second common voltage line VCL2 during the discharging period of the electromagnetic sensing period EMR. The second common voltage VCM2 may have a constant potential during the discharging period of the electromagnetic sensing period EMR. The touch driver 400 may generate a differential sensing signal SER by amplifying a voltage difference between sensing signals received from the plurality of sensing electrodes RE. The touch driver 400 may determine whether the input of the input member 20 has been made based on the differential sensing signal SER.

Accordingly, the display device 10 may supply the second driving signal RDS having a first phase and the second common voltage VCM2 having a second phase opposite to the first phase during the charging period of the electromagnetic sensing period EMR, so that the sensing sensitivity at the other end of the sensing electrodes RE may be improved. The display device 10 may sense the touch of the input member 20 by using the touch sensing unit TSU that senses the touch of the user's body, and may increase the reliability of the sensor over the entire area of the touch sensor area TSA.

Figure 36:
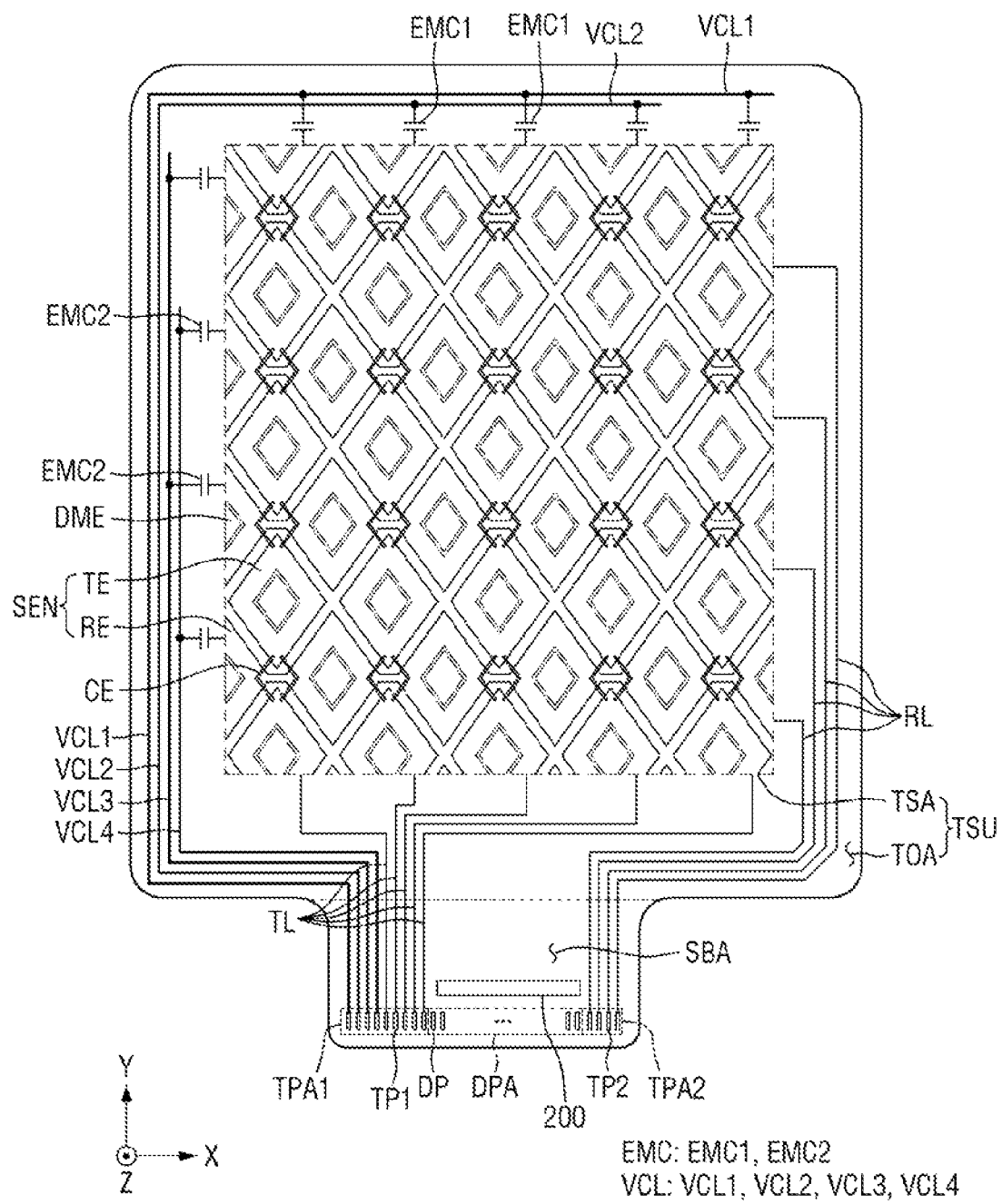
FIG. 36 is a plan view illustrating a touch Sensing unit of a display device according to an embodiment of the present disclosure.
Figure 37:
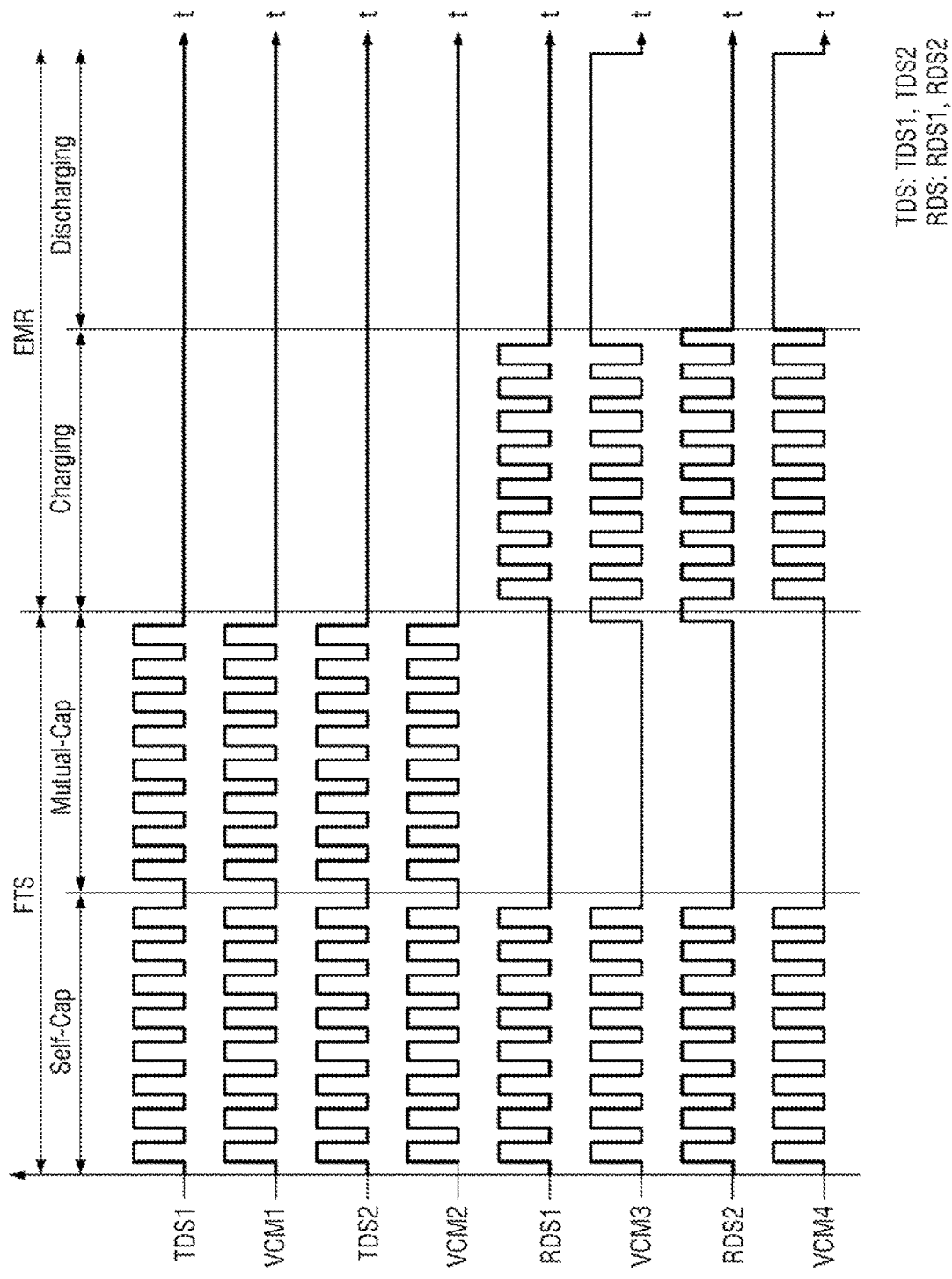
FIG. 37 is a waveform diagram illustrating a signal applied to the touch sensing unit of FIG. 36.

FIG. 36 is a plan view illustrating a touch sensing unit of a display device according to an embodiment of the present disclosure, and FIG. 37 is a waveform diagram illustrating a signal applied to the touch sensing unit of FIG. 35.

Referring to FIGS. 36 and 37, the touch sensor area ISA may include the plurality of touch electrodes SEN and the plurality of dummy electrodes DME. The plurality of touch electrodes SEN may include a plurality of driving electrodes TE and a plurality of sensing electrodes RE.

The touch peripheral area TOA may include the driving line TL, the sensing line RL, a plurality of coupling capacitors EMC, and the plurality of the common voltage line VCL.

The plurality of coupling capacitors EMC may include a first coupling capacitor EMC1 and a second coupling capacitor EMC2. The first coupling capacitor EMC1 may be disposed on the upper side of the touch peripheral area TOA. The first coupling capacitor EMC1 may be disposed on the opposite side of the driving line TL. The first coupling capacitor EMC1 may be connected to the driving electrodes TE disposed farthest from the driving line TL. A part (or first portion) of the plurality of first coupling capacitors EMC1 may be disposed between the driving electrodes TE and the first common voltage line VCL1. Another part (or second portion) of the plurality of first coupling capacitors EMC1 may be disposed between the driving electrodes TE and the second common voltage line VCL2. For example, the plurality of first coupling capacitors EMC may be alternately connected to the first or second common voltage line VCL1 or VCL2 according to a disposed order, but the present disclosure is not limited thereto. Accordingly, the first coupling capacitor EMC1 may maintain a potential difference between the first or second common voltage line VCL1 or VCL2 and the driving electrodes TE.

The second coupling capacitor EMC2 may be disposed on the left side of the touch peripheral area TOA. The second coupling capacitor EMC2 may be disposed on the opposite side of the sensing line RL. The second coupling capacitor EMC2 may be connected to the sensing electrodes RE disposed farthest from the sensing line RL. A part (or first portion) of the plurality of second coupling capacitors EMC2 may be disposed between the sensing electrodes RE and a third common voltage line VCL3. Another part (or second portion) of the plurality of second coupling capacitors EMC2 may be disposed between the sensing electrodes RE and a fourth common voltage line VCL4. For example, the plurality of second coupling capacitors EMC2 may be alternately connected to the third or fourth common voltage line VCL3 or VCL4 according to a disposed order, but the present disclosure is not limited thereto. Accordingly, the second coupling capacitor EMC2 may maintain a potential difference between the third or fourth common voltage line VCL3 or VCL4 and the sensing electrodes RE.

The touch driver 400, during the self-capacitance sensing period Self-Cap of the touch sensing period FTS, may supply the plurality of first driving signals TDs having a first phase to the plurality of driving electrodes TE, and may supply the plurality of second driving signals RDS having a first phase to the plurality of sensing electrodes RE. The touch driver 400, during the self-capacitance sensing period Self-Cap of the touch sensing period FTS, may supply a first common voltage VCM1 having a first phase to the first common voltage line VCL1, and may supply a second common voltage VCM2 having a first phase to the second common voltage line VCL2. The touch driver 400, during the self-capacitance sensing period Self-Cap of the touch sensing period FTS, may supply a third common voltage VCM3 having a first phase to the third common voltage line VCL3, and may supply a fourth common voltage VCM4 having a first phase to the fourth common voltage line VCL4. Accordingly, the plurality of first driving signals TDS and the first or second common voltage VCM1 or VCM2 may have the same phase, and the plurality of second driving signals RDS and the third or fourth common voltage VCM3 or VCM4 may have the same phase, so that the touch driver 400 may stably maintain the potential of the other end of the driving electrodes TE and the potential of the other end of the sensing electrodes RE. The touch driver 400 may sense an amount of change of the self-capacitance of each of the plurality of driving electrodes TE and the plurality of sensing electrodes RE by receiving the sensing signal from each of the plurality of driving electrodes TE and the plurality of sensing electrodes RE during the self-capacitance sensing period Self-Cap of the touch sensing period FTS.

The touch driver 400 may supply the plurality of first driving signals TDS having the first phase to the plurality of driving electrodes TE during the mutual capacitance sensing period Mutual-Cap of the touch sensing period FTS. The touch driver 400, during the mutual-capacitance sensing period Self-Cap, may supply a first common voltage VCM1 having a first phase to the first common voltage line VCL1, and may supply a second common voltage VCM2 having a first phase to the second common voltage line VCL2. Accordingly, the plurality of first driving signals TDS and the first or second common voltage VCM1 or VCM2 may have the same phase, so that the touch driver 400 may stably maintain the potential of the other end of the driving electrodes TE. The touch driver 400 may sense an amount of change of the mutual capacitance between the plurality of driving electrodes TE and the plurality of sensing electrodes RE by receiving the sensing signal from the plurality of sensing electrodes RE during the mutual capacitance sensing period Mutual-Cap of the touch sensing period FTS. The third or fourth common voltage VCM3 or VCM4 may not be applied during the mutual capacitance sensing period Mutual-Cap of the touch sensing period FTS. Similarly, the second driving signals RDS may not be applied during the mutual capacitance sensing period Mutual-Cap of the touch sensing period FTS.

The touch driver 400, during the charging period of the electromagnetic sensing period EMR, may supply a second-first driving signal RDS1 having a first phase to one sensing electrode RE among the plurality of sensing electrodes RE, and may supply a second-second driving signal RDS2 having a second phase to the other sensing electrode RE among the plurality of sensing electrodes RE. Here, the sensing electrode RE receiving the second-first driving signal RDS1 may be the sensing electrode RE disposed on one side of the specific point PT, and the sensing electrode RE receiving the second-second driving signal RDS2 may be the sensing electrode RE disposed on the other side of the specific point PT. The first phase of the second-first driving signal RDS1 and the second phase of the second-second driving signal RDS2 may be opposite to each other. Accordingly, the direction of the magnetic field of each of the sensing electrodes RE disposed on both sides of the specific point PT may coincide at the specific point PT, so that a magnetic field may be generated according to the constructive interference of the magnetic field, to charge the input member 20.

The touch driver 400, during the charging period, may supply the third common voltage VCM3 having a second phase to the third common voltage line VCL3, and may supply the fourth common voltage VCM4 having a first phase to the fourth common voltage line VCL4. The first phase of the second-first driving signal RDS1 and the second phase of the third common voltage VCM3 may be opposite to each other. A second phase of the second-second driving signal RDS2 and a first phase of the fourth common voltage VCM4 may be opposite to each other. Accordingly, the potential difference across both ends of the second coupling capacitor EMC2 may be doubled compared to a case where the third or fourth common voltage VCM3 or VCM4 has a constant potential. The current flowing through the second coupling capacitor EMC2 may be doubled compared to a case where the third or fourth common voltage VCM3 or VCM4 has a constant potential. The second coupling capacitor EMC2 may improve sensing sensitivity at the other end of the sensing electrodes RE.

The touch driver 400, during the discharging period of the electromagnetic sensing period EMR, may supply the third common voltage VCM3 to the third common voltage line VCL3, and may supply the fourth common voltage VCM4 to the fourth common voltage line VCL4. During the discharging period, each of the third and fourth common voltage lines VCL3 and VCL4 may have a constant potential. The touch driver 400 may receive a first sensing signal from the sensing electrode RE disposed on one side of the specific point PT, and may receive a second sensing signal from the sensing electrode RE disposed on the other side of the specific point PT. The touch driver 400 may determine whether the input of the input member 20 has been made based on the differential sensing signal SER obtained by amplifying the voltage difference between the first and second sensing signals.

Accordingly, the display device 10, during the charging period of the electromagnetic sensing period EMR, may supply the second-first driving signal RDS1 having a first phase and the second-second driving signal RDS2 having a second phase, the third common voltage VCM3 having the second phase, and the fourth common voltage VCM4 having the first phase, so that the sensing sensitivity at the other end of the sensing electrodes RE may be improved. The display device 10 may sense the touch of the input member 20 by using the touch sensing unit TSU that senses the touch of the user's body, and may increase the reliability of the sensor over the entire area of the touch sensor area TSA.

What is claimed is:
1. A display device, comprising:
a display unit having a plurality of pixels;
a plurality of touch electrodes disposed on the display unit;
a touch line connected to a first end of each of the plurality of touch electrodes;
a common voltage line spaced apart from the plurality of touch electrodes; and
a plurality of switching elements connected between the common voltage line and a second end of each of the plurality of touch electrodes,
wherein the plurality of touch electrodes comprise a driving electrode extending in a first direction, and a sensing electrode extending in a second direction crossing the first direction,
wherein the touch line comprises a driving line connected to a first end of the driving electrode, and a sensing line connected to a first end of the sensing electrode,
wherein the plurality of switching elements comprise:
a first switching transistor connected to a second end of the driving electrode; and a second switching transistor connected to a second end of the sensing electrode.

2. The display device of claim 1, further comprising a touch driver configured to sense an input of a user's body by driving the plurality of touch electrodes during a first period, and to sense an input of an input device by driving the plurality of touch electrodes during a second period different from the first period.

3. The display device of claim 2, further comprising a display driver configured to display an image by driving the plurality of pixels during a display period,
wherein the display period overlaps the first and second periods.

4. The display device of claim 2, further comprising an electromagnetic control line connected to a gate electrode of each of the plurality of switching elements.

5. The display device of claim 4, wherein the electromagnetic control line supplies a control signal of a gate-off level to the plurality of switching elements during the first period, and supplies a control signal of a gate-on level to the plurality of switching elements during the second period.

6. The display device of claim 1, wherein the display unit comprises:
a substrate;
a thin film transistor layer disposed on the substrate and comprising a plurality of thin film transistors and the plurality of switching elements; and
a light emitting element layer disposed on the thin film transistor layer and comprising a plurality of light emitting elements,
wherein the plurality of switching elements are connected to the second end of each of the plurality of touch electrodes through at least one connection electrode.

7. The display device of claim 1, wherein the plurality of touch electrodes comprises:
a driving electrode extending in a first direction in a first metal layer;
a sensing electrode extending in a second direction crossing the first direction in the first metal layer; and
a bridge electrode connecting the driving electrode in a second metal layer different from the first metal layer,
wherein the common voltage line is disposed in the thin film transistor layer, the first metal layer, or the second metal layer.

8. The display device of claim 1, wherein the common voltage line comprises a first common voltage line and a second common voltage line,
wherein the first switching transistor is connected between the first common voltage line and the second end of the driving electrode; and
the second switching transistor is connected between the second common voltage line and the second end of the sensing electrode.

9. The display device of claim 8, further comprising:
a first electromagnetic control line connected to a gate electrode of each of the plurality of first switching transistors; and
a second electromagnetic control line connected to a gate electrode of each of the plurality of second switching transistors,
wherein the first electromagnetic control line supplies a first control signal of a gate-on level to the plurality of first switching transistors during a first period, and
the second electromagnetic control line supplies a second control signal of a gate-on level to the plurality of second switching transistors during a second period after the first period.

10. The display device of claim 1, further comprising:
a first extension line connected to the second end of the driving electrode; and
a second extension line connected to the second end of the sensing electrode,
wherein the first switching transistor is connected between the first extension line and the common voltage line; and
the second switching transistor is connected between the second extension line and the common voltage line.

11. A display device, comprising:
a display unit having a plurality of pixels;
a plurality of touch electrodes disposed on the display unit;
a touch line connected to a first end of each of the plurality of touch electrodes;
a common voltage line spaced apart from the plurality of touch electrodes; and
a plurality of switching elements connected between the common voltage line and a second end of each of the plurality of touch electrodes,
wherein the plurality of touch electrodes comprise a driving electrode extending in a first direction, and a sensing electrode extending in a second direction crossing the first direction,
wherein the touch line comprises a driving line connected to a first end of the driving electrode, and a sensing line connected to a first end of the sensing electrode,
wherein the display device further comprises:
a first extension line connected to the second end of the driving electrode; and
a second extension line connected to the second end of the sensing electrode,
wherein the plurality of switching elements include:
a first demultiplexer for connecting the first extension line to the common voltage line or the driving line; and
a second demultiplexer for connecting the second extension line to the common voltage line or the sensing line.

12. A sensing system, comprising:
a display device for displaying an image; and
wherein the display device comprises:
a display unit having a plurality of pixels;
a plurality of touch electrodes disposed on the display unit;
a touch line connected to a first end of each of the plurality of touch electrodes;
a common voltage line disposed away from the plurality of touch electrodes;
a plurality of switching elements connected between the common voltage line and a second end of each of the plurality of touch electrodes; and
a touch driver configured to sense an input of a user's body by driving the plurality of touch electrodes during a first period, and to sense an input of an input member by driving the plurality of touch electrodes during a second period different from the first period,
wherein the touch driver supplies a first driving signal having a first phase to at least one touch electrode disposed on a first side of a point among the plurality of touch electrodes, and supplies a second driving signal having a second phase opposite to the first phase to at least one touch electrode disposed on a second side of the point among the plurality of touch electrodes, and
the touch driver receives a first sensing signal having the first phase from at least one touch electrode disposed on the first side of the point, and receives a second sensing signal having the second phase from at least one touch electrode disposed on the second side of the point.

13. The sensing system of claim 12, wherein the input member is charged by an electromagnetic resonance method when the first and second driving signals are disposed on the point during a second-first period in which the first and second driving signals are supplied to the plurality of touch electrodes, the input member is discharged when a supply of the first and second driving signals is stopped during a second-second period immediately after the second-first period, and the touch driver receives a first sensing signal having the first phase from at least one touch electrode disposed on the first side of the point during the second-second period, and receives a second sensing signal having the second phase from at least one touch electrode disposed on the second side of the point.

* * * * *